US009818801B1

(12) United States Patent
Rabkin et al.

(10) Patent No.: US 9,818,801 B1
(45) Date of Patent: Nov. 14, 2017

(54) RESISTIVE THREE-DIMENSIONAL MEMORY DEVICE WITH HETEROSTRUCTURE SEMICONDUCTOR LOCAL BIT LINE AND METHOD OF MAKING THEREOF

(71) Applicant: SANDISK TECHNOLOGIES LLC, Plano, TX (US)

(72) Inventors: Peter Rabkin, Cupertino, CA (US); Perumal Ratnam, Fremont, CA (US); Christopher J. Petti, Mountain View, CA (US); Masaaki Higashitani, Cupertino, CA (US)

(73) Assignee: SANDISK TECHNOLOGIES LLC, Plano, TX (US)

( * ) Notice: Subject to any disclaimer, the term of this patent is extended or adjusted under 35 U.S.C. 154(b) by 0 days.

(21) Appl. No.: 15/293,971

(22) Filed: Oct. 14, 2016

(51) Int. Cl.
*H01L 27/115* (2017.01)
*H01L 45/00* (2006.01)
*H01L 29/778* (2006.01)
*H01L 27/24* (2006.01)
*H01L 23/528* (2006.01)
(Continued)

(52) U.S. Cl.
CPC ........ *H01L 27/2481* (2013.01); *H01L 23/528* (2013.01); *H01L 27/11582* (2013.01); *H01L 27/2409* (2013.01); *H01L 29/122* (2013.01); *H01L 29/205* (2013.01); *H01L 29/66462* (2013.01); *H01L 29/778* (2013.01); *H01L 29/7833* (2013.01); *H01L 45/04* (2013.01); *H01L 45/08* (2013.01); *H01L 45/1233* (2013.01); *H01L 45/146* (2013.01); *H01L 45/1608* (2013.01)

(58) Field of Classification Search
None
See application file for complete search history.

(56) References Cited

U.S. PATENT DOCUMENTS 4,711,858 A   12/1987  Harder et al.
5,141,893 A    8/1992  Ito et al.
(Continued)

FOREIGN PATENT DOCUMENTS

JP   2010-509177        3/2010
KR   20140039721        4/2014
WO   WO2007/004843 A1   1/2007

OTHER PUBLICATIONS

Notice of Allowance for U.S. Appl. No. 14/733,244, dated Apr. 27, 2016, 10 pages.
(Continued)

*Primary Examiner* — Johannes P Mondt
(74) *Attorney, Agent, or Firm* — The Marbury Law Group PLLC

(57) ABSTRACT

A three-dimensional resistive memory device includes an alternating stack of electrically conductive layers and insulating layers. Resistive memory elements are provided between the electrically conductive layers and a semiconductor local bit line. The semiconductor local bit line includes a heterostructure of an inner semiconductor material layer having an inner-material band gap and an outer semiconductor material layer having an outer-material band gap that is narrower than the inner-material band. A gate dielectric is located between a gate electrode and the inner semiconductor material layer.

13 Claims, 58 Drawing Sheets

(51) Int. Cl.
*H01L 29/205* (2006.01)
*H01L 29/12* (2006.01)
*H01L 29/66* (2006.01)
*H01L 27/11582* (2017.01)
*H01L 29/78* (2006.01)

(56) References Cited

U.S. PATENT DOCUMENTS

| | | | |
|---|---|---|---|
| 5,212,113 | A | 5/1993 | Azoulay et al. |
| 5,244,834 | A | 9/1993 | Suzuki et al. |
| 5,346,848 | A | 9/1994 | Grupen-Shemansky et al. |
| 5,402,748 | A | 4/1995 | Takai et al. |
| 5,456,206 | A | 10/1995 | Lee et al. |
| 5,915,167 | A | 6/1999 | Leedy |
| 5,993,542 | A | 11/1999 | Yanashima et al. |
| 6,498,048 | B2 | 12/2002 | Morita |
| 6,508,879 | B1 | 1/2003 | Hashimoto |
| 6,727,523 | B2 | 4/2004 | Morita |
| 7,078,318 | B2 | 7/2006 | Jurgensen et al. |
| 7,928,427 | B1 | 4/2011 | Chang |
| 7,955,437 | B2 | 6/2011 | Shibata et al. |
| 8,603,898 | B2 | 12/2013 | Bao et al. |
| 9,425,299 | B1 | 8/2016 | Rabkin et al. |
| 9,437,658 | B2 | 9/2016 | Sakotsubo |
| 2008/0113496 | A1 | 5/2008 | Keller et al. |
| 2008/0179659 | A1* | 7/2008 | Enda ............... H01L 27/115 257/326 |
| 2011/0233646 | A1 | 9/2011 | Mizushima et al. |
| 2012/0049267 | A1 | 3/2012 | Jung |
| 2013/0100722 | A1 | 4/2013 | Shin |
| 2014/0246717 | A1* | 9/2014 | Aiso ............... H01L 29/42328 257/324 |
| 2016/0126292 | A1 | 5/2016 | Yanagida et al. |
| 2016/0126455 | A1 | 5/2016 | Hayashi et al. |
| 2016/0240665 | A1 | 8/2016 | Chen et al. |

OTHER PUBLICATIONS

The International Searching Authority, Invitation to Pay Additional Fees for International Application No. PCT/US2016/036083, dated Sep. 20, 2016, 6 pages.

Alamo, J. A., "Nanometre-Scale Electrics with III-V Compound Semiconductors," Nature, vol. 479, 7 pages, (2011).

Kim, S. H. et al., "High Performance Extremely Thin Body InGaAs-on-Insulator Metal-Oxide-Semiconductor Field-Effect Transistors on Si Substrates with Ni—InGaAs Metal Source/Drain," The Japan Society of Applied Physics, No. 4, 4 pages, (2011).

Kim, S. H. et al., "Self-Aligned Metal Source/Drain In$_x$Ga$_{1-x}$As n-Metal-Oxide-Semiconductor Field-Effect Transistors Using Ni—InGaAs Alloy," The Japan Society of Applied Physics, No. 4, 4 pages, (2011).

Li, G. et al., "Si and C d-doping for device applications," Journal of Crystal Growth, No. 195, pp. 54-57, (1998).

Takagi, S. et al., "MOS Interface Control Technologies for III-V/Ge Channel MOSFETs," ECS Transactions, vol. 41, No. 3, pp. 3-20, (2011).

Liu, Y. et al., "Low thermal budget Hf/Al/Ta ohmic contacts for InAlN/GaN-on-Si HEMTs with enhanced breakdown voltage," Journal of Vacuum Science & Technology, Vo. B 32, No. 3, 8 pages, .2014).

U.S. Appl. No. 14/851,296, filed Sep. 11, 2015, SanDisk 3D LLC.
U.S. Appl. No. 14/924,144, filed Oct. 27, 2015, SanDisk 3D LLC.
U.S. Appl. No. 15/157,945, filed May 18, 2016, SanDisk Technologies LLC.
U.S. Appl. No. 15/207,042, filed Jul. 11, 2016, SanDisk Technologies LLC.
U.S. Appl. No. 15/228,216, filed Aug. 4, 2016, SanDisk Technologies LLC.
U.S. Appl. No. 15/299,919, filed Oct. 21, 2016, SanDisk Technologies LLC.
U.S. Appl. No. 14/733,335, filed Jun. 8, 2015, SanDisk 3D LLC.

* cited by examiner

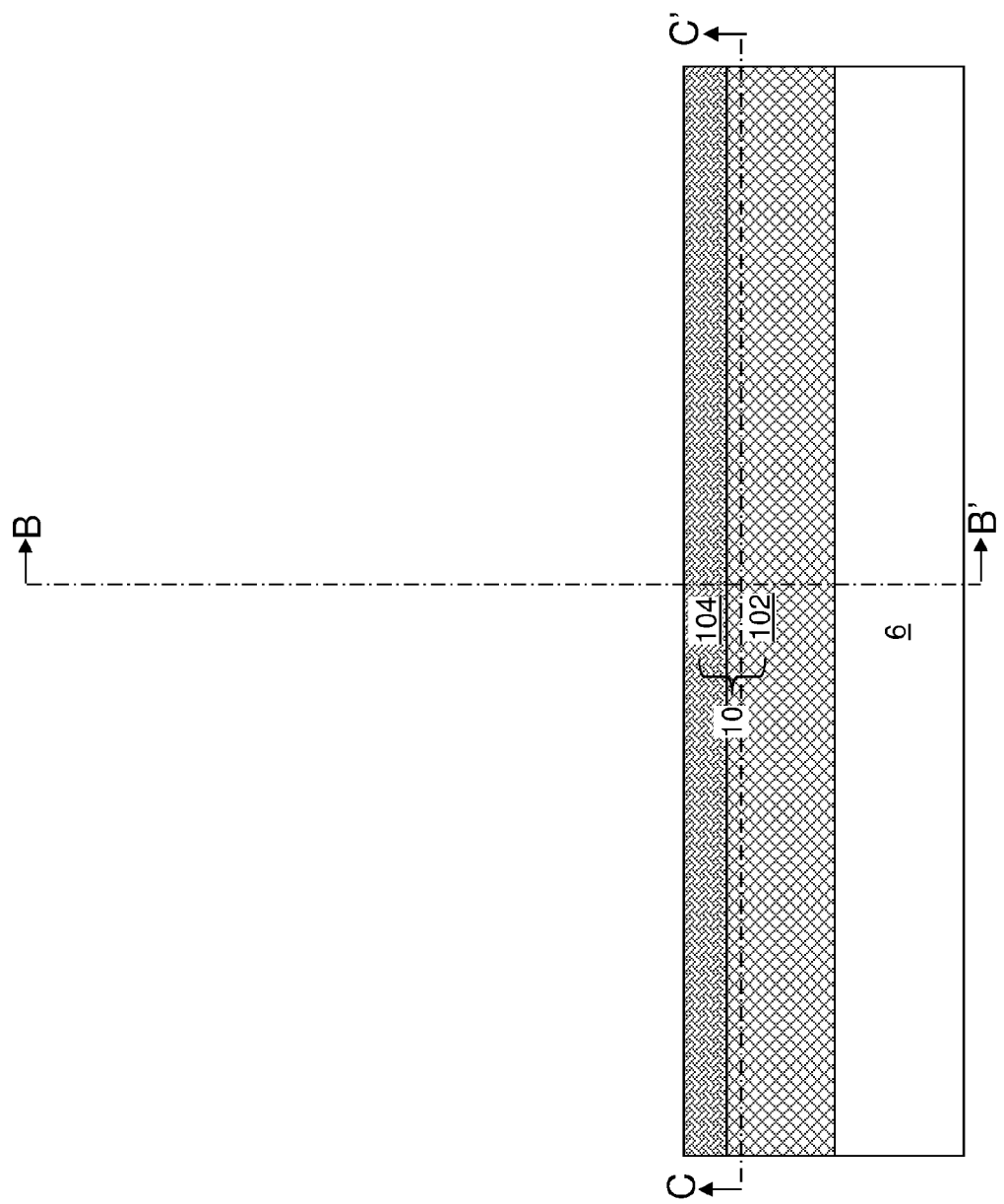

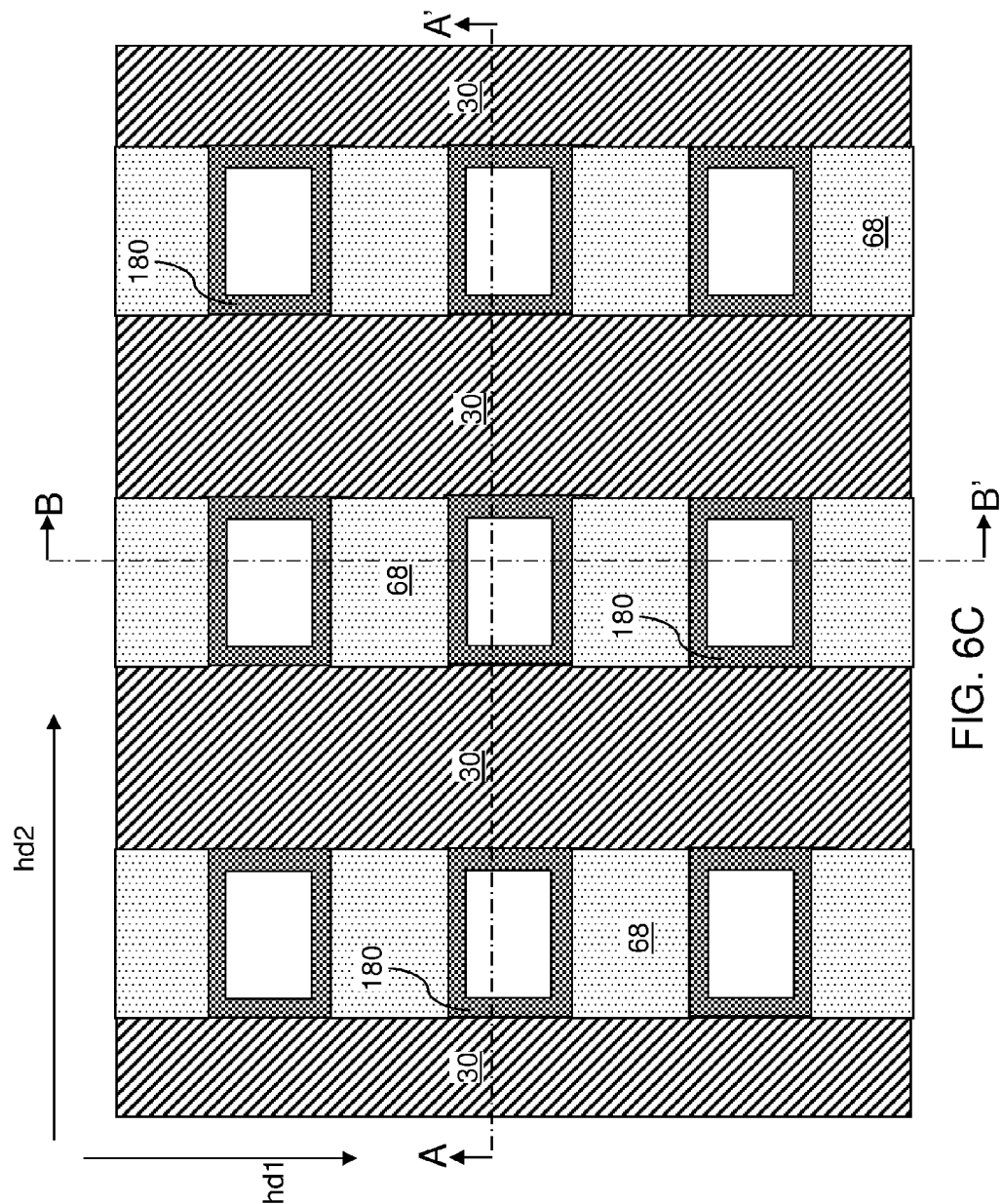

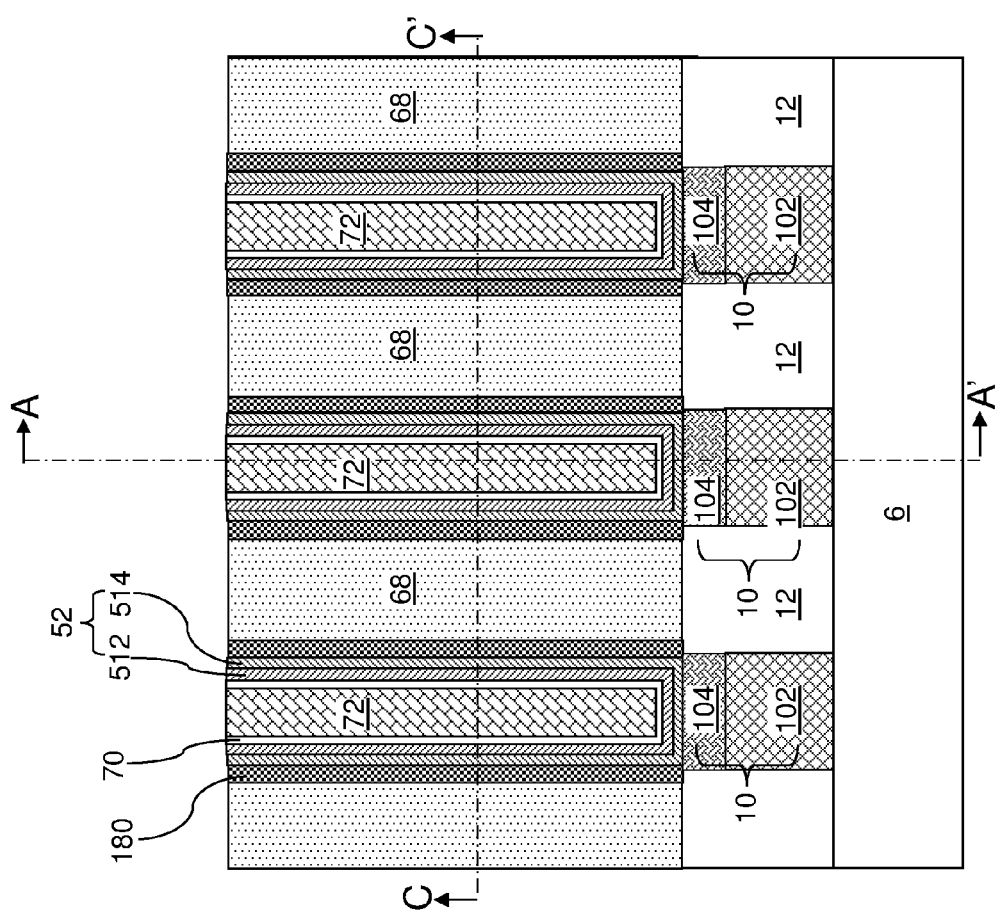

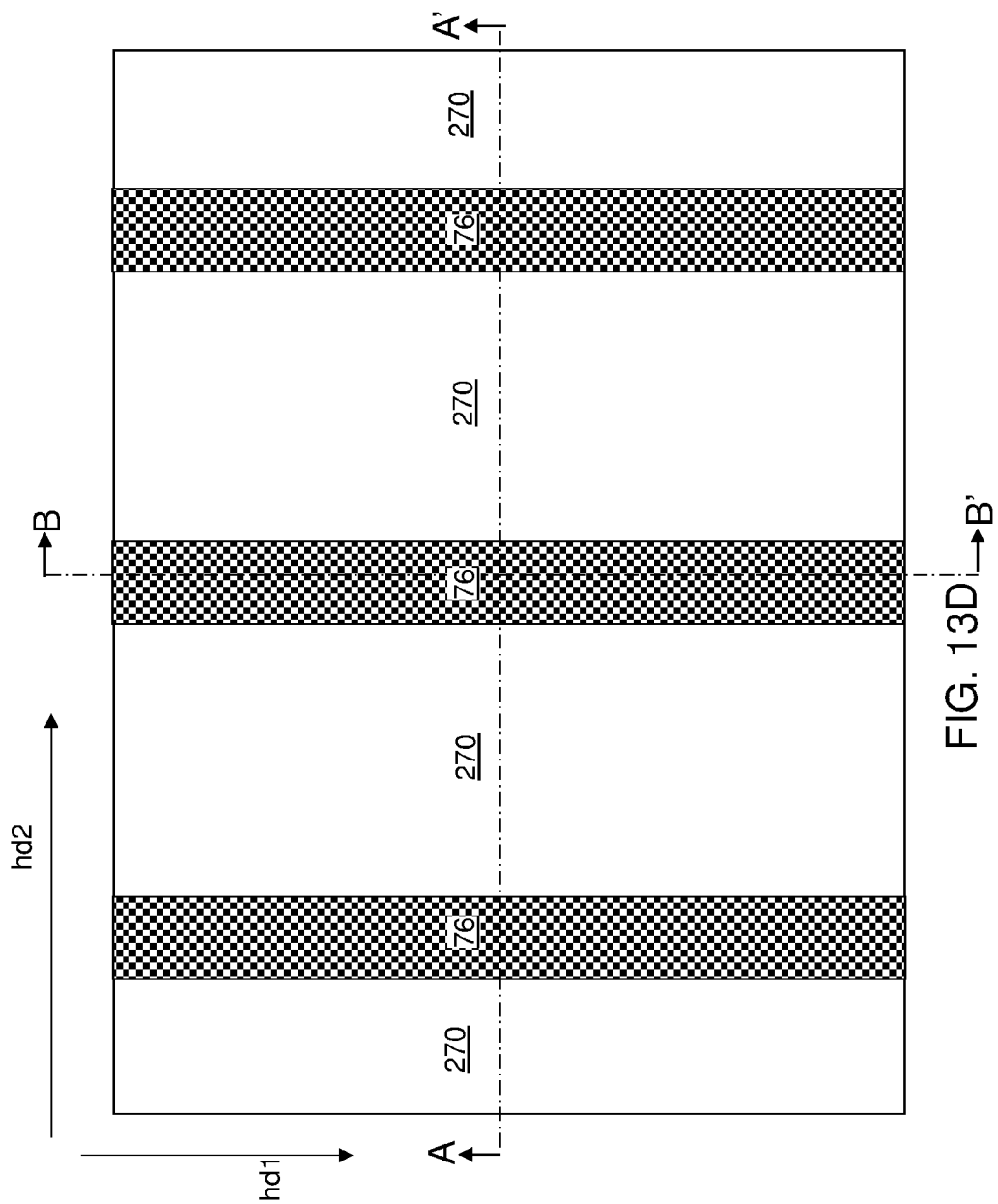

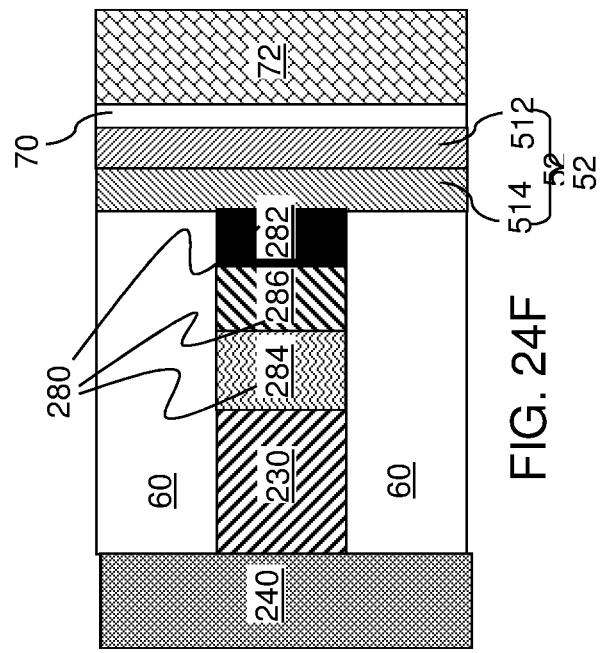
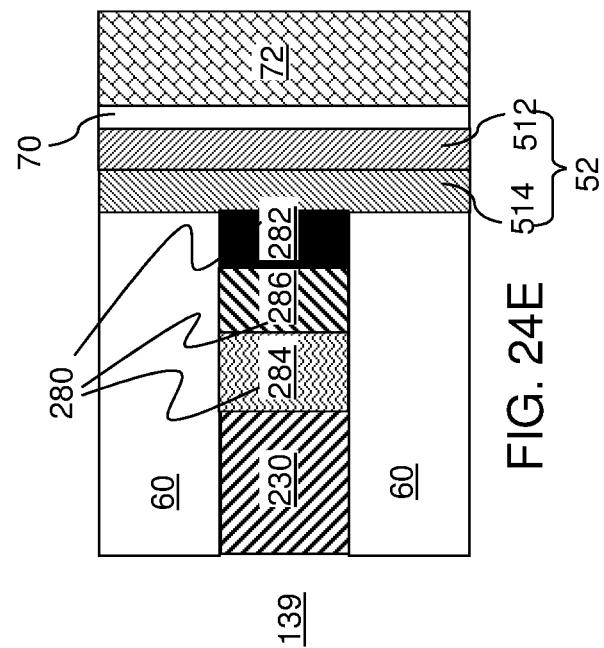
FIG. 24F
FIG. 24E

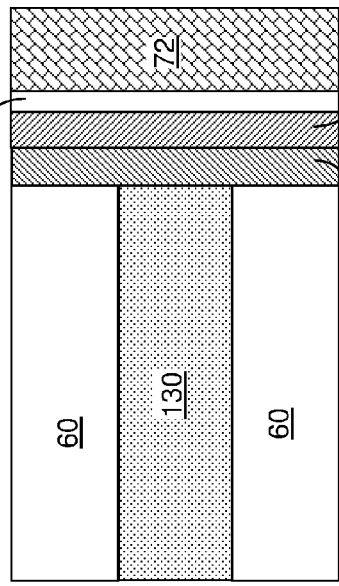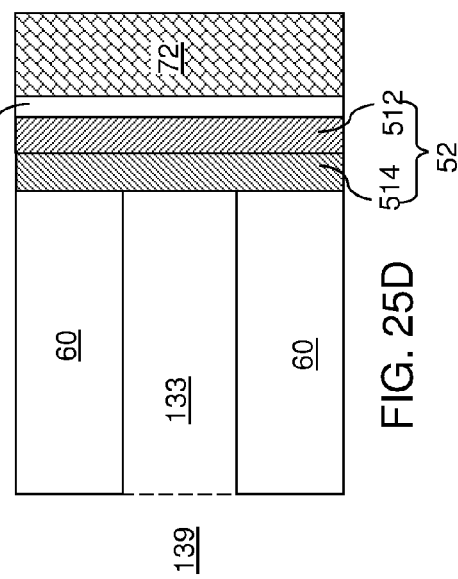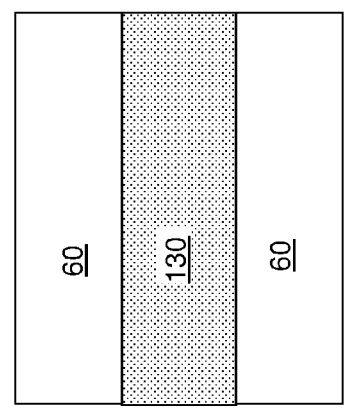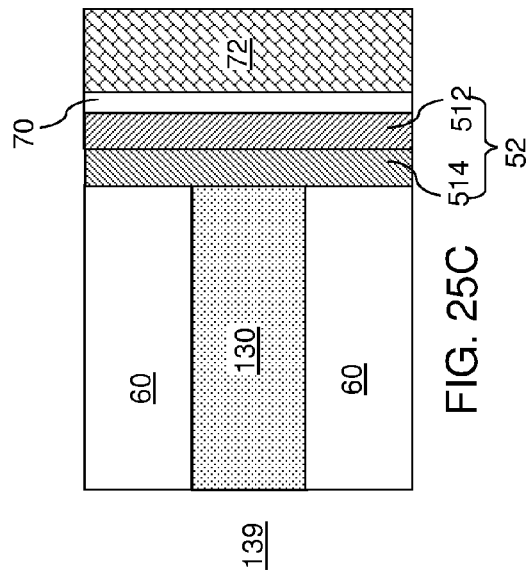

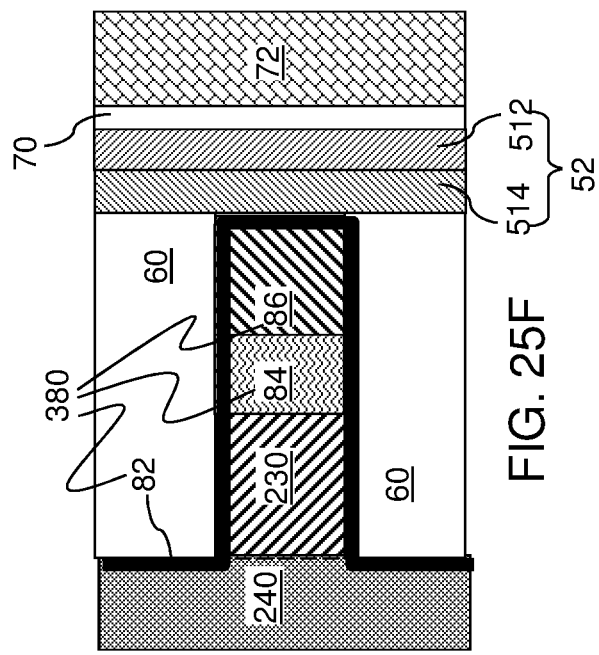
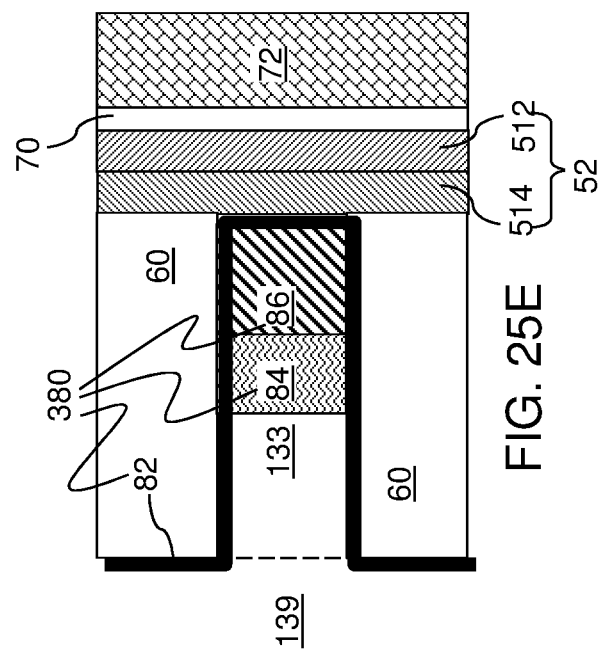

RESISTIVE THREE-DIMENSIONAL MEMORY DEVICE WITH HETEROSTRUCTURE SEMICONDUCTOR LOCAL BIT LINE AND METHOD OF MAKING THEREOF

FIELD

The present disclosure relates generally to the field of semiconductor devices and specifically to three-dimensional memory devices including two-dimensional electron gas within local bit lines, and methods of making the same.

BACKGROUND

A resistance random access memory, or a "ReRAM," is a non-volatile memory device employing reversible change in resistance in a thin film with application of electrical voltage bias across the film. In some ReRAM devices, application of the electrical voltage bias in one manner can cause decrease in the resistance of the thin film, for example, by formation of filaments that function as leakage current paths or by increasing a crystallinity of the thin film. Application of a different type of electrical voltage bias can cause reversal of the resistance of the thin film to an original high-resistance state, such as by removal of the filaments from the thin film or by decreasing the crystallinity of the thin film. In some other ReRAM devices, reversible change of resistance is achieved by a non-filamentary mechanism, i.e., via changes in resistance of the bulk material, when a certain electrical bias is applied to device electrodes. The bulk switching or area switching mechanism may allow better area scaling. An example of bulk or area switching cell is barrier modulated cell (BMC) in which vacancy concentration is modulated in a metal oxide material providing an increased resistivity upon reduction of oxygen vacancy in the material.

Thus, data can be stored in a ReRAM cell by changing the resistance of the thin film, which can be a solid-state material. The thin film is referred to as a memory film or a read/write film. Examples of ReRAM devices are described in World Intellectual Property Organization (WIPO) Publication No. WO2007004843 A1 to Hong et al. and U.S. Patent Application Publication No. 2013/0043455 A1 to Bateman.

SUMMARY

According to an aspect of the present disclosure, a three-dimensional memory device is provided, which comprises: an alternating stack of electrically conductive layers and insulating layers, wherein each layer in the alternating stack laterally extends along a first horizontal direction; semiconductor local bit lines vertically extending through the alternating stack, contacting sidewalls of the insulating layers within the alternating stack, laterally surrounding a respective set of a gate dielectric and a gate electrode; and resistive memory elements located between the electrically conductive layers and the semiconductor local bit lines. Each of the semiconductor local bit lines comprises: an inner semiconductor material layer having an inner-material band gap and laterally surrounding a respective gate dielectric; and an outer semiconductor material layer having an outer-material band gap that is narrower than the inner-material band gap.

According to another aspect of the present disclosure, a method of forming a three-dimensional memory device is provided. An alternating stack of insulating layers and spacer material layers is formed over a substrate, wherein each layer in the alternating stack laterally extends along a first horizontal direction. The alternating stack is patterned such that bit line cavities are formed adjacent to remaining portions of the alternating stack. Resistive memory elements are formed at a periphery of each of the bit line cavities at each level of the spacer material layers. Semiconductor local bit lines are formed in the bit line cavities. Gate dielectrics are formed on the semiconductor local bit lines, wherein each of the gate dielectrics is formed on an inner sidewall of a respective semiconductor local bit line. Gate electrodes are formed on the gate dielectrics, wherein each of the gate electrodes is formed on an inner sidewall of a respective gate dielectric. Each of the semiconductor local bit lines comprises an inner semiconductor material layer having an inner-material band gap and laterally surrounding a respective gate dielectric, and an outer semiconductor material layer having an outer-material band gap that is narrower than the inner-material band gap.

BRIEF DESCRIPTION OF THE DRAWINGS

In the figures including one or more planes of cross-sectional views, the letters represent the plane of the cross-sectional view for the figure having the same prefix numeral as the respective figure and having the same suffix letter as the letter represented by the respective plane. For example, the plane A-A' in FIG. 1B represents the plane of the cross-sectional view for FIG. 1A, the plane C-C' in FIG. 1A represents the plane of the cross-sectional view for FIG. 1C, etc.

FIG. 1A is a first vertical cross-sectional view of a first exemplary structure for forming a three-dimensional memory device after forming global bit lines according to a first embodiment of the present disclosure.

FIG. 6C is a horizontal cross-sectional view of the first exemplary structure of FIGS. 6A and 6B along the horizontal plane C-C'.

FIG. 9B is a second vertical cross-sectional view of the first exemplary structure of FIG. 9A along the vertical plane B-B'.

FIG. 13D is a horizontal cross-sectional view of the first exemplary structure of FIGS. 13A and 13B along the horizontal plane D-D'.

FIGS. 24A-24F are sequential vertical cross-sectional views of a lateral recess during formation of a third alternate embodiment of the memory-material-containing structure according to the second embodiment of the present disclosure.

FIGS. 25A-25F are sequential vertical cross-sectional views of a lateral recess during formation of a fourth alternate embodiment of the memory-material-containing structure according to the second embodiment of the present disclosure.

DETAILED DESCRIPTION

Figure 1B:
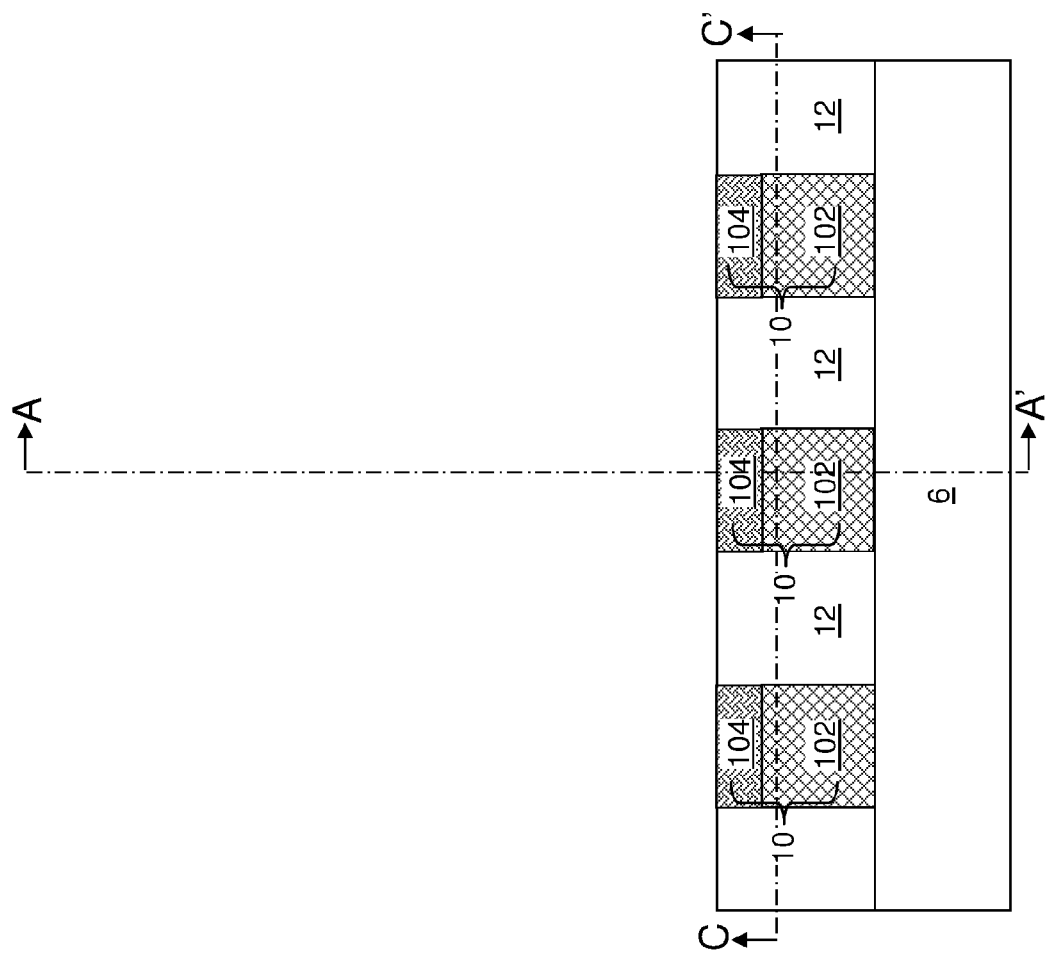
FIG. 1B is a second vertical cross-sectional view of the first exemplary structure of FIG. 1A along the vertical plane B-B'.

As discussed above, the present disclosure is directed to a memory device, such as a non-volatile memory device employing a resistive storage element, and methods of making the same, the various aspects of which are described below. The embodiments of the disclosure can be employed to form various semiconductor devices including at least one resistive memory element. The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. Elements with the same reference numeral refer to a same element or a similar element, and are presumed to have the same composition unless explicitly noted otherwise.

As used herein, a first element located "on" a second element can be located on the exterior side of a surface of the second element or on the interior side of the second element. As used herein, a first element is located "directly on" a second element if there exist a physical contact between a surface of the first element and a surface of the second element.

As used herein, a "layer" refers to a material portion including a region having a thickness. A layer may extend over the entirety of an underlying or overlying structure, or may have an extent less than the extent of an underlying or overlying structure. For example, a layer may be located between any pair of horizontal planes between, or at, a top surface and a bottom surface of the contiguous structure. A layer may extend horizontally, vertically, and/or along a tapered surface. A substrate may be a layer, may include one or more layers therein, and/or may have one or more layer thereupon, thereabove, and/or therebelow.

As used herein, a "layer stack" refers to a stack of layers. As used herein, a "line" or a "line structure" refers to a layer that has a predominant direction of extension, i.e., having a direction along which the layer extends the most.

As used herein, a "field effect transistor" refers to any semiconductor device having a semiconductor channel through which electrical current flows with a current density modulated by an external electrical field. As used herein, an "active region" refers to a source region of a field effect transistor or a drain region of a field effect transistor.

As used herein, a "semiconducting material" refers to a material having electrical conductivity in the range from $1.0 \times 10^{-6}$ S/cm to $1.0 \times 10^{5}$ S/cm. As used herein, a "semiconductor material" refers to a material having electrical conductivity in the range from $1.0 \times 10^{-6}$ S/cm to $1.0 \times 10^{5}$ S/cm in the absence of electrical dopants therein, and is capable of producing a doped material having electrical conductivity in a range from $1.0$ S/cm to $1.0 \times 10^{5}$ S/cm upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^{5}$ S/cm. As used herein, an "insulator material" or a "dielectric material" refers to a material having electrical conductivity less than $1.0 \times 10^{-6}$ S/cm. As used herein, a "heavily doped semiconductor material" refers to a semiconductor material that is doped with electrical dopant at a sufficiently high atomic concentration to become a conductive material, i.e., to have electrical conductivity greater than $1.0 \times 10^{5}$ S/cm. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0 \times 10^{-6}$ S/cm to $1.0 \times 10^{5}$ S/cm. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material can be semiconducting or conductive depending on the atomic concentration of electrical dopants therein. As used herein, a "metallic material" refers to a conductive material including at least one metallic element therein. All measurements for electrical conductivities are made at the standard condition.

As used herein, a "resistive memory material", a "resistivity-switching material" or a "reversibly resistance-switching material" is a material of which the resistivity can be altered by application of a voltage across the material. As used herein, a "resistive memory material layer" refers to a layer including a resistive memory material. As used herein, a "resistive memory element" refers to an element that includes a portion of a resistive memory material in a configuration that enables programming of the resistive memory material into at least two states having different values of electrical resistance.

A monolithic three dimensional memory array is one in which multiple memory levels are formed above a single substrate, such as a semiconductor wafer, with no intervening substrates. The term "monolithic" means that layers of each level of the array are directly deposited on the layers of each underlying level of the array. In contrast, two-dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three Dimensional Structure Memory." The substrates may be thinned or removed from the memory levels before bonding, but as the memory levels are initially formed over separate substrates, such memories are not true monolithic three dimensional memory arrays.

The present disclosure provides a ReRAM device having an increased cell current, thereby increasing the operational window of the ReRAM device and enhancing performance of the ReRAM device. In the present disclosure, a heterostructure III-V compound semiconductor channel is employed in lieu of a polysilicon channel. Further, the cell current is enhanced by III-V hetero-structure engineering that enhances electron mobility and velocity even further. Specifically, the III-V hetero-structure channel cells of the present disclosure can employ two-dimensional confinement electron gas quantum well conductance that further enhances electron mobility and velocity, and thus, chip performance. This mechanism is called two-dimensional electron gas quantum well conductance in a planar high-electron-mobility transistor (HEMT).

In long semiconductor channels, such as channels located in local bit lines of three-dimensional ReRAM memory devices, both mobility and velocity play a role. High electron mobility and lower effective mass in III-V material systems such as GaAs, InP, (In,Ga)(As,P) can provide advantages to the III-V compound semiconductor channels located in local bit lines of ReRAM devices of the present disclosure. In one embodiment, GaAs and InAs—InGaAs can be employed as the III-V compound material. Actual mobility of the compound semiconductor channel depends on material composition, process, stress, etc. The enhanced electron mobility in the III-V material in combination with additional mobility enhancement due to no-scattering quantum wells can provide much higher cell current, better read-write efficiency, and overall enhancement in device performance.

Figure 1C:
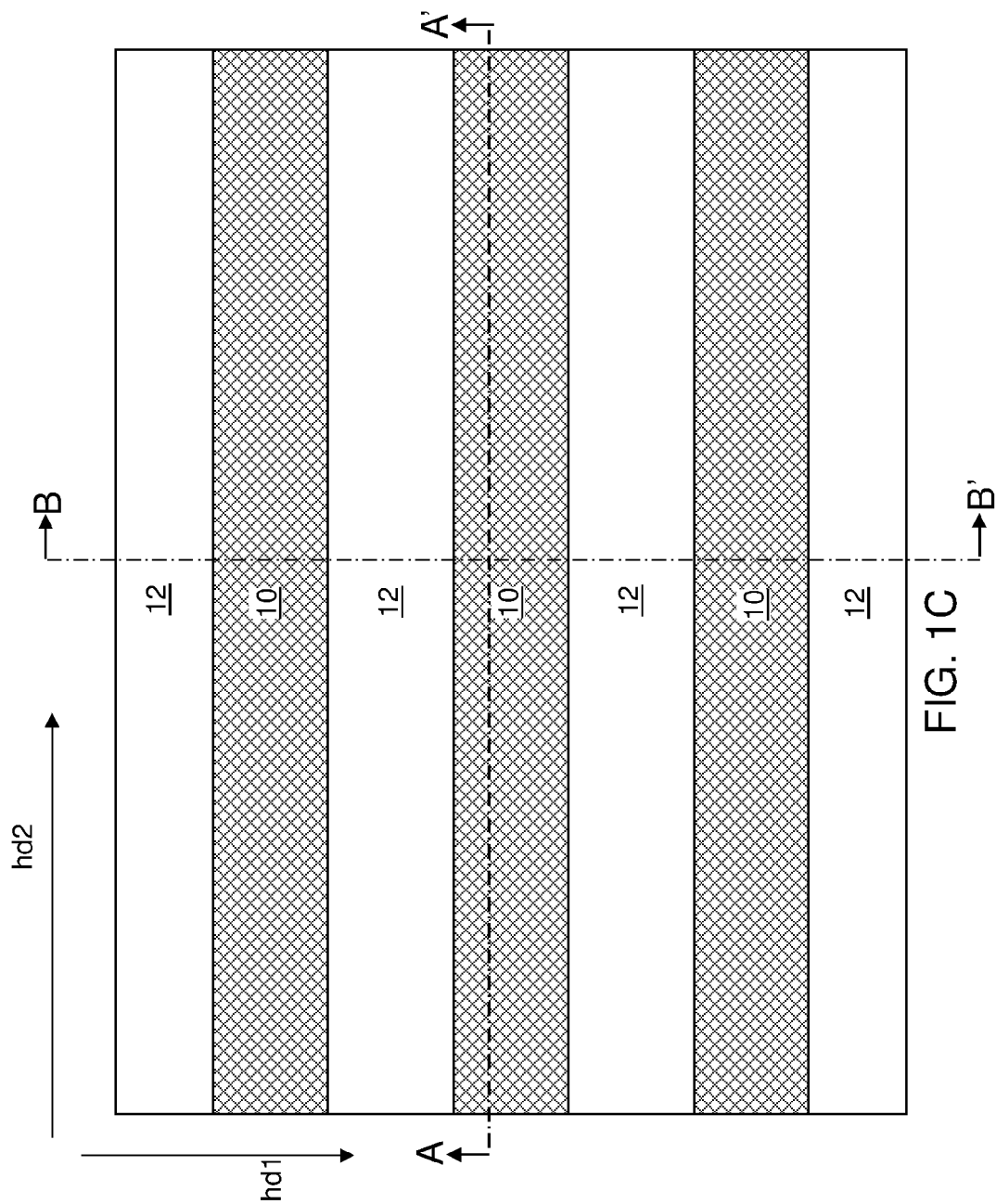
FIG. 1C is a horizontal cross-sectional view of the first exemplary structure of FIGS. 1A and 1B along the horizontal plane C-C'.

Referring to FIGS. 1A-1C, a first exemplary structure for forming a three-dimensional memory device is illustrated, which can be an in-process ReRAM device. As used herein, a "prototype" structure or an "in-process" structure refers to a transient structure that is subsequently modified in the shape or composition of at least one component therein.

The first exemplary structure includes a substrate 6, which includes an insulating layer at an upper portion thereof. In one embodiment, the substrate 6 can be a stack of at least two material layers such as a stack of an underlying substrate material layer and an overlying substrate insulating layer. The substrate material layer can be a semiconductor material layer, a conductive material layer, or an insulating material layer that can provide structural support to the overlying structures, and may have a thickness greater than 50 microns, and typically in a range between 300 microns and 3 mm. In one embodiment, the substrate material layer can be a semiconductor wafer, such as a silicon wafer as known in the art. The substrate insulating layer can include an insulating material, and can have a thickness in a range from 100 nm to 3 microns, although lesser and greater thicknesses can also be employed.

In case the substrate material layer includes a semiconductor material, peripheral semiconductor devices for operation of a memory array device can be formed in, or on, the substrate material layer. For example, sense circuitry (e.g., sense amplifier), input-output (I/O) circuitry, control circuitry, and any other necessary peripheral circuitry can be formed on, or in, the substrate material layer. Additional devices that can be formed in, or on, the substrate material layer include, but are not limited to, global bit line select transistors for selecting global bit lines to be activated, local bit line select transistors for selecting local bit lines to be activated, and word line select transistor for selecting word lines to be activated.

Global bit lines 10 are formed over the substrate 6. The global bit lines 10 are parallel electrically conductive lines that are laterally spaced apart in a first horizontal direction hd1, and extending in a second horizontal direction hd2. The global bit lines 10 can be formed, for example, by depositing at least one conductive material layer, and patterning the at least one conductive material layer employing a combination of lithographic methods and an anisotropic etch. The at least one conductive material layer includes a planar doped semiconductor material layer having a doping of a first conductivity type, and may additionally include one or more underlying metallic material layer. Each of the one or more underlying metallic material layer can include, for example, at least one elemental metal (such as W, Co, Cu, and Al), an intermetallic alloy including at least two elemental metals, a conductive metallic nitride, or a conductive metallic carbide. For example, the at least one conductive material layer can include an optional metallic barrier layer (such as a layer of TiN, TaN, or WN), an optional metal layer (such as a layer of W, Ti, Ta, Cu, Al, or an alloy thereof), and a planar doped semiconductor material layer. In this case, each global bit line 10 can include an optional metallic rail 102 and a doped semiconductor rail 104. If a metallic rail 102 is present within a global bit line 10, an overlying doped semiconductor rail 104 can contact a top surface of the metallic rail. In one embodiment, each global bit line 10 can have a uniform width throughout. In one embodiment, the global bit lines 10 can form a one-dimensional array that is repeated along the first horizontal direction hd1 with a periodicity.

The first conductivity type of the doped semiconductor rails 104 can be n-type or p-type. In one embodiment, the dopant concentration in the doped semiconductor rails 104 can be sufficiently high to render the doped semiconductor rails 104 conductive, in which case the doped semiconductor rails 104 are referred to be "heavily doped." In one embodiment, the doped semiconductor rails 104 can have a dopant concentration greater than $1.0 \times 10^{19}/cm^3$, and preferably greater than $5.0 \times 10^{19}/cm^3$, and even more preferably greater than $2.0 \times 10^{20}/cm^3$, although lesser dopant concentration may also be employed. The thickness of the doped semiconductor rails 104 can be in a range from 10 nm to 300 nm, although lesser and greater thicknesses can also be employed.

The space between the global bit lines 10 can be filled with a dielectric material (such as silicon oxide). The dielectric material can be subsequently planarized to remove excess portions from above a horizontal plane including the top surfaces of the global bit lines 10 to form separator dielectric material portions 12. Each global bit lines 10 and each separator dielectric material portions 12 can extend along the second horizontal direction hd2. A one-dimensional array of the global bit lines 10 and the separator dielectric material portions 12 can extend along the first horizontal direction hd1 with a periodicity that is equal to the sum of the width of a global bit line 10 and the width of a separator dielectric material portion 12. Alternatively, the one-dimensional array of the global bit lines 10 and the separator dielectric material portions 12 may be formed by depositing a dielectric material layer, forming trenches extending along the second horizontal direction hd2 and laterally spaced from one another along the first horizontal direction hd1, and filling the trenches with at least one conductive material to form the global bit lines 10 therein.

Figure 2A:
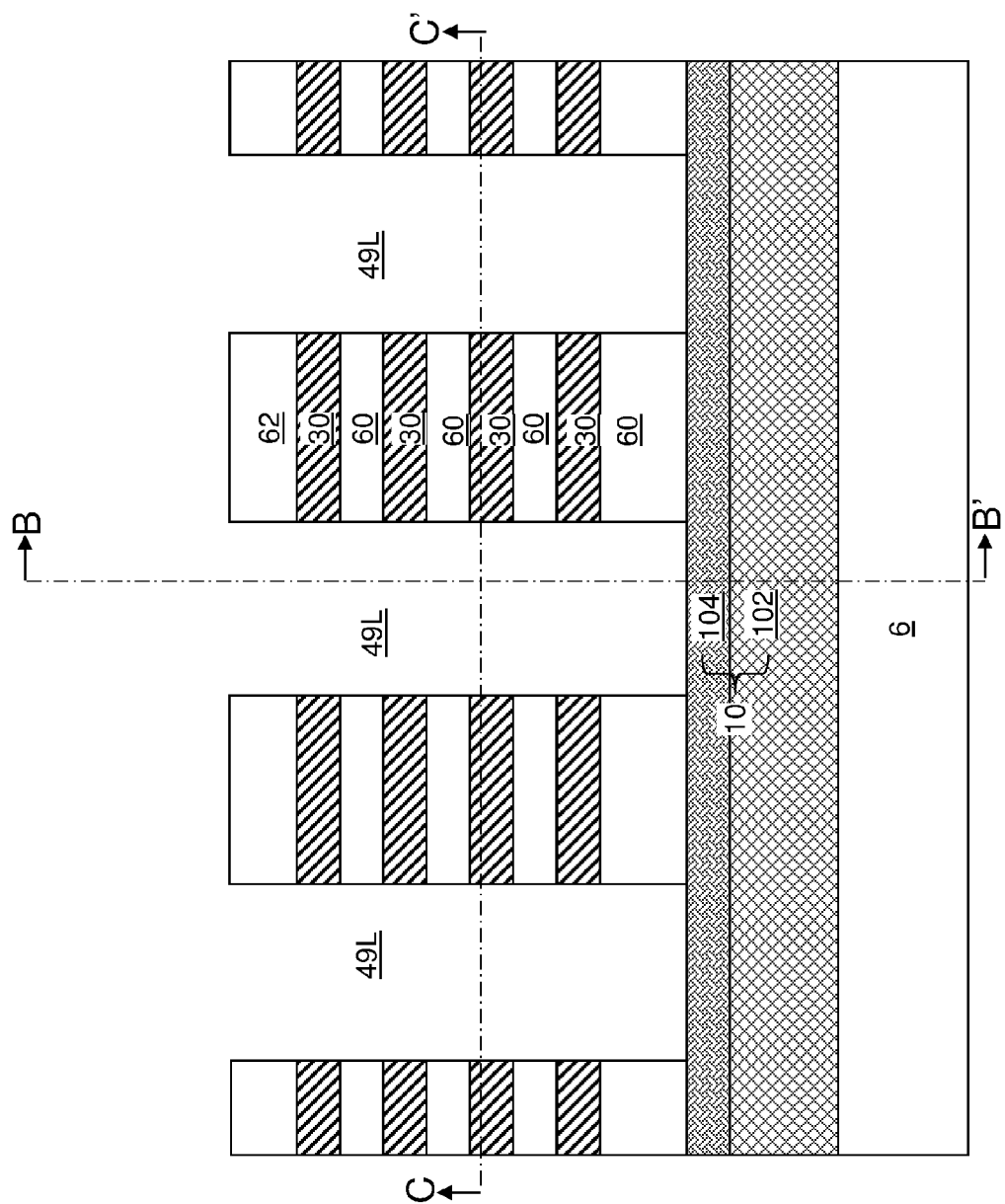
FIG. 2A is a first vertical cross-sectional view of the first exemplary structure after forming alternating stacks of insulating layers and spacer material layers and line trenches that divide the alternating stacks according to the first embodiment of the present disclosure.
Figure 2B:
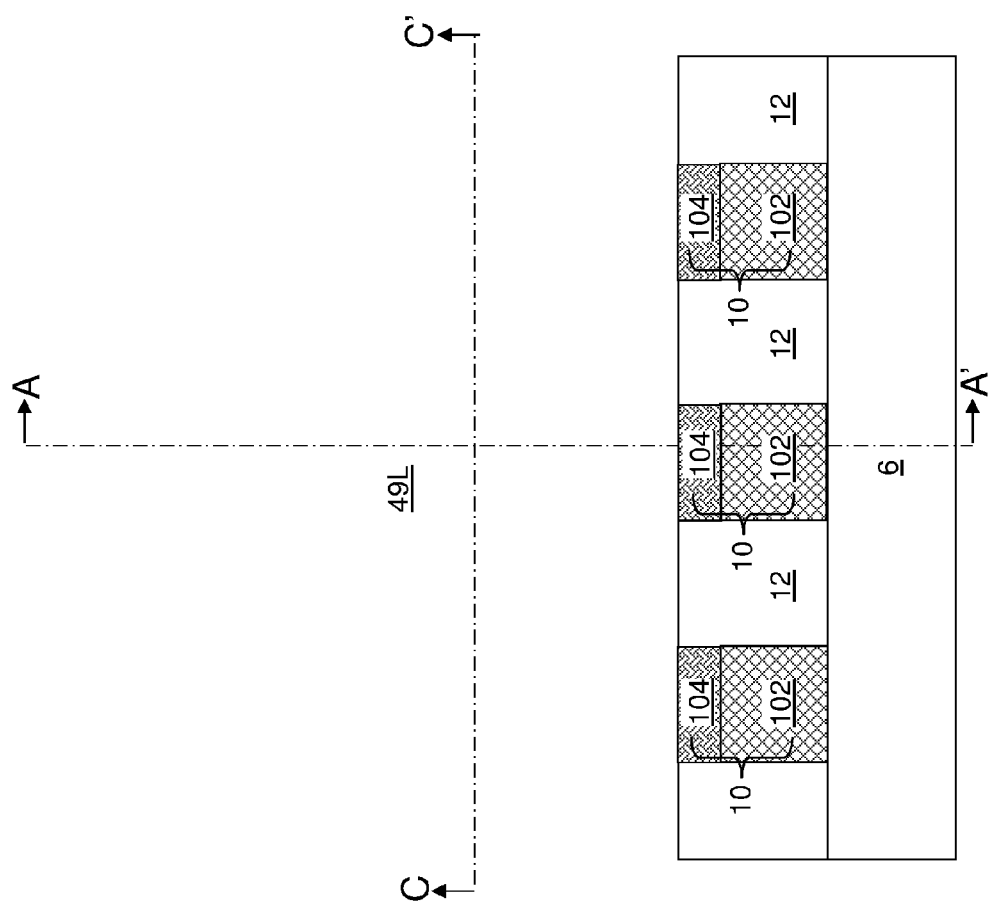
FIG. 2B is a second vertical cross-sectional view of the first exemplary structure of FIG. 2A along the vertical plane B-B'.
Figure 2C:
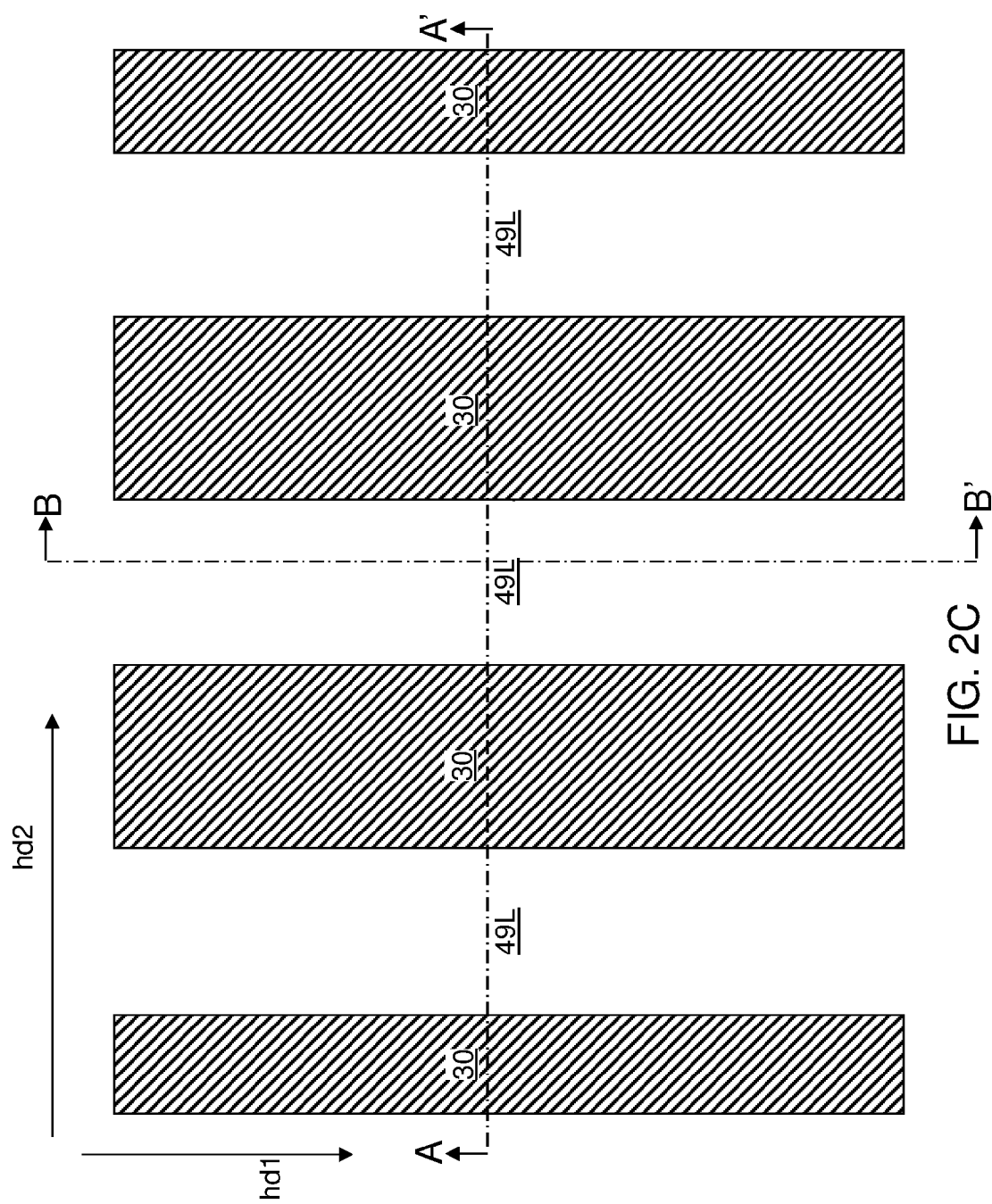
FIG. 2C is a horizontal cross-sectional view of the first exemplary structure of FIGS. 2A and 2B along the horizontal plane C-C'.

Referring to FIGS. 2A-2C, an alternating stack of spacer material layers 30 and insulating layers 60 can be formed over the global bit lines 10 and the separator dielectric material portions 12. The alternating stack may start with a bottommost insulating layer 60 and terminate with a topmost insulating layer, which is herein referred to as an insulating cap layer 62. Alternatively, the alternating stack may start with a bottommost insulating layer 60 and terminate with a topmost spacer material layer 30. In this case, an insulating cap layer 62 can have a different composition than the insulating layers 60.

The spacer material layers 30 are formed as, or are replaced with, electrically conductive layers. In one embodiment, the spacer material layers 30 can be a first electrically conductive material layers that remain in a final device structure and function as word lines of the three-dimensional memory device. In one embodiment, the first electrically conductive material can include an elemental metal, an intermetallic alloy, and/or a conductive metal nitride. For example, each of the spacer material layers 30 can include an optional metallic barrier layer including a conductive metallic nitride such as TiN, TaN, WN, or a combination thereof, and a metal layer including a metal such as W, Co, Ru, Mo, Cu, Al, or an intermetallic alloy thereof.

In another embodiment, the spacer material layers 30 can be sacrificial material layers that are subsequently replaced electrically conductive layers that function as word lines of the three-dimensional memory device. For example, the spacer material layers 30 can include silicon nitride, a porous organosilicate glass, germanium, a silicon-germanium alloy, amorphous carbon, or diamond-like carbon (DLC).

In one embodiment, the insulating layers 60 can include undoped silicate glass (e.g., silicon oxide) or doped silicate glass. All of the insulating layers 60 can include the same dielectric material such as a silicate glass. The insulating cap layer 62 can include the same material as the insulating layers 60, or can include a different material (such as silicon nitride or a dielectric metal oxide) from the material of the insulating layers 60.

As used herein, an alternating stack of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. The first elements may have the same thickness thereamongst, or may have different thicknesses. The second elements may have the same thickness thereamongst, or may have different thicknesses. The alternating plurality of the electrically conductive layers and the insulating layers may begin with an instance of the electrically conductive layers or with an instance of the insulating layers, and may terminate with an instance of the electrically conductive layers or with an instance of the insulating layers. In one embodiment, an instance of the first elements and an instance of the second elements may form a unit that is repeated with periodicity within the alternating plurality.

The thickness of the spacer material layers 30 can be in a range from 10 nm to 100 nm, although lesser and greater thicknesses can also be employed. The thickness of the insulating layers 60 can be in a range from 10 nm to 100 nm, although lesser and greater thicknesses can also be employed. The thickness of the insulating cap layer 62 can be in a range from 10 nm to 300 nm, although lesser and greater thicknesses can also be employed.

A pair of a spacer material layer 30 and an insulating layer 60 can constitute a unit of repetition in the alternating stack (30, 60) of the spacer material layers 30 and the insulating layers 60. The total number of repetitions can be in a range from 8 to 1,024, although lesser and greater number of repetitions can also be employed. Thus, a plurality of alternating stacks (30, 60) of insulating layers 60 and spacer material layers 30 is formed over a substrate 6. Each of the insulating layers 60 and the spacer material layers 30 extends along the first horizontal direction (e.g., the global bit line direction) hd1. The alternating stacks (30, 60) are laterally spaced from one another along the second horizontal direction hd2 (e.g., the word line direction).

Subsequently, the alternating stack of the spacer material layers 30 and the insulating layers 60 as originally formed (which is herein referred to as an "initial alternating stack") is patterned to multiple alternating stacks (30, 60). The multiple alternating stacks (30, 60) are laterally spaced part by line trenches 49L that extend along the first horizontal direction hd1 (e.g., word line direction). Each contiguous set of remaining portions of the spacer material layers 30 and the insulating layers 60 between a pair of line trenches 49L constitutes an alternating stack (30, 60) that is a rail structure, which is also referred to as an "alternating stack rail." Each alternating stack (30, 60) is laterally spaced apart from other alternating stacks (30, 60) along the second horizontal direction hd2 (e.g., global bit line direction). In one embodiment, each patterned spacer material layer 30, as an electrically conductive layer, can constitute a word line of a resistive random access memory device. Each alternating stack (30, 60), as patterned and laterally spaced from one another by the line trenches 49L, has the same composition and the same thickness as the initial alternating stack (30, 60) as formed at the processing steps of FIGS. 2A-2C.

Figure 3A:
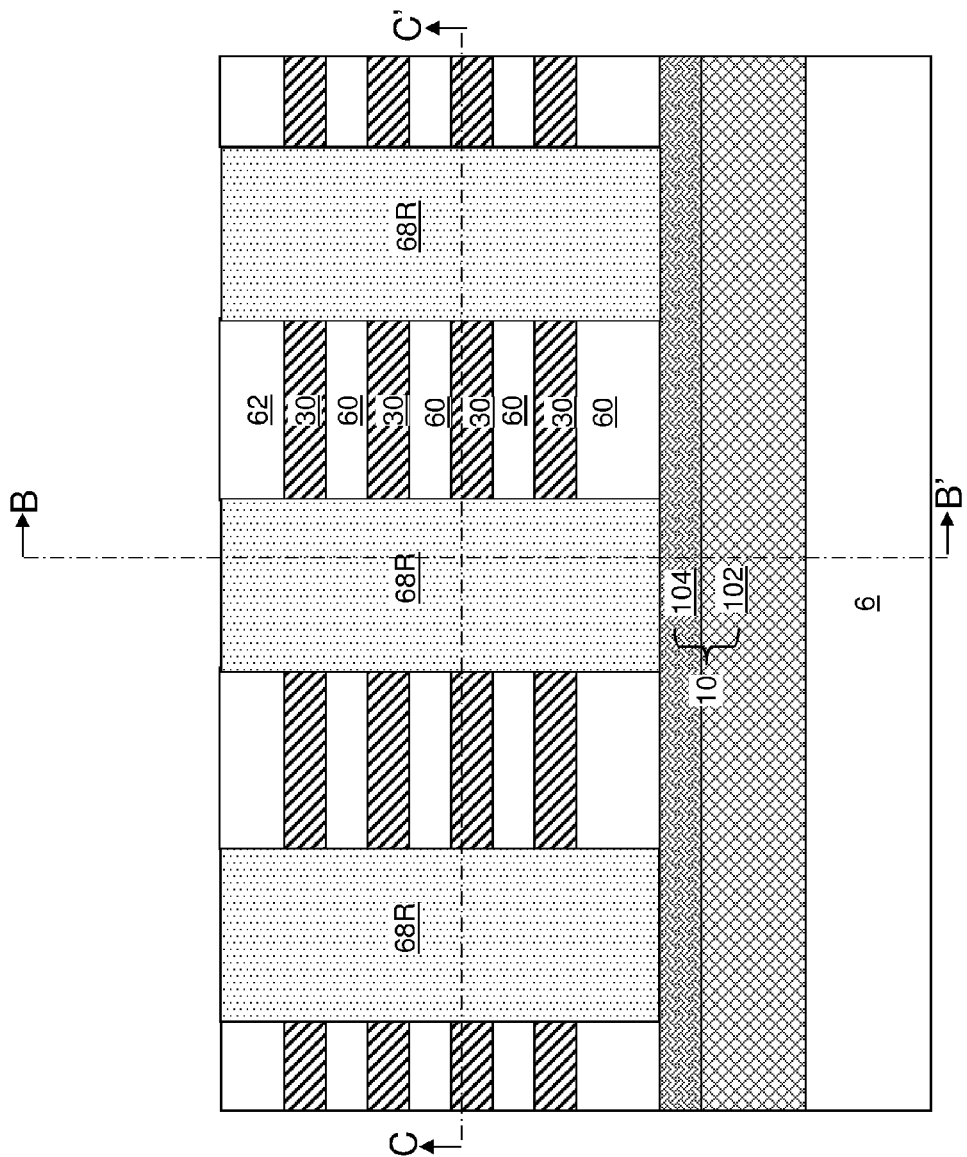
FIG. 3A is a first vertical cross-sectional view of the first exemplary structure after forming dielectric rail structures according to the first embodiment of the present disclosure.
Figure 3B:
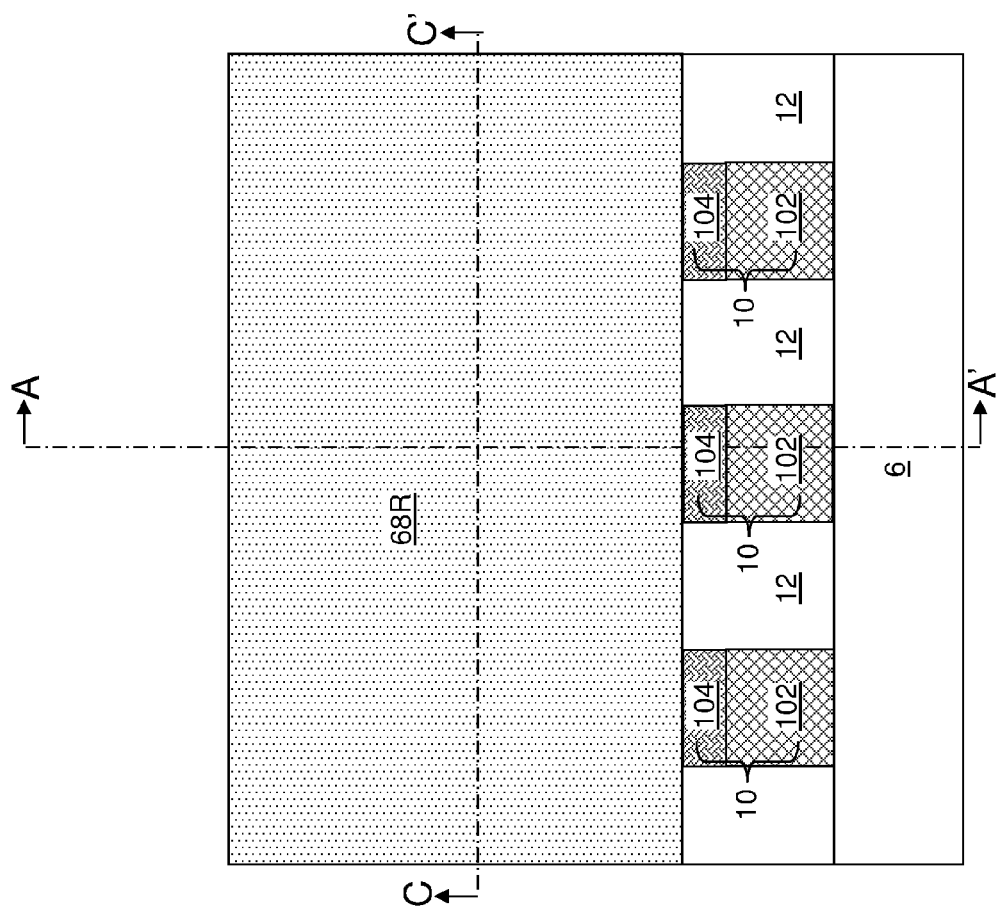
FIG. 3B is a second vertical cross-sectional view of the first exemplary structure of FIG. 3A along the vertical plane B-B'.
Figure 3C:
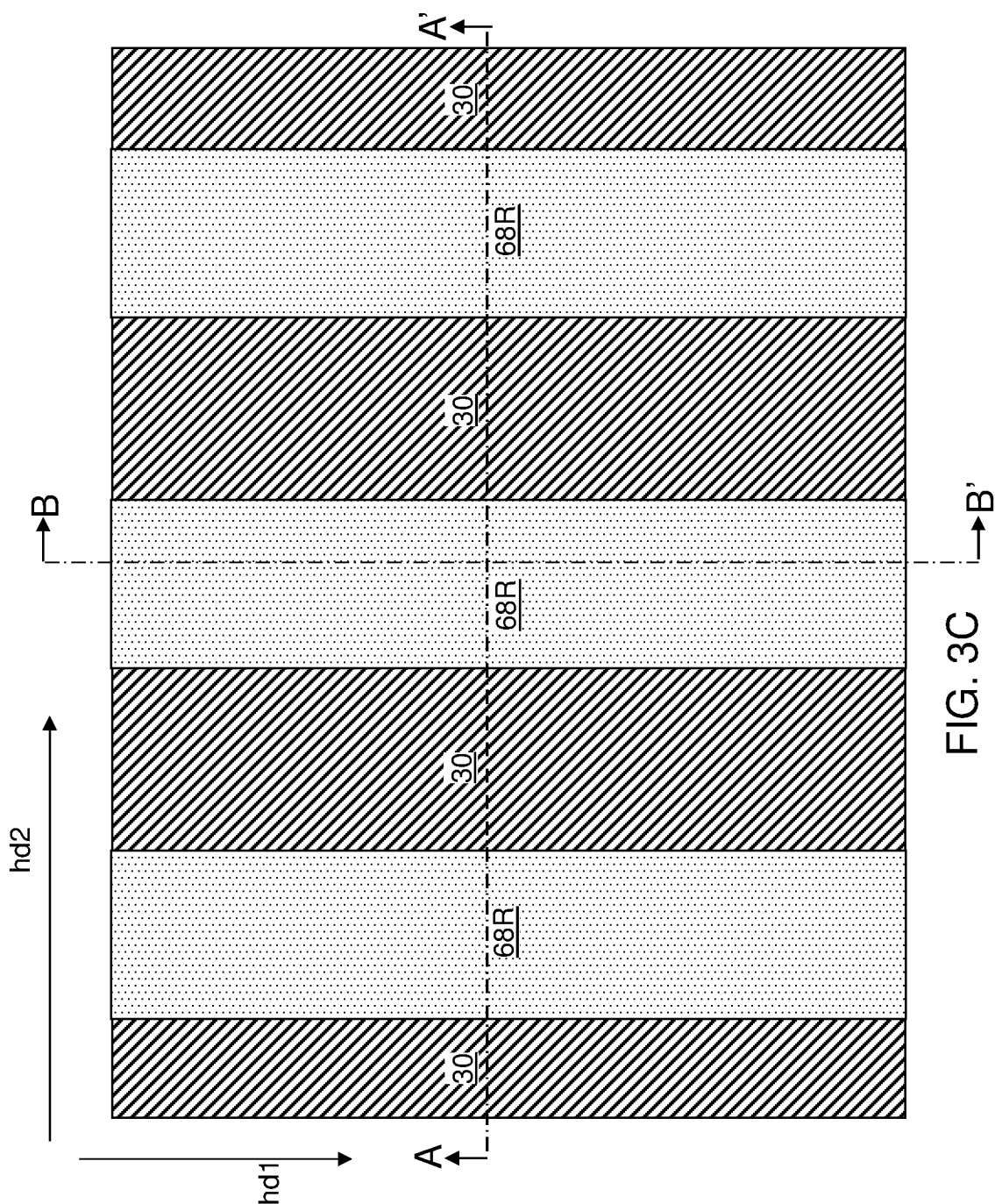
FIG. 3C is a horizontal cross-sectional view of the first exemplary structure of FIGS. 3A and 3B along the horizontal plane C-C'.

Referring to FIGS. 3A-3C, a dielectric material is deposited to fill the line trenches 49L. The dielectric material can be removed from above a horizontal plane including the top surfaces of the insulating cap layers 62. Each remaining portion of the dielectric material filling a line trench 49L constitutes a dielectric rail structure, which is herein referred to as separator rail structures 68R. Each separator rail structure 68R extends along the first horizontal direction hd1. The alternating stacks (30, 60) and the separator rail structures 68R can form a one-dimensional array that extends along the second horizontal direction hd2. In one embodiment, the alternating stacks (30, 60) and the separator rail structures 68R can have a periodicity that is equal to the sum of the width of an alternating stack (30, 60) and the width of a separator rail structure 68R. The separator rail structures 68R includes a dielectric material such as doped silicate glass, undoped silicate glass (e.g., silicon oxide), silicon nitride, organosilicate glass, or porous derivatives thereof. In an illustrative example, the insulating layers 60 can include undoped silicate glass (e.g., $SiO_2$) or doped silicate glass, the insulating cap layers 62 can include silicon nitride or a dielectric metal oxide, and the separator rail structures 68R can include doped silicate glass, undoped silicate glass, or organosilicate glass.

Figure 4A:
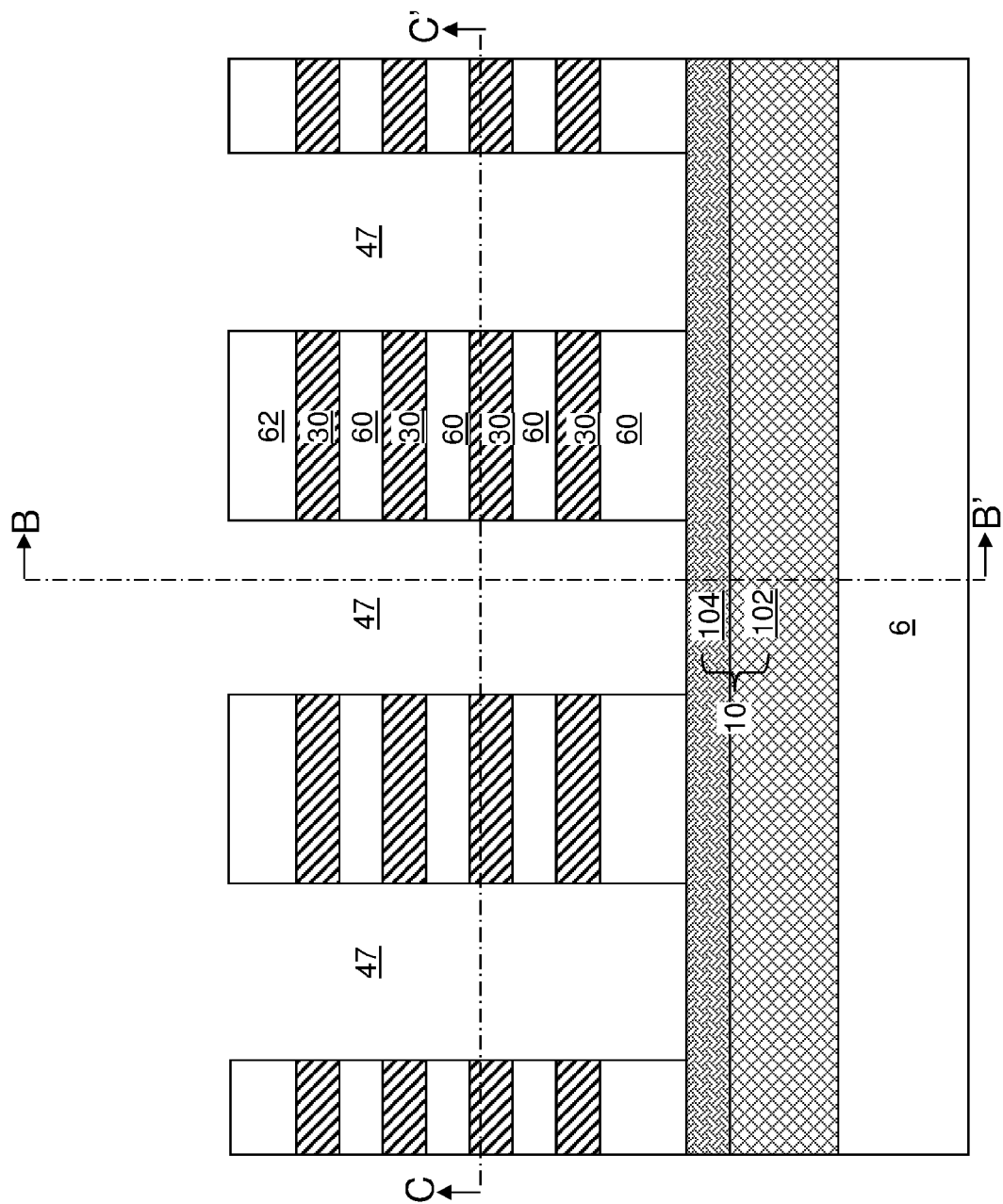
FIG. 4A is a first vertical cross-sectional view of the first exemplary structure after forming dielectric pillar structures that define bit line cavities according to the first embodiment of the present disclosure.
Figure 4B:
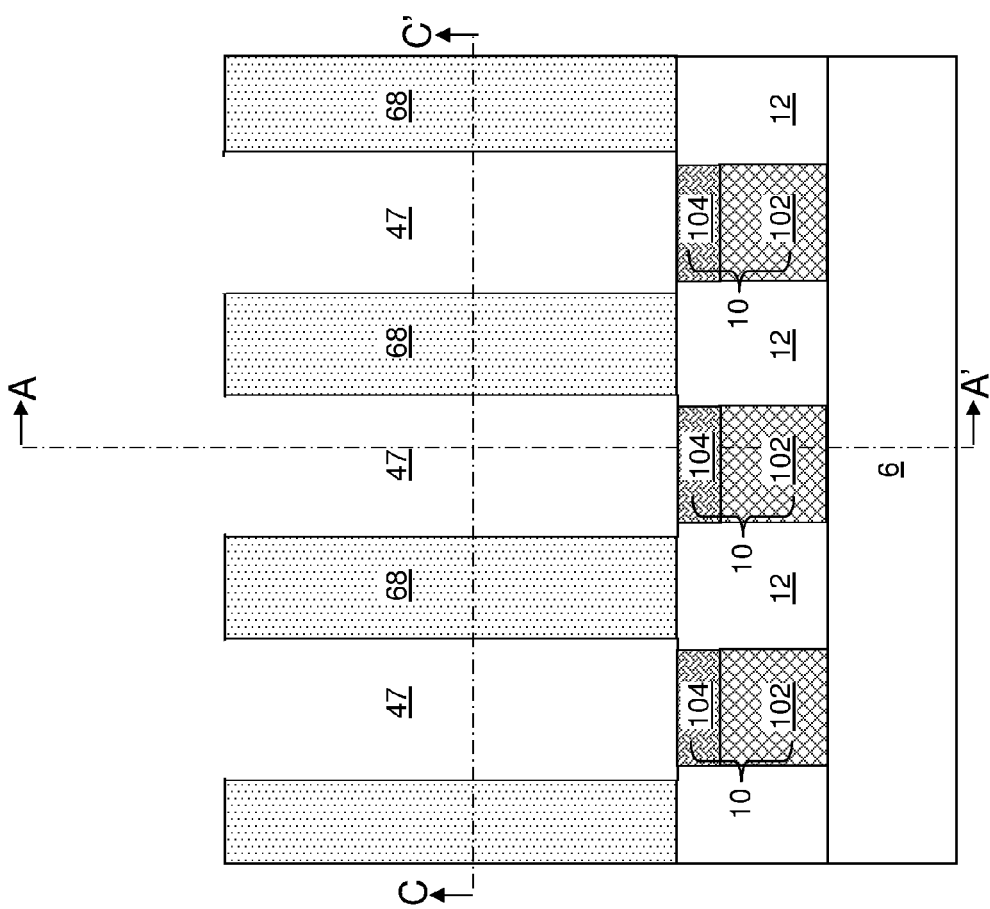
FIG. 4B is a second vertical cross-sectional view of the first exemplary structure of FIG. 4A along the vertical plane B-B'.
Figure 4C:
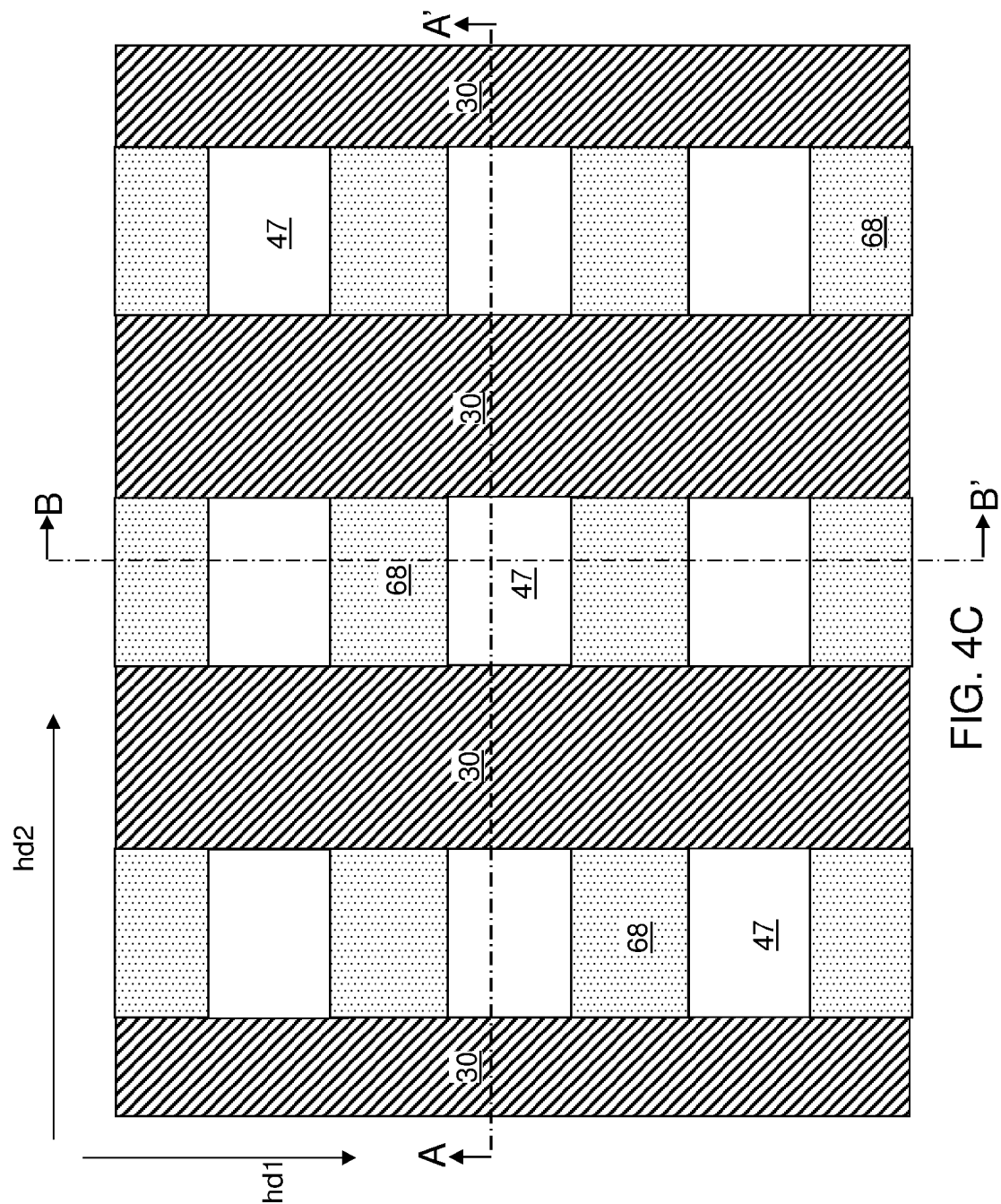
FIG. 4C is a horizontal cross-sectional view of the first exemplary structure of FIGS. 4A and 4B along the horizontal plane C-C'.

Referring to FIGS. 4A-4C, bit line cavities 47 can be formed by patterning the separator rail structures 68R into separator pillar structures 68. Specifically, a photoresist layer (not shown) can be applied over the insulating cap layers 62 and the separator rail structures 68R, and can be lithographically patterned to form linear portions that overlie areas of the separator dielectric material portions 12. Line trenches extending along the second horizontal direction hd2 and overlying areas of the global bit lines 10 are formed between remaining portions of the photoresist layer and above the alternating stacks (30, 60) and the separator rail structures 68R.

An anisotropic etch that removes the dielectric material of the separator rail structures 68R selective to the dielectric material of the insulating cap layers 62 can be performed to remove portions of the separator rail structures 68R that are not covered by a combination of the photoresist layer portions and insulating cap layers 62. Bit line cavities 47 having rectangular horizontal cross-sectional areas and extending through the alternating stacks (30, 60) to top surfaces of the global bit lines 10 can be formed, thereby separating the separator rail structures 68R into separator pillar structures 68. The bit line cavities 47 can form a two-dimensional rectangular array. The separator pillar structures 68 can form another two-dimensional rectangular array having the same periodicity as the two-dimensional rectangular array of the bit line cavities 47. Each bit line cavity 47 is formed adjacent to each alternating stack (30, 60), which is a remaining portion of the initial alternating stack (30, 60). While rectangular bit line cavities 47 are illustrated herein, embodiments are expressly contemplated herein in which the bit line cavities 47 have a non-rectangular horizontal cross-sectional area. For example, depending on the integration scheme and etch masks employed, the bit line cavities 47 may have a generally curvilinear closed shape. For example, the horizontal cross-sectional shape of the bit line cavities 47 may be circular, elliptical, polygonal, or may include a combination of at least one straight edge and at least one curved edge.

Figure 5A:
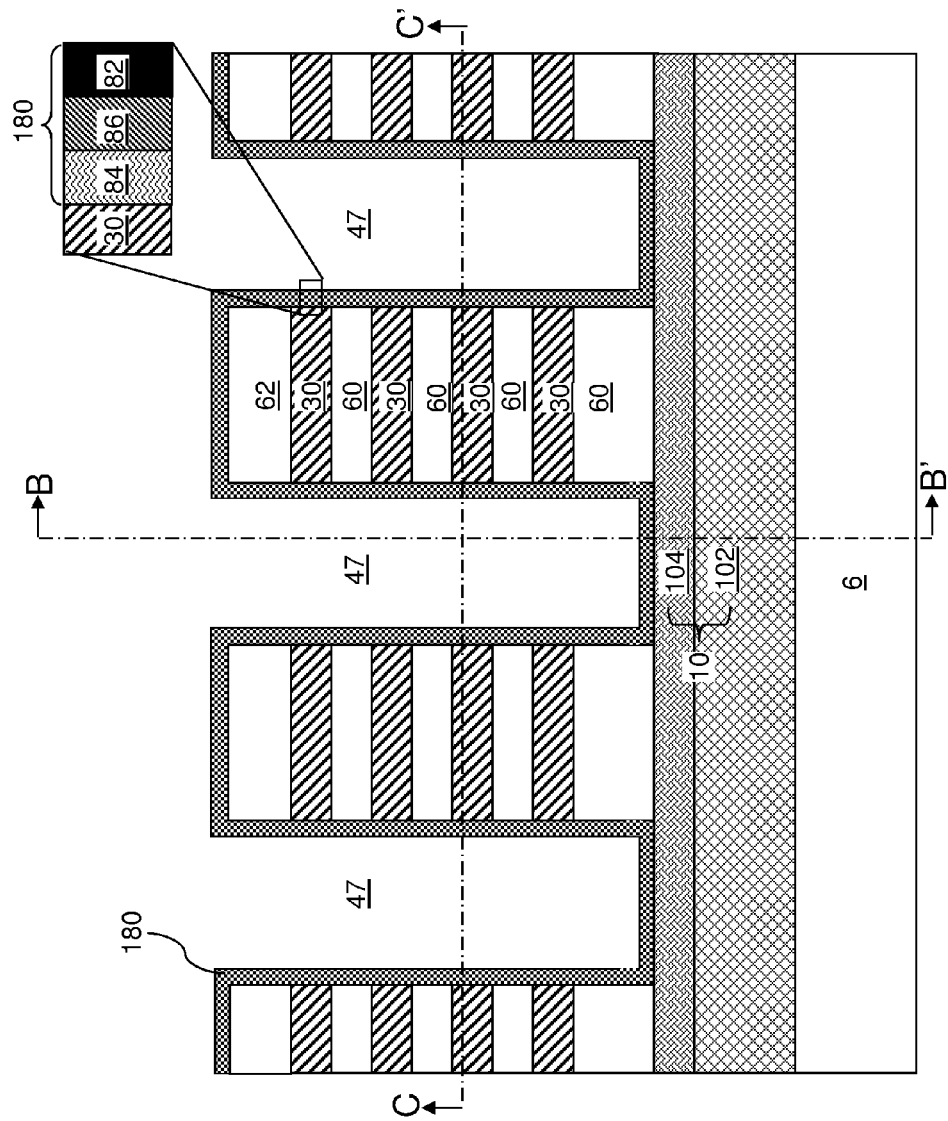
FIG. 5A is a first vertical cross-sectional view of the first exemplary structure after formation of a memory-material-containing layer stack according to the first embodiment of the present disclosure.
Figure 5B:
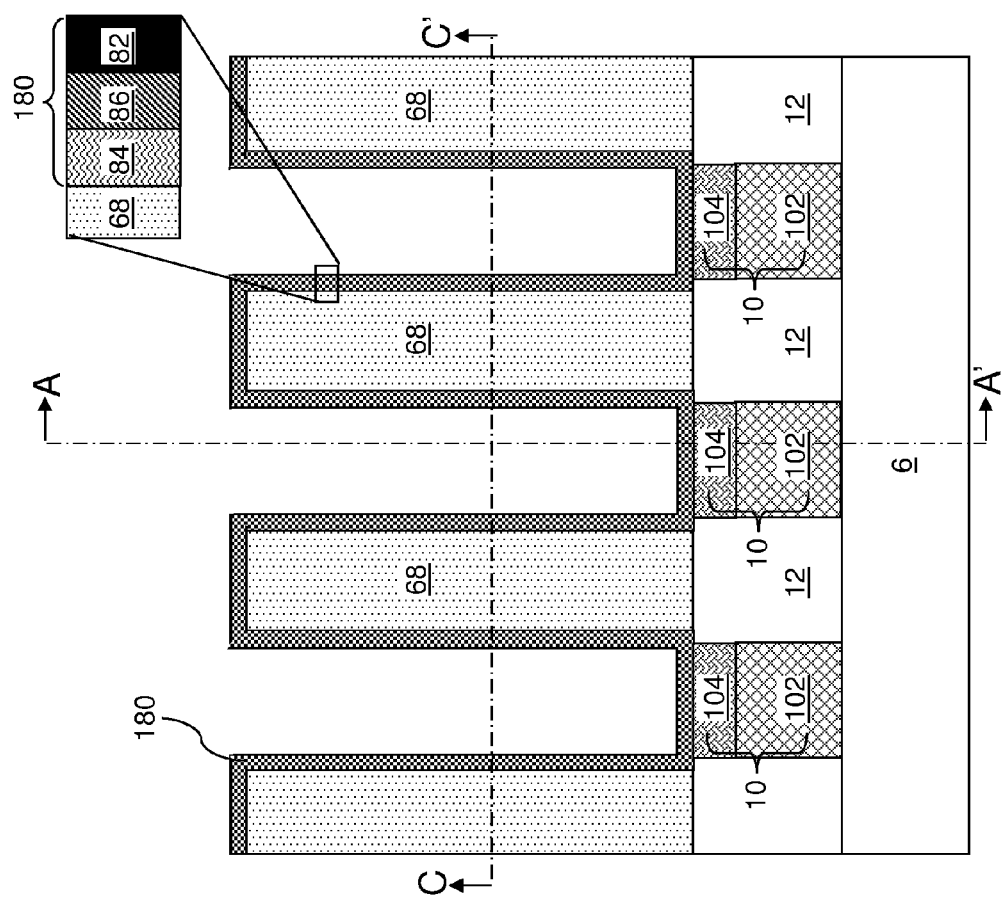
FIG. 5B is a second vertical cross-sectional view of the first exemplary structure of FIG. 5A along the vertical plane B-B'.
Figure 5C:
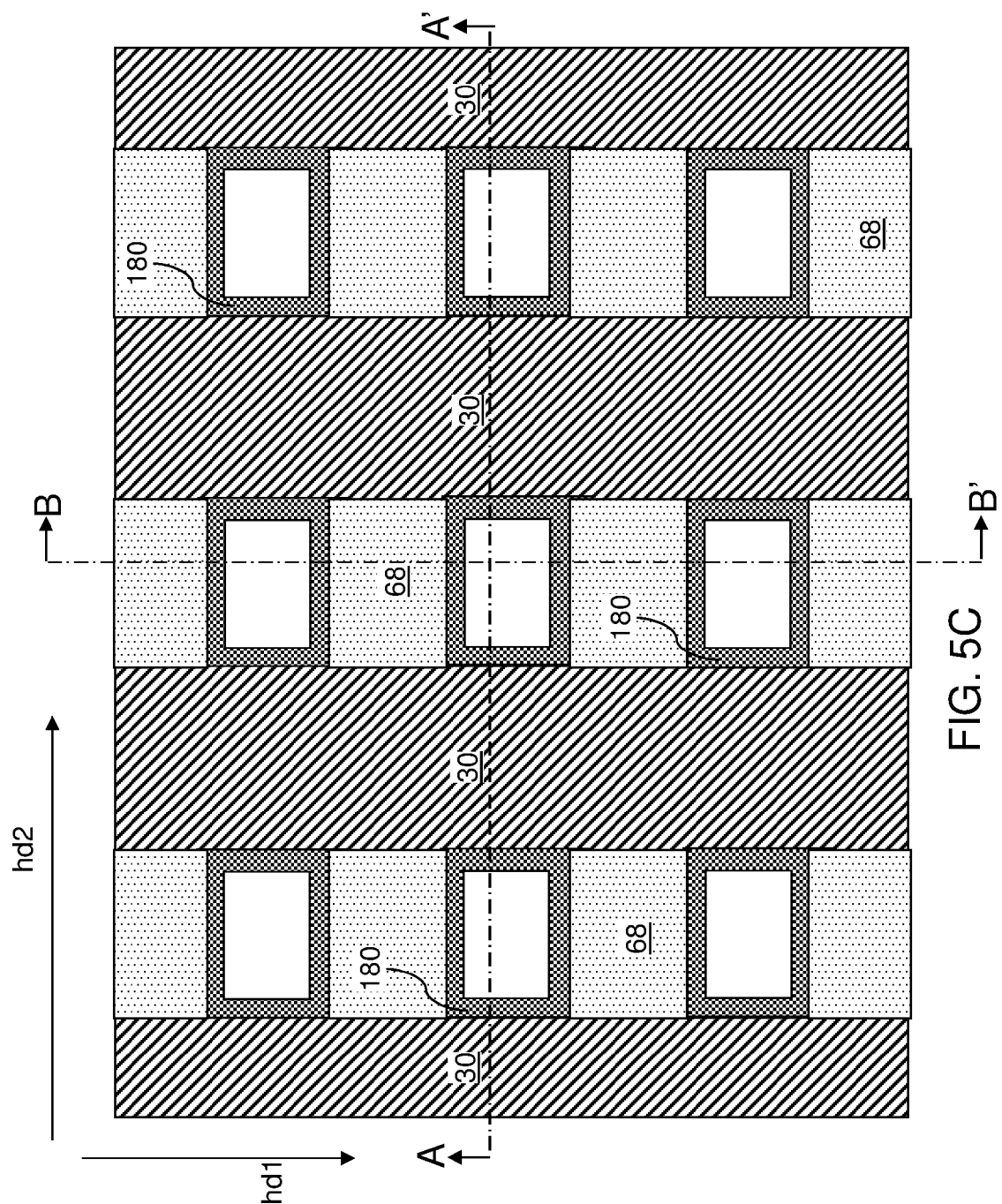
FIG. 5C is a horizontal cross-sectional view of the first exemplary structure of FIGS. 5A and 5B along the horizontal plane C-C'.

Referring to FIGS. 5A-5C, a memory-material-containing layer stack 180 can be formed on the sidewalls of the bit line cavities 47, on the physically exposed portions of the global bit lines 10 (i.e., the physically exposed portions of the doped semiconductor rails 104), and over the insulating cap layer 62. In one embodiment, the memory-material-containing layer stack 180 can include a selector element, such as a selector element layer(s) (84, 86) and a resistive storage element, such as a resistive memory material layer 82. Thus, the memory-material-containing layer stack 180 is a memory-material-containing structure in which selector elements are embodied as portions of selector element layer(s) (84, 86), and resistive memory elements are embodied as portions of a resistive memory material layer 82.

As used herein, a "selector element layer" refers to a layer including one or more selector element(s). As used herein, a "selector element" is a steering element that displays a non-linear voltage-current characteristic such that the element functions as an electrical insulator in a first voltage range and functions as an electrical conductor in a second voltage range. In one embodiment, each selector element may include a diode, such as a semiconductor diode (e.g., a pn junction diode, a pin junction diode, or a Schottky diode) or a metal-insulator-metal (MIM) diode. However, selector elements displaying non-diodic electrical characteristics can also be employed. The selector element may be unidirectional or bidirectional.

The resistive memory material layer 82 can be deposited on the selector element layer (84, 86). Each portion of the resistive memory material layer 82 at a level of a spacer material layer 30 constitutes a resistive memory element. In other words, the resistive memory elements are embodied as portions of the resistive memory material layer 82 at the levels of the spacer material layers 30. In one embodiment, the resistive memory material layer 82 can include a filament-forming dielectric material providing a reduced resistivity upon formation of conductive filaments therein (such as a hafnium oxide or nickel oxide layer), or barrier modulated cell (BMC) material in which vacancy concentration is modulated in a metal oxide material providing an increased resistivity upon reduction of oxygen vacancy therein (such as a sub-stoichiometric titanium oxide material) or a phase change chalcogenide material that switches between amorphous and crystalline state. The resistive memory material layer 82 can be formed by a conformal deposition process such as atomic layer deposition or chemical vapor deposition. The resistive memory material layer 82 can have a thickness in a range from 3 nm to 15 nm, although lesser and greater thicknesses can also be employed.

In one embodiment described in U.S. patent application Ser. No. 15/228,216 filed on Aug. 4, 2016 and incorporated herein by reference in its entirety, the selector element layers (84, 86) can include a charge carrier barrier, such as a barrier material layer 84 and an optional conductive material layer 86. The barrier material layer 84 includes a barrier material that has a suitable combination of a band gap and thickness in order to limit electrical current therethrough at low electrical fields, while allowing a significant amount of electrical current to pass through at high electrical fields. For example, the barrier material layer 84 can include polysilicon, amorphous silicon, amorphous germanium, an amorphous silicon germanium alloy, or aluminum oxide. The barrier material layer 84 can have a lateral thickness in a range from 3 nm to 15 nm, although lesser and greater thicknesses can also be employed. The conductive material layer 86 includes a conductive material such as a metal (e.g., Ti, Ta or W) or a metallic nitride (e.g., TiN, TaN, or WN). The conductive material layer 86 can be formed by deposition of a conductive material by a conformal deposition process on the sidewalls of the barrier material layer 84. In one embodiment, the layer stack of a conductive material layer 86 and the barrier material layer 84 constitutes the selector element layer (84, 86). In another embodiment, the layer stack of a conductive material layer 86 and the barrier material layer 84 is provided in the memory device in addition to a diode selector element. In another embodiment, the optional conductive material layer 86 may be omitted or replaced with a tunneling dielectric layer, such as an aluminum oxide tunneling dielectric layer.

The combination of the resistive memory material layer 82 and the selector element layer(s) (84, 86) constitute a memory-material-containing layer stack 180. While the present disclosure is described employing an embodiment in which the conductive material layer 86 contacts the resistive memory material layer 82, embodiments are expressly contemplated herein in which the barrier material layer 84 contacts the resistive memory material layer 82. Further, while the present disclosure is described employing an embodiment in which the selector element layer(s) (84, 86) is formed prior to formation of the resistive memory material layer 82, embodiments are expressly contemplated herein in which the resistive memory material layer 82 is deposited prior to formation of the selector element layer(s) (84, 86).

Figure 6A:
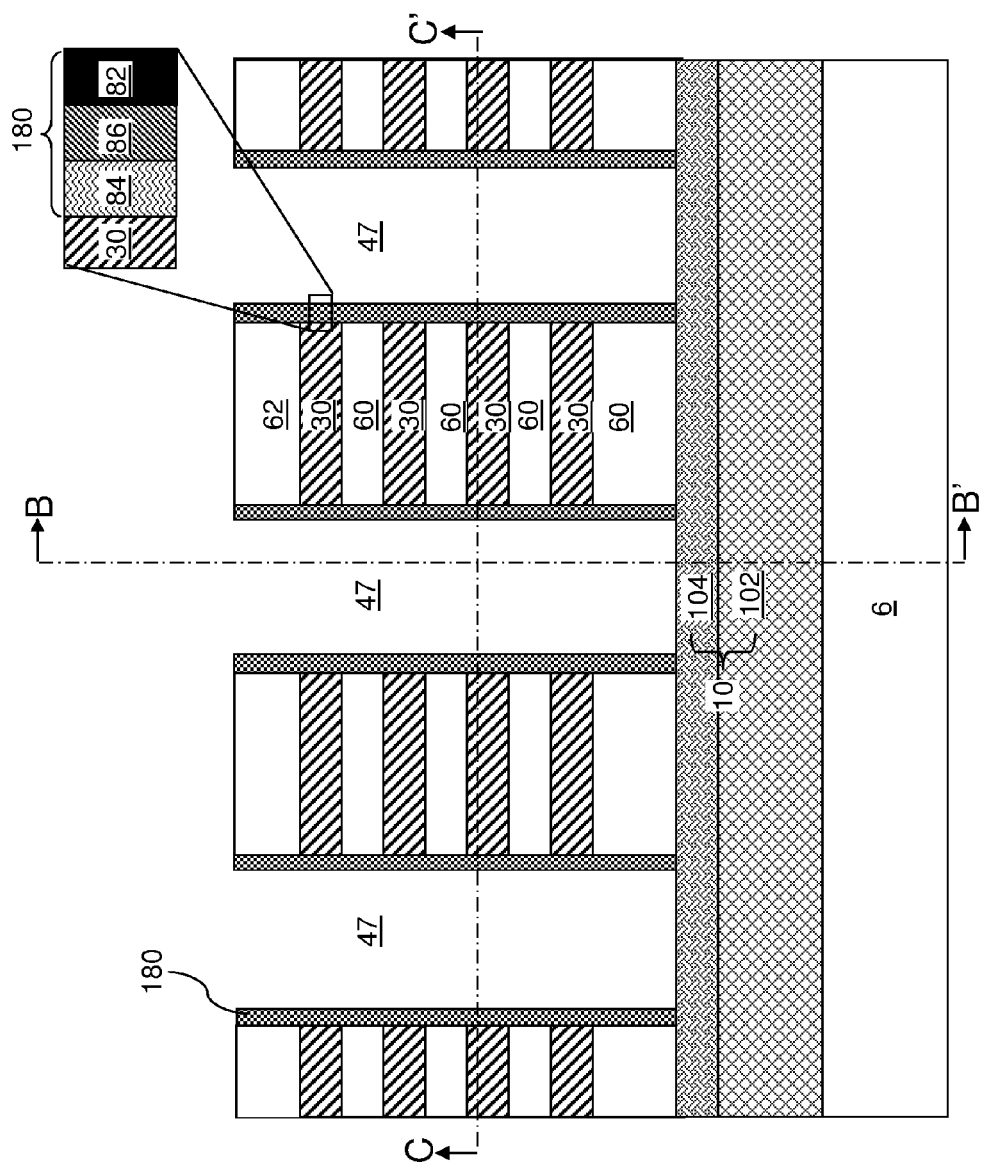
FIG. 6A is a first vertical cross-sectional view of the first exemplary structure after anisotropically etching the memory-material-containing layer stack according to the first embodiment of the present disclosure.
Figure 6B:
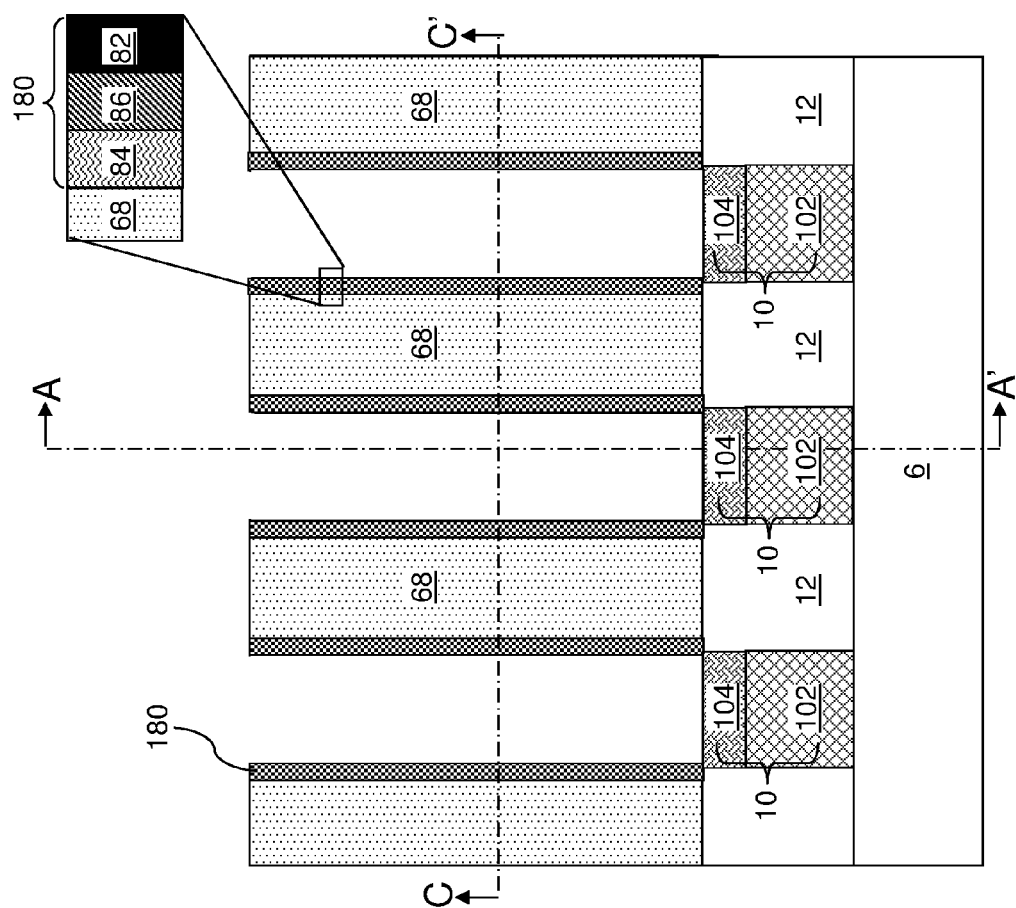
FIG. 6B is a second vertical cross-sectional view of the first exemplary structure of FIG. 6A along the vertical plane B-B'.

Referring to FIGS. 6A-6C, an anisotropic etch can be performed to remove horizontal portions of the memory-material-containing layer stack 180, i.e., the stack of the resistive memory material layer 82 and the selector element layer (84, 86). The anisotropic etch can be a directional dry etch such as a reactive ion etch (RIE). Chemistry of the anisotropic etch can be optimized depending on the composition of the materials of the resistive memory material layer 82 and the selector element layer (84, 86). The resistive memory material layer 82, which is initially formed as a single continuous material layer, is divided into a plurality of resistive memory material layers 82 that are confined within a respective bit line cavity 47 and having a tubular configuration. Likewise, the selector element layer (84, 86), which is initially formed as a layer stack of two continuous material layers, is divided into a plurality of selector element layers (84, 86) that are confined within a respective bit line cavity 47 and having a tubular configuration.

The portions of the selector element layers (84, 86) located at each level of the spacer material layers 30 constitute selector elements. In other words, each selector element comprises respective region of the stack of a barrier material layer 84 and a conductive material layer 86 at a level of a respective spacer material layer 30. Alternatively, each selector element comprises a diode having a p-type layer 84 and an n-type layer 86 (or vice-versa). Each of the selector element layers (84, 86) can continuously extends from a bottommost layer within the alternating stack (30, 60) to a topmost layer within the alternating stack (30, 60).

The portions of the resistive memory material layers 82 located at each level of the spacer material layers 30 constitute resistive memory elements. Thus, the resistive memory elements comprise portions of the respective resistive memory material layers 82 located at each level of the spacer material layers 30. The resistive memory elements are formed at a periphery of each of the bit line cavities 47 at each level of the spacer material layers 30. Each of the resistive memory material layers 82 can continuously extend from a bottommost layer within the alternating stack (30, 60) to a topmost layer within the alternating stack (30, 60).

Figure 7A:
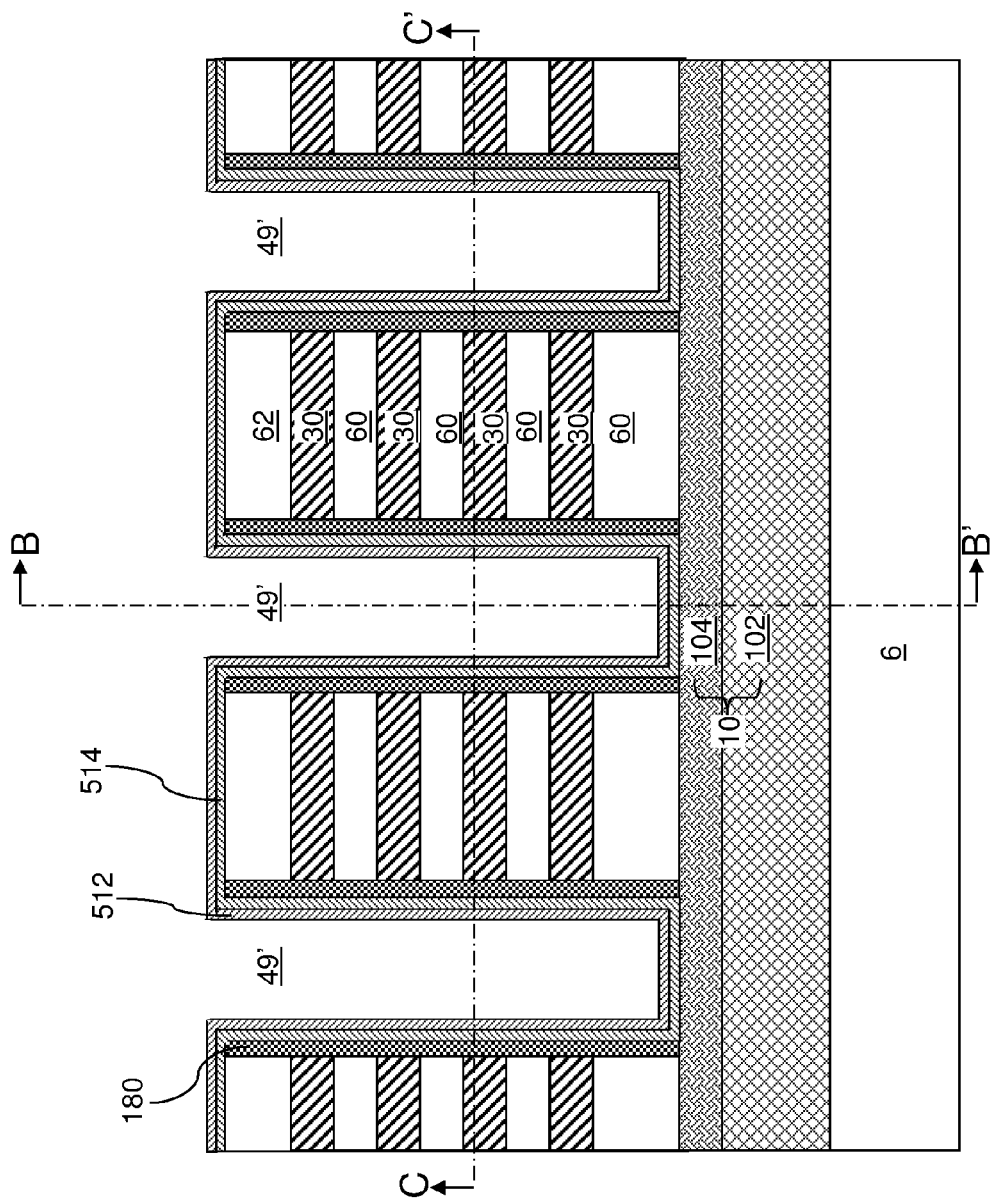
FIG. 7A is a first vertical cross-sectional view of the first exemplary structure after formation of an outer semiconductor material layer and an inner semiconductor material layer according to the first embodiment of the present disclosure.
Figure 7B:
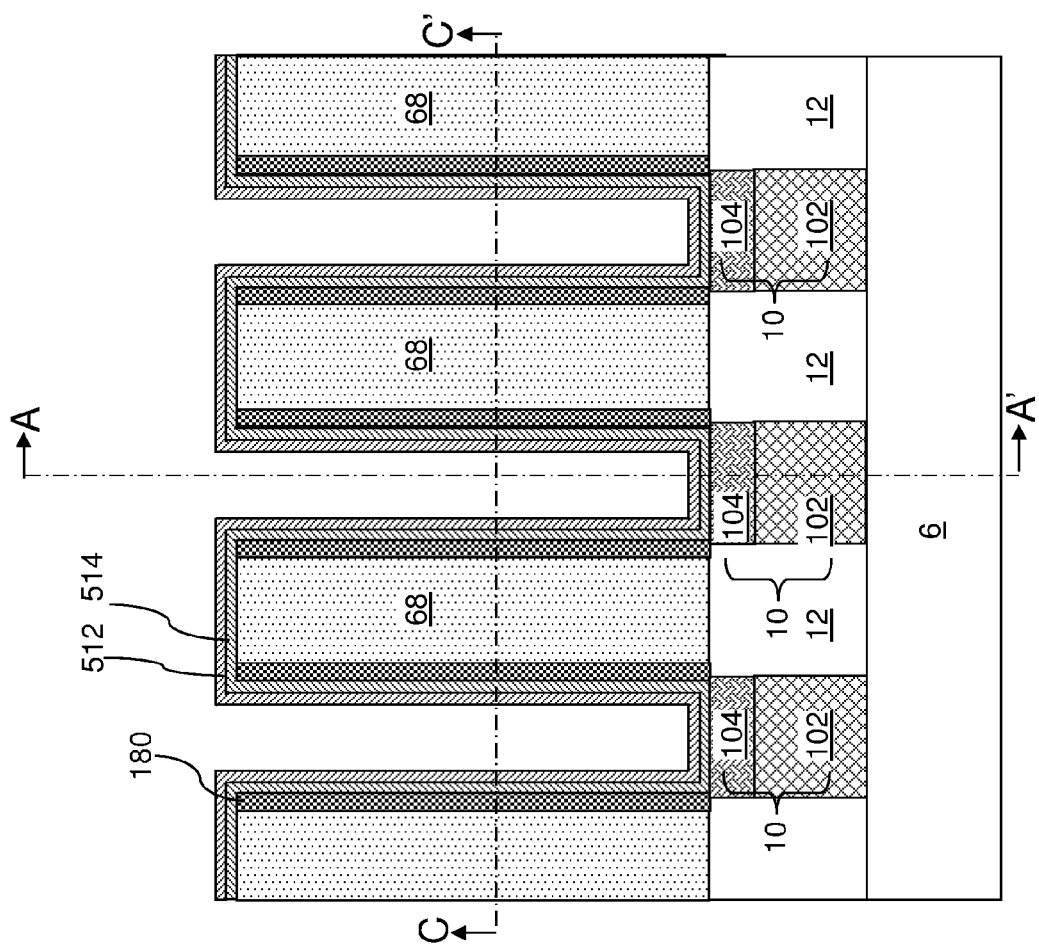
FIG. 7B is a second vertical cross-sectional view of the first exemplary structure of FIG. 7A along the vertical plane B-B'.
Figure 7C:
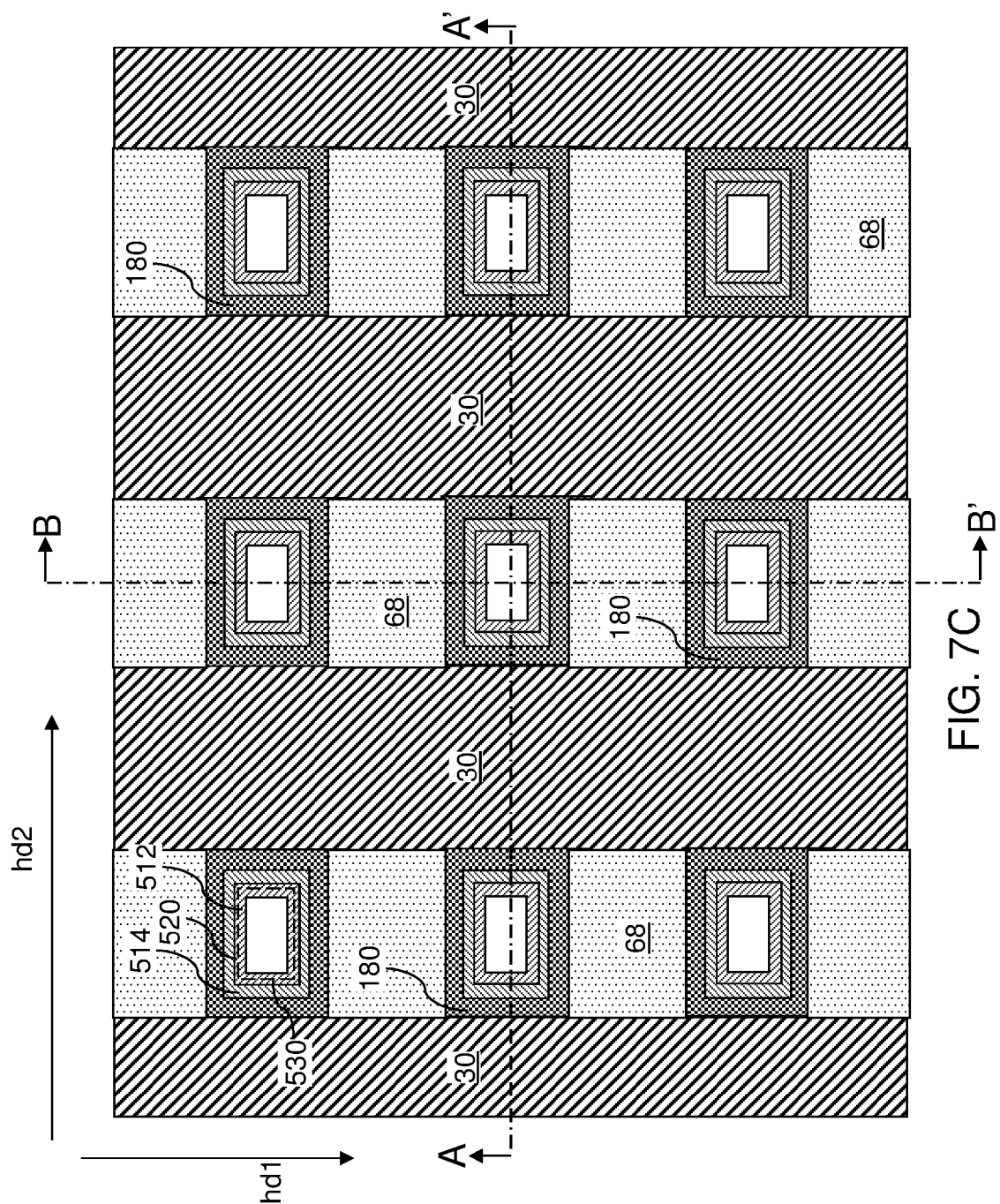
FIG. 7C is a horizontal cross-sectional view of the first exemplary structure of FIGS. 7A and 7B along the horizontal plane C-C'.

Referring to FIGS. 7A-7C, material layers (514, 512) for forming semiconductor local bit lines are formed in the bit line cavities 47. The material layers (514, 512) for forming semiconductor local bit lines can include a layer stack of an outer semiconductor material layer 514 and an inner semiconductor material layer 512 with an interface 520 between them.

As used herein, a "band gap" refers to the energy difference (in electron volts) between the top of the valence band and the bottom of the conduction band in insulator materials and semiconductor materials. The outer semiconductor material layer 514 has a band gap, which is herein referred to as an outer material band gap. The inner semiconductor material layer 512 has a band gap, which is herein referred to as an inner material band gap. The inner material band gap is wider than the outer material band gap. In one embodiment, the band structures of the inner semiconductor material layer 512 and the outer semiconductor material layer 514 are configured to provide a two-dimensional electron gas in planes 530 for electrical current conduction at, or in proximity to, the interface between the inner semiconductor material layer 512 and the outer semiconductor material layer 514.

The outer semiconductor material layer 514 and the inner semiconductor material layer 512 are sequentially deposited within the bit line cavities 47 and over the insulating cap layer 62. The outer semiconductor material layer 514 comprises an outer compound semiconductor material, and the inner semiconductor material layer 512 comprises an inner compound semiconductor material. The outer compound semiconductor material can be a III-V compound semiconductor material that is different from the inner compound semiconductor material to form a heterostructure semiconductor channel (512, 514) which functions as a local bit line of the ReRAM device. The heterostructure semiconductor channel contacts the global bit line 10 either physically or electrically (if there is an intervening conductive material between the heterostructure semiconductor channel and the global bit line). The pair of the outer compound semiconductor material and the inner compound semiconductor material can be selected such that the inner compound semiconductor material has an inner band gap that is greater than the outer band gap of the outer compound semiconductor material. In one embodiment, the outer compound semiconductor material can be selected from GaAs, InGaAs, InP, InAs, and InGaAsP. For example, InGaAs may have a formula $(In_xGa_{1-x})As$, where x ranges from greater than zero and less than 1, such as 0.15 to 0.33 or 0.65 to 0.73, including 0.7. In an illustrative example, the outer compound semiconductor material can be GaAs, and the inner compound semiconductor material can be AlGaAs. In another example, the outer compound semiconductor material can be InGaAs, and the inner compound semiconductor material can be GaAs. In yet another example, the outer compound semiconductor material can be InGaAs, and the inner compound semiconductor material can be InAlAs.

A semiconductor film may be roughly classified as crystalline or amorphous. An amorphous semiconductor film has disordered atomic arrangement and no crystalline component. An example is a semiconductor film in which no crystal part exists even in a microscopic region. Crystalline semiconductor films include single-crystal and non-single-crystal semiconductor films.

A non-single crystal semiconductor film can be crystalline to a different degree. For instance, a poly-crystalline semiconductor film is comprised of "grains". Within each grain, the material is in the crystalline phase. That is, within each grain, the crystalline structure is oriented in the same way. However, in different grains, the crystal orientation may be different. As the term is used herein, a polycrystalline semiconductor material includes nanocrystals, microcrystals, or even larger crystals. The terminology depends on the grain size. Nanocrystals have an average grain size on the order of one nanometer ($1\times10^{-9}$ meter) to hundreds of nanometers. Microcrystals have an average grain size on the order of one micrometer ($1\times10^{-6}$ meter) to hundreds of micrometers. Thus, a polycrystalline semiconductor material can have a higher degree of atomic order than an amorphous semiconductor material. Hence, the density of defect states of the poly-crystalline semiconductor film is lower than that of the amorphous semiconductor film.

As used herein, a "large grain crystalline material" refers to a polycrystalline material having an average grain size that is at least 300 nanometers ($300\times10^{-9}$ meter) in at least one direction. Note that for some embodiments of a three dimensional ReRAM device, the heterostructure semiconductor channel (512, 514) is formed from a thin semiconductor film. The semiconductor film may be on the order of tens of nanometers in thickness. For example, the semiconductor film may have a thickness in a range from 2 nm to 80 nm, although lesser and greater thicknesses can also be employed. Thus, a large grain of the heterostructure semiconductor channel may extend 300 nanometers or more in a direction parallel to the heterostructure semiconductor channel (512, 514) vertical direction (i.e., perpendicular to the top surface of the global bit line 10). However, a large grain might extend for less than a few hundred nanometers in a horizontal direction perpendicular to the vertical direction.

In one embodiment, the average grain size (as measured along a vertical direction) of the inner semiconductor material layer 512 may be on the order of 1 micron, or may be in on the order of several microns, or may be on the order of 10 microns, such as 0.5 to 12 microns). In such cases, outer and inner semiconductor material layers (514, 512) exhibiting substantially the same electrical characteristics as a single crystalline semiconductor material may be provided.

The outer compound semiconductor material of the outer semiconductor material layer 514 can include a crystalline semiconductor material or an amorphous semiconductor material. The inner compound semiconductor material of the inner semiconductor material layer 512 can include a crystalline semiconductor material or an amorphous semiconductor material. Each of the outer semiconductor material layer 514 and the inner semiconductor material layer 512 can be formed by a conformal deposition method such as metal organic chemical vapor deposition (MOCVD).

In one embodiment, the outer semiconductor material layer 514 and/or the inner semiconductor material layer 512 can include a single crystalline semiconductor material. In another embodiment, the outer semiconductor material layer 514 and/or the inner semiconductor material layer 512 can include a polycrystalline semiconductor material. In one embodiment, the lateral dimensions of the grains of the polycrystalline semiconductor material parallel to the sidewalls of the outer semiconductor material layer 514 can be greater than the thickness of the outer semiconductor material layer 514. In one embodiment, the lateral dimensions of the grains of the polycrystalline semiconductor material parallel to the sidewalls of the inner semiconductor material layer 512 can be greater than the thickness of the inner semiconductor material layer 512.

In one embodiment, the lateral dimensions of the grains of the polycrystalline semiconductor material of the outer semiconductor material layer 514 parallel to the sidewalls of the outer semiconductor material layer 514 can be greater than the thickness of the outer semiconductor material layer 514 by orders of magnitude (e.g., from 10 times to 1,000 times or greater). In this case, the polycrystalline semiconductor material of the outer semiconductor material layer 514 can include large grains that provide substantially the same benefit in terms of charge carrier mobility as a single crystalline semiconductor material, albeit some degradation may be present due to charge carrier scattering at the grain boundaries. In one embodiment, the grain size (as measured along a vertical direction) may be on the order of 1 micron, or may be in on the order of several microns, or may be on the order of 10 microns, such as 0.5 to 12 microns. In such cases, the outer semiconductor material layer 514 can exhibit substantially the same electrical characteristics as a single crystalline semiconductor material may be provided.

In one embodiment, the lateral dimensions of the grains of the polycrystalline semiconductor material of the inner semiconductor material layer 512 parallel to the sidewalls of the inner semiconductor material layer 512 can be greater than the thickness of the inner semiconductor material layer 512 by orders of magnitude (e.g., from 10 times to 1,000 times or greater). In this case, the polycrystalline semiconductor material of the inner semiconductor material layer 512 can include large grains that provide substantially the same benefit in terms of charge carrier mobility as a single crystalline semiconductor material, albeit some degradation may be present due to charge carrier scattering at the grain boundaries. In one embodiment, the grain size (as measured along a vertical direction) may be on the order of 1 micron, or may be in on the order of several microns, or may be on the order of 10 microns, such as 0.5 to 12 microns. In such cases, the inner semiconductor material layer 512 can exhibit substantially the same electrical characteristics as a single crystalline semiconductor material may be provided. In one embodiment, the grains of the outer semiconductor material layer 514 can be in epitaxial alignment with the grains of the inner semiconductor material layer 512.

The III-V compound semiconductor materials of the outer and inner semiconductor material layers (514, 512) can be deposited in a manner that forms large grains in the outer and inner semiconductor material layers (514, 512). In one embodiment, surfaces of the first exemplary structure as provided after the processing steps of FIGS. 6A-6C can be cleaned, for example, in dilute hydrofluoric acid. The first exemplary structure is then placed within a processing chamber, and is heated to a first temperature for outgassing. The first exemplary structure can be cooled to a second temperature. A group III precursor is flowed into the processing chamber to form a group III nucleation layer. The second temperature can be maintained while flowing the group III precursor and a group V precursor into the processing chamber until a conformal layer is formed. The processing chamber can be heated to an annealing temperature, while stopping the flow of the group III precursor. The processing chamber can be cooled to the second temperature.

The III-V compound semiconductor materials can be deposited under conditions for metal organic chemical vapor deposition (MOCVD). The deposition process can be maintained to be conformal over various surface orientations while simultaneously producing a high quality crystalline film.

In some embodiments, the group III nucleation layer for the outer semiconductor material layer 514 can be deposited without selectivity, i.e., on all types of surfaces including the physically exposed surfaces of the memory-material-containing layer stack 180 and the global bit lines 10. The group III nucleation layer can be composed of one or more group III elements, and a group III-V layer formed on top of the group III nucleation layer. After the anneal process, the deposited film for the outer semiconductor material layer 514 can become a conformal III-V compound semiconductor film.

In one embodiment, the first temperature can be in a range from about 400 degrees Celsius to 700 degrees Celsius, such as from about 400 degrees Celsius to 500 degrees Celsius. The second temperature can be in a range from 250 degrees Celsius to 400 degrees Celsius (such as from 300 degrees Celsius to 350 degrees Celsius). In one embodiment, the group III precursor can be flowed into the processing chamber for up to 15 seconds, such as for a time duration in a range of about 3 to about 10 seconds.

One or more embodiments can include maintaining the processing chamber at the second temperature, flowing a group III precursor and a group V precursor into the processing chamber until a conformal layer between 5 nm and 25 nm thick is formed, heating the processing chamber to a "third temperature", while stopping the flow of the group III precursor, and cooling the processing chamber to the second temperature. The method can include stopping the group V precursor flow to the processing chamber when the process is complete. The conformal III/V layer formed by the addition of the group V precursor, after treatment with the group III precursor, can be between 5 nm and 20 nm thick.

The third temperature can be an annealing temperature, and can be in a range from about 400 degrees Celsius to 600 degrees Celsius, such as from 450 degrees Celsius to 550 degrees Celsius.

Group III and group V precursors used in binary or ternary III/V layers are chosen according to the specific electrical property desired. Non-limiting examples of group III precursors include trimethyl indium, trimethyl gallium, triethyl gallium, and trimethyl aluminum. Non-limiting examples of group V precursors include tertiarybutylarsine, tertiarybutyl phosphine, triethyl antimony, arsine ($AsH_3$), and phosphine ($PH_3$).

In one or more embodiments, the group III precursor used in any of the described layers can be the same group III precursor group as any other layer. Further, the group III precursor can be flowed into the processing chamber as a continuous flow from the nucleation layer step to the inner semiconductor layer formation.

It is believed group III precursor has a better sticking coefficient which allows the group III precursor to bind more effectively to substrate while simultaneously creating a binding site for the group V precursor. Group V precursor typically will not create a nucleation layer which can serve as a surface for III/V layer growth. Therefore, the group V precursor flow is continued after stopping the group III precursor flow to saturate the binding sites left by the group III precursor on the substrate without the expectation of continued layer growth.

The binary, ternary, or quaternary group III-V layers can include one or more group III and one or more group V elements, which can be composed of the same group III or the same group V element as used in the nucleation layer and can be conformal layers.

The inner semiconductor material layer 512 includes a wider band gap (WBG) semiconductor material such as AlGaAs. In the case of AlGaAs, trimethylgallium (TMGa), trimethylaluminum (TMAl), and arsine ($AsH_3$) can be employed as source gases.

Generally, the wider band gap semiconductor material can be deposited at a higher deposition temperature than the narrow band gap material of the outer semiconductor material layer 514. A similar processing sequence can be employed for deposition of the inner semiconductor material layer 512 as for the deposition of the outer semiconductor material layer 514 with adjustment to the various processing temperatures. For example, a deposition temperature in a range between 360 degrees Celsius and 400 degrees Celsius can be employed for deposition of the III-V compound semiconductor material of the inner semiconductor material layer 512.

In an alternative embodiment, vapor phase epitaxy (VPE) and molecular beam epitaxy (MBE) may be employed in lieu of metal organic chemical vapor deposition (MOCVD).

In case any portion of the III-V compound material of the outer and inner semiconductor material layers (514, 512) is doped with electrical dopants, suitable electrical dopants can be employed. For example, dopants in AlGaAs grown by metal organic vapor phase epitaxy (MOVPE) can include Si for n-type doping, and can include Zn or C for p-type doping. In one embodiment, δ-doping can be employed, which is a doping technique that attempts to spatially confine the dopants to one atomic layer during epitaxial growth of semiconductors. A set of processing steps including pre-δ-doping purge, δ-doping step and post-δ-doping purge step can be employed to provide δ-doping. The doping precursor is introduced and the dopants are incorporated on the non-growing surface during a δ-doping step.

The thickness of the outer semiconductor material layer 514 can be in a range from 2 nm to 30 nm, such as 5-10 nm, although lesser and greater thicknesses can also be employed. The thickness of the inner semiconductor material layer 512 can be in a range from 2 nm to 30 nm, such as 5-10 nm, although lesser and greater thicknesses can also be employed. A cavity 49' is present in the volume of each bit line cavity 47 that is not filled with a memory-material-containing layer stack 180, the inner semiconductor material layer 512, and the outer semiconductor material layer 514. The outer semiconductor material layer 514 can be formed as a polycrystalline material layer, or can be deposited as an amorphous material layer and subsequently converted into a polycrystalline material layer.

In one embodiment, the grain size along the vertical direction can be greater than 100 nanometers in each of the outer and inner semiconductor material layers (514, 512), and the charge transport characteristics of the semiconductor material of the outer and inner semiconductor material layers (514, 512) approximates the charge transport characteristics of a single crystalline material. In one embodiment, the outer and inner semiconductor material layers (514, 512) can include a large grain polycrystalline material. The grain size along the vertical direction can be orders of magnitude greater than the thickness of the outer semiconductor material layer 514, and than the thickness of the inner semiconductor material layer 512. In this case, most of the grain boundaries can have orientations that are substantially perpendicular to the direction of the thickness (i.e., the radial direction) of the outer and inner semiconductor material layers (514, 512).

Figure 8A:
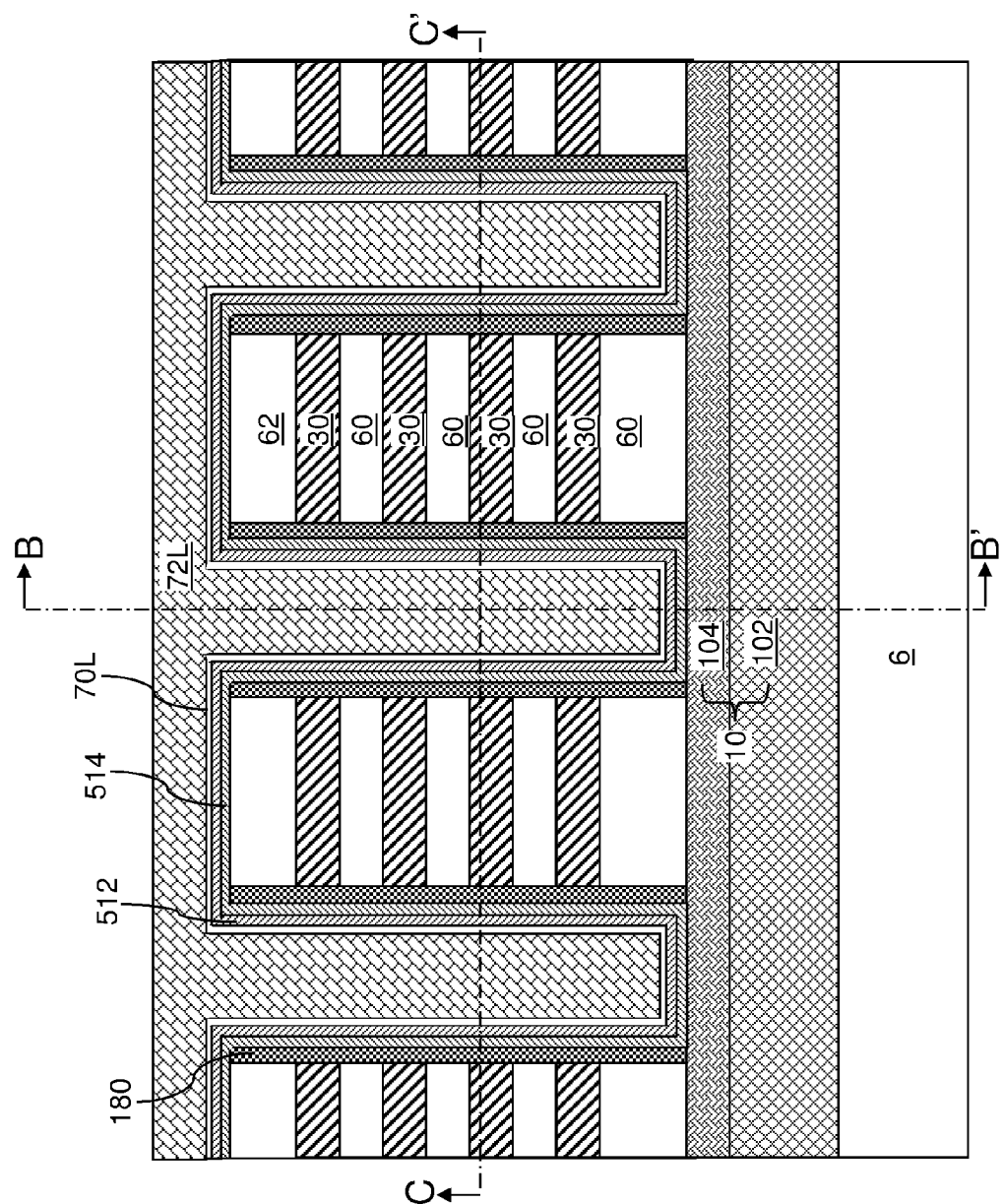
FIG. 8A is a first vertical cross-sectional view of the first exemplary structure after formation of a gate dielectric layer and a gate electrode layer according to the first embodiment of the present disclosure.
Figure 8B:
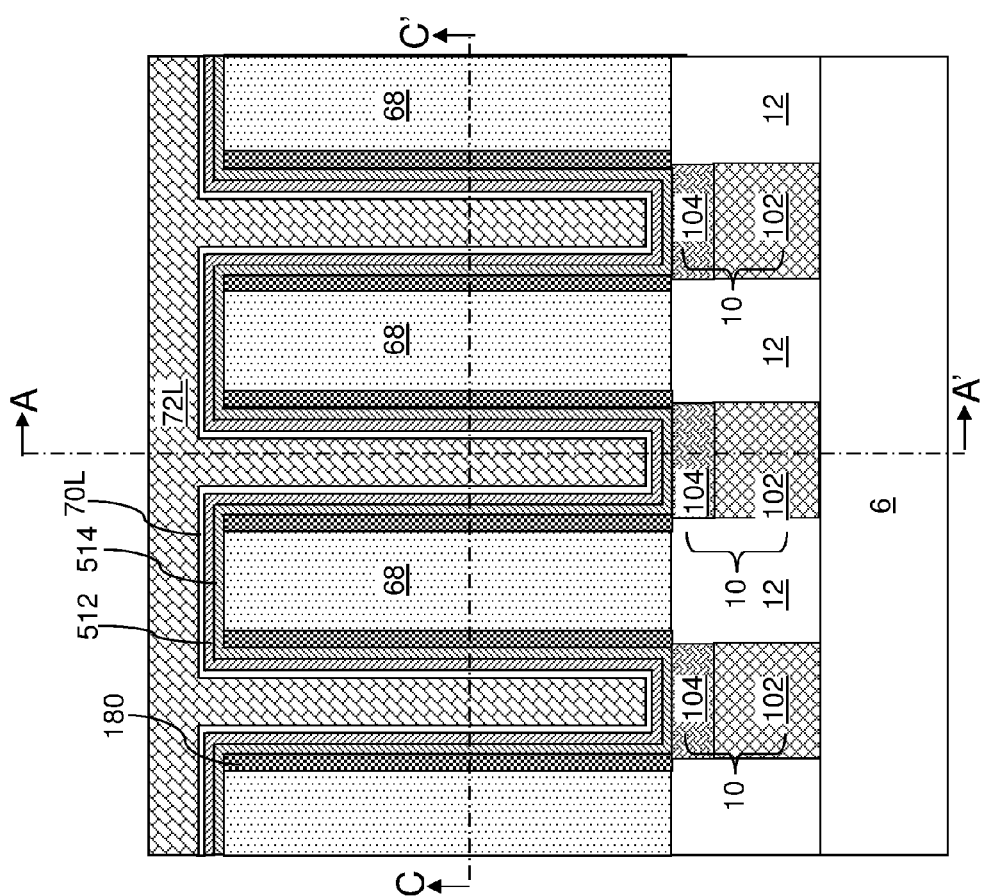
FIG. 8B is a second vertical cross-sectional view of the first exemplary structure of FIG. 8A along the vertical plane B-B'.
Figure 8C:
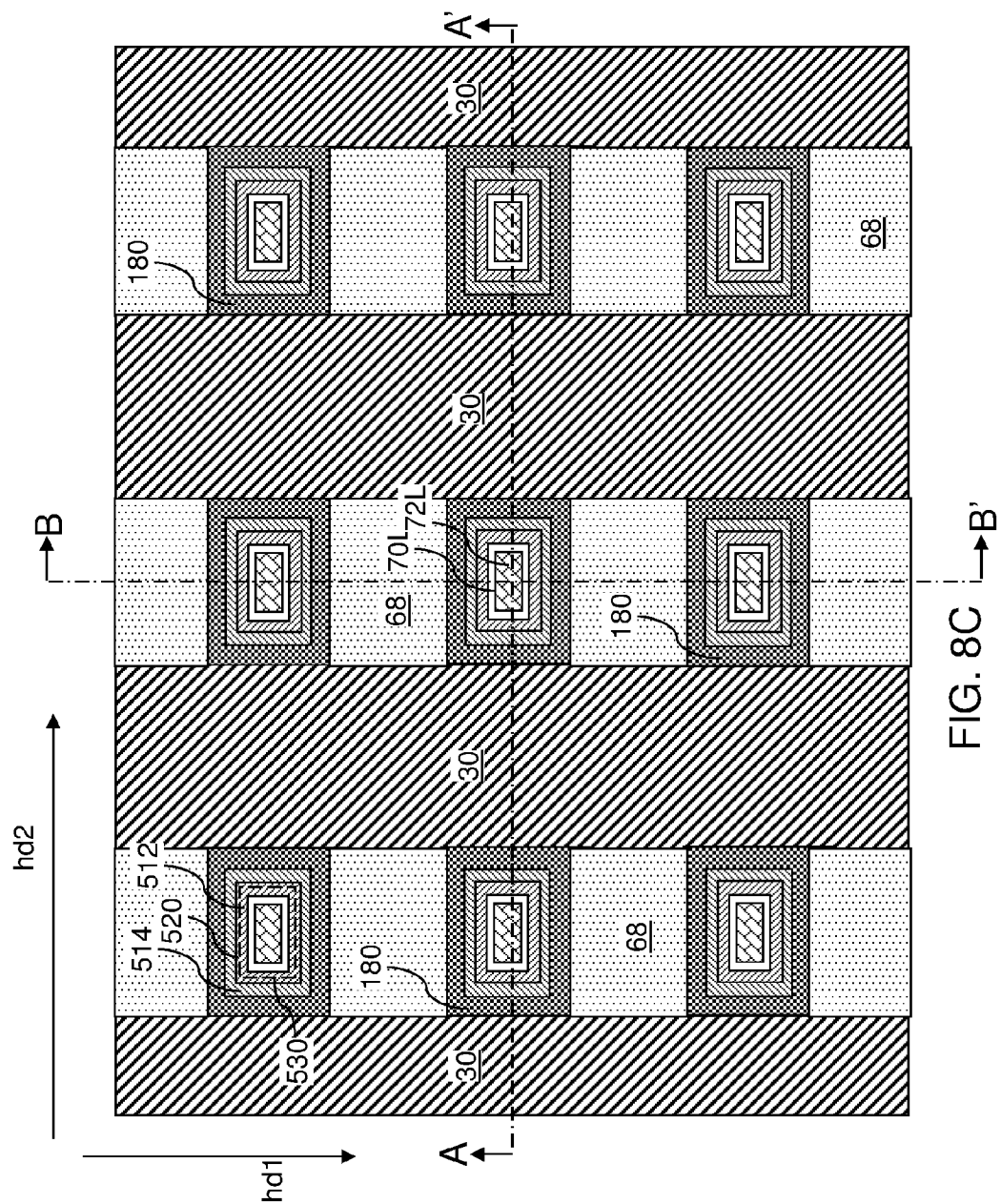
FIG. 8C is a horizontal cross-sectional view of the first exemplary structure of FIGS. 8A and 8B along the horizontal plane C-C'.

Referring to FIGS. 8A-8C, a gate dielectric layer 70L and a gate electrode layer 72L can be formed in each remaining volume of the bit line cavities 47. In one embodiment, the gate dielectric layer 70L can be formed by deposition of at least one dielectric material such as silicon oxide and/or a dielectric metal oxide. Optionally, physically exposed sidewalls of the inner semiconductor material layer 512 can be oxidized or nitrided and incorporated into the gate dielectric layer 70L.

In one embodiment, the gate dielectric layer 70L can be formed by a conformal deposition process such as atomic layer deposition or chemical vapor deposition. The thickness of the gate dielectric layer 70L can be in a range from 1 nm to 10 nm, although lesser and greater thicknesses can also be employed.

In one embodiment, the gate dielectric layer 70L can include silicon oxide and/or silicon oxynitride. In one embodiment, the gate dielectric layer 70L can include a dielectric metal oxide layer that is formed directly on the inner semiconductor material layer 512. The dielectric metal oxide layer can include aluminum oxide, hafnium oxide, or an alloy thereof, and can enhance the interfacial property between the inner semiconductor material layer 512 and the gate dielectric layer 70L by reducing interface scattering. Particularly, aluminum oxide can enhance interfacial characteristics with AlGaAs, GaAs, InGaAs, etc.

The gate electrode layer 72L includes at least one electrically conductive material such as a doped semiconductor material and/or a metallic material (e.g., TiN, WN, TaN, Ti, W, etc.). The gate electrode layer 72L fills the remaining volumes of the bit line cavities 47. The gate electrode layer 72L can extend through each level of the spacer material layers 30 with the alternating stack (30, 60).

Figure 9A:
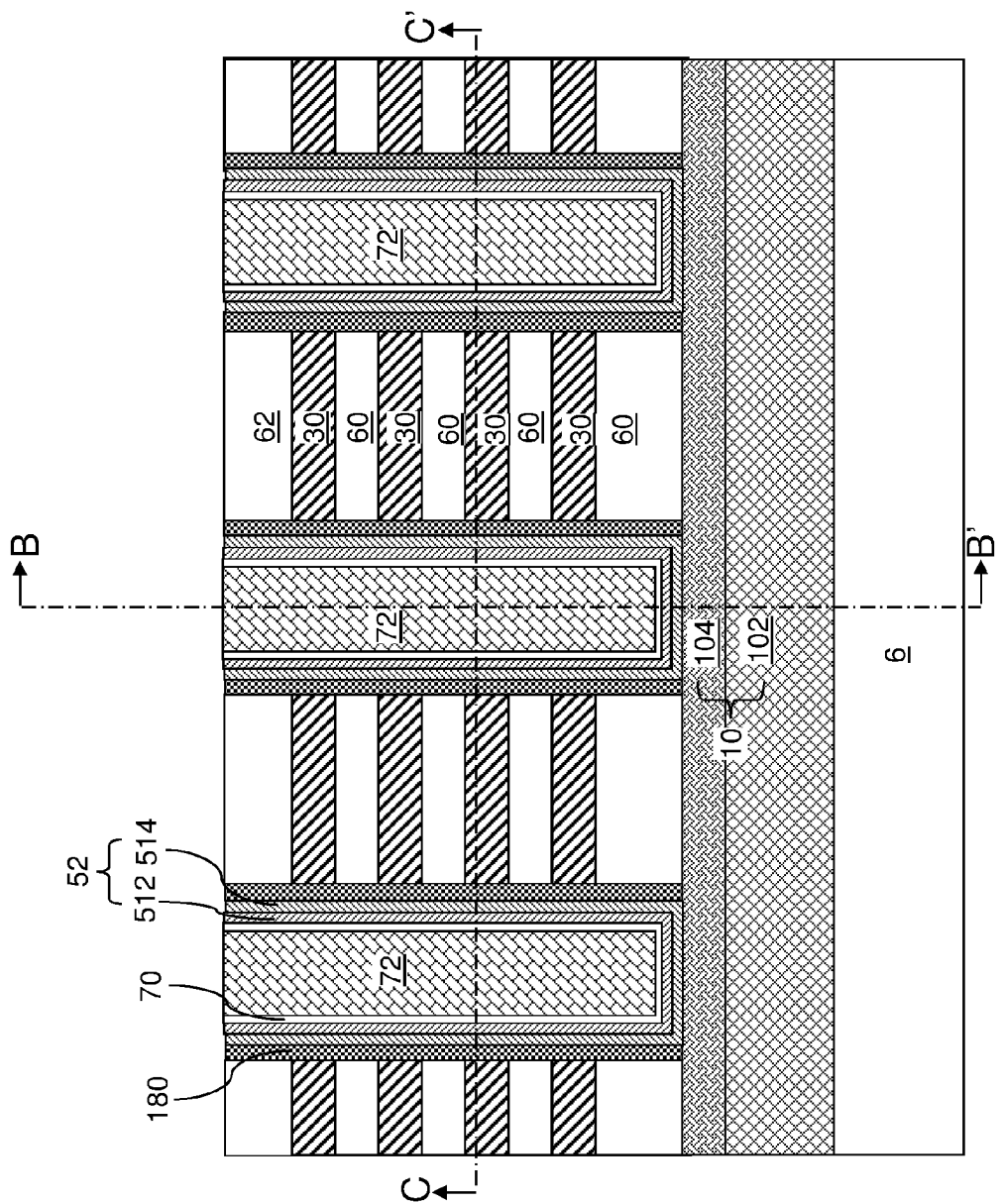
FIG. 9A is a first vertical cross-sectional view of the first exemplary structure after formation of gate dielectrics, gate electrodes, and semiconductor local bit lines by a planarization process according to the first embodiment of the present disclosure.
Figure 9C:
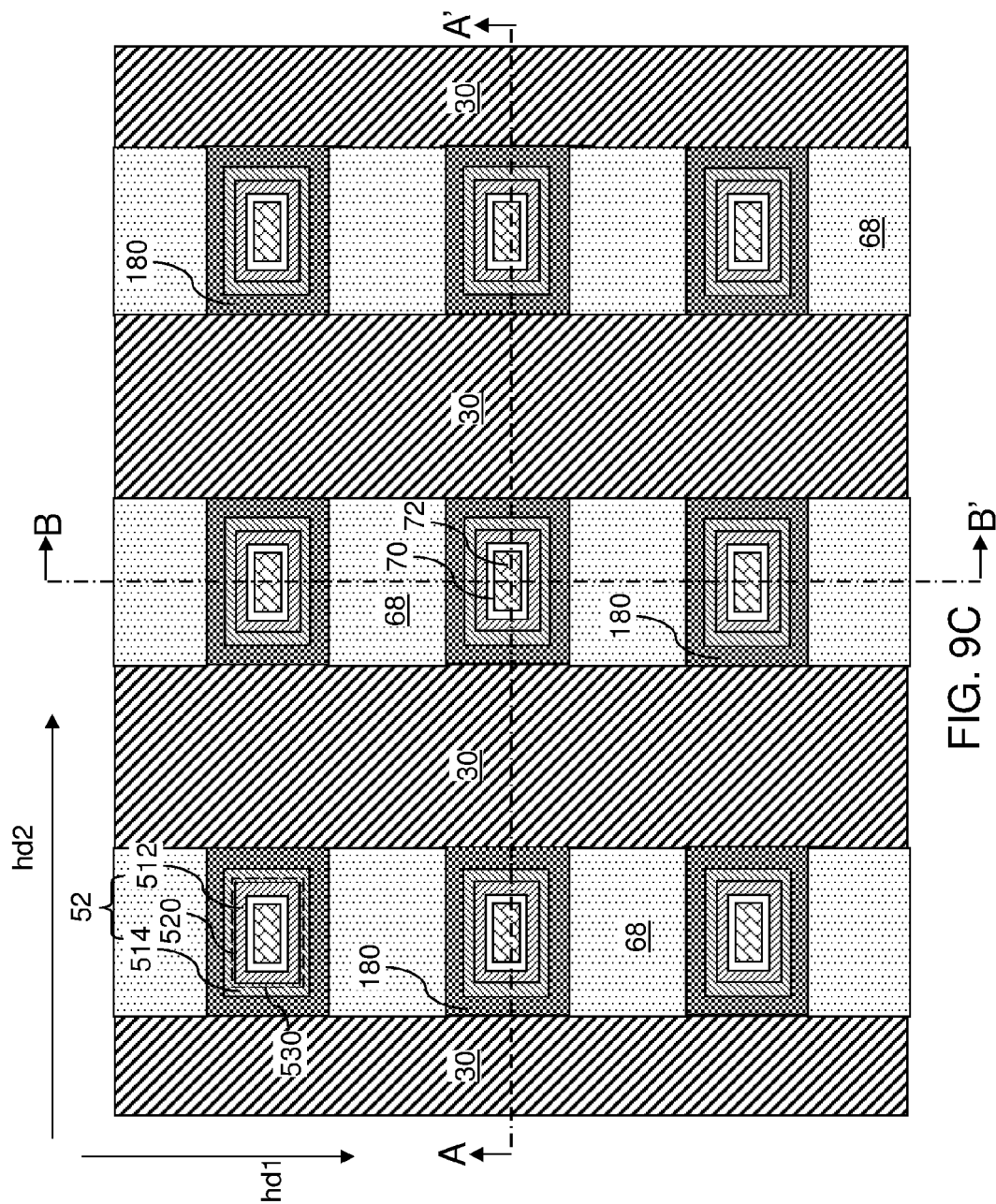
FIG. 9C is a horizontal cross-sectional view of the first exemplary structure of FIGS. 9A and 9B along the horizontal plane C-C'.

Referring to FIGS. 9A-9C, portions of the gate electrode layer 72L, the gate dielectric layer 70L, and the outer and inner semiconductor material layers (514, 512) that overlie the top surface of the insulating cap layer 62 can be removed by a planarization process. The planarization process can employ a recess etch, chemical mechanical planarization, or a combination thereof. The top surface of the insulating cap layer 62 can be employed as the stopping surface for the planarization process.

Each remaining portion of the gate electrode layer 72L in a respective bit line cavity 47 constitutes a gate electrode 72. Each remaining portion of the gate dielectric layer 70L in a respective bit line cavity 47 constitutes a gate dielectric 70. Each remaining portion of the outer semiconductor material layer 514 in a respective bit line cavity 47 includes a vertical portion that extends through the entirety of the alternating stack (30, 60) and having a topmost surface within the horizontal plane including the top surface of the insulating cap layer 62, and a horizontal portion that contacts a top surface of a respective global bit line 10. Each remaining portion of the inner semiconductor material layer 512 in a respective bit line cavity 47 includes a vertical portion that extends through the entirety of the alternating stack (30, 60) and having a topmost surface within the horizontal plane including the top surface of the insulating cap layer 62, and a horizontal portion that contacts a bottom surface of a respective gate dielectric 70.

The outer semiconductor material layer 514, which is formed as a single continuous material layer at the processing steps of FIGS. 7A-7C, is divided into a plurality of outer semiconductor material layers 514, each of which is confined within a respective bit line cavity 47. Likewise, the inner semiconductor material layer 512, which is formed as a single continuous material layer at the processing steps of FIGS. 7A-7C, is divided into a plurality of inner semiconductor material layers 512, each of which is confined within a respective bit line cavity 47. Each stack of an outer semiconductor material layer 514 and an inner semiconductor material layer 512 constitutes a heterostructure semiconductor channel (514, 512) which functions as a semiconductor local bit line 52. Each gate dielectric 70 is formed on inner sidewalls the vertical portion of a respective semiconductor local bit line 52 and on a top surface of the horizontal portion of the respective semiconductor local bit line 52. Each gate electrode 72 is formed on a respective gate dielectric 70. Each of the gate electrodes 72 is formed on an inner sidewall of a respective gate dielectric 70.

A plurality of selector elements is formed at each level of the spacer material layers 30. Each of the plurality of selector elements, which are portions of the selector element layer (84, 86) at levels of the spacer material layers 30, contacts a respective resistive memory element (which is a portion of the resistive memory material layer 82) and one element selected from the spacer material layers 30 and the semiconductor local bit lines upon formation of the semiconductor local bit lines 52.

Each gate electrode 72 enables or disables electrical current through the semiconductor local bit line 52 that laterally surrounds the gate electrode 72 depending on the electrical bias voltage applied to the gate electrode 72. Each of the semiconductor local bit lines 52 includes an inner semiconductor material layer 512 having an inner-material band gap and laterally surrounding a respective gate dielectric 70, and an outer semiconductor material layer 514 having an outer-material band gap that is narrower than the inner-material band gap and laterally surrounding the inner semiconductor material layer 512. Two-dimensional electron gas in vertical planes 530 for electrical current conduction can be present at, or in proximity to, the interface 520 between the inner semiconductor material layer 512 and the outer semiconductor material layer 514.

Each gate dielectric 70 is formed directly on a respective inner semiconductor material layer 512 and vertically extends continuously from a level of a bottommost spacer material layer 30 within the alternating stack (30, 60) to a level of a topmost spacer material layer 30 within the alternating stack (30, 60). Thus, each of the gate dielectrics 70 is formed on an inner sidewall of a respective semiconductor local bit line 52. Each of the gate electrodes 72 is formed on an inner sidewall of a respective gate dielectric 70.

A plurality of selector elements (embodied as portions of the selector element layer (84, 86)) is provided at each level of the spacer material layers 30. Each of the plurality of selector elements contacts a respective resistive memory element (embodied as portions of the resistive memory material layer 82 located at each level of the spacer material layers 30). Therefore, a combination of a resistive memory element among the resistive memory elements and a selector element among the plurality of selector elements is formed at each level of the spacer material layers 30. One of the resistive memory element and the selector element in the combination contacts a respective spacer material layer 30. Another of the resistive memory element and the selector element in the combination contacts a respective semiconductor local bit line 52.

The doping profile (if any) within each semiconductor local bit line 52 can be tailored to provide two-dimensional electron gas that extends vertically through each spacer material layer 30 within the alternating stack.

Figure 10:
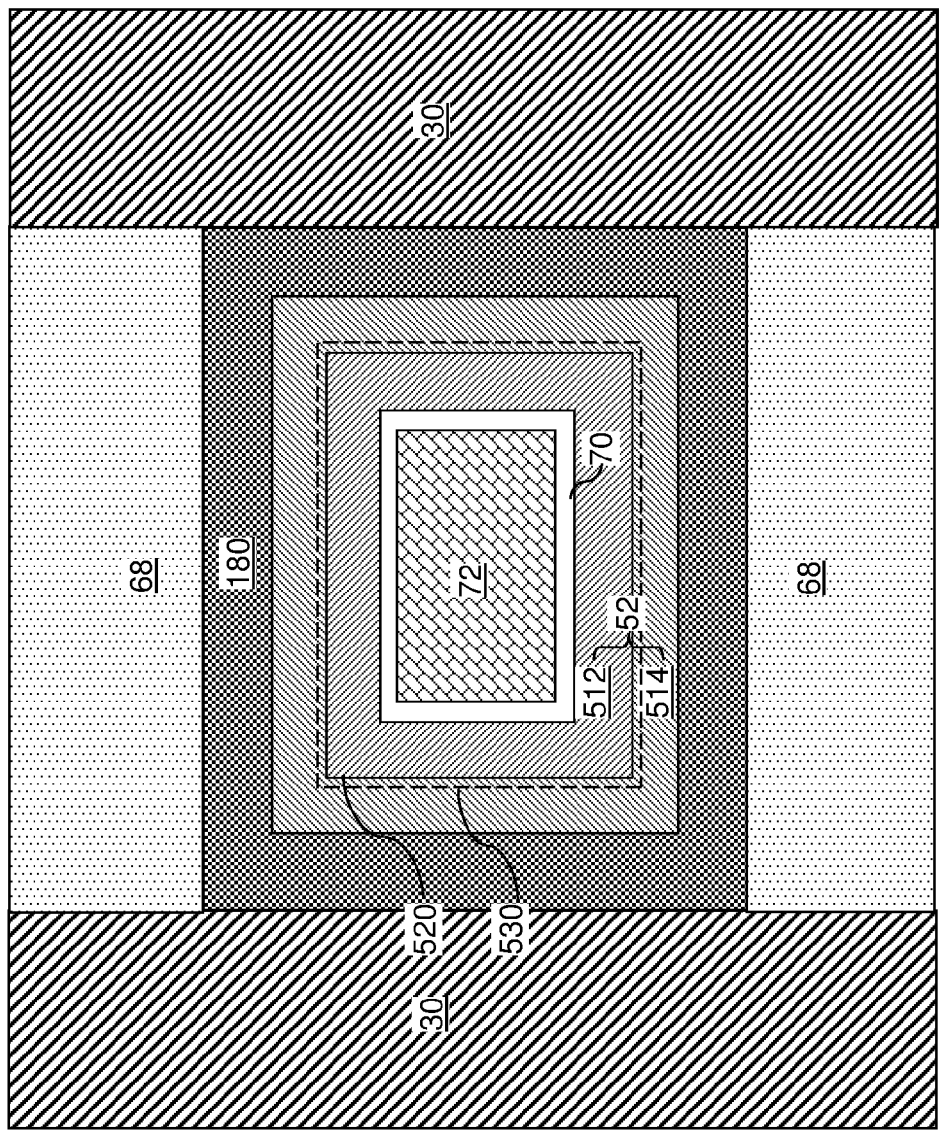
FIG. 10 is a horizontal cross-sectional view of a semiconductor local bit line of the first exemplary structure in a first configuration according to the first embodiment of the present disclosure.
Figure 11:
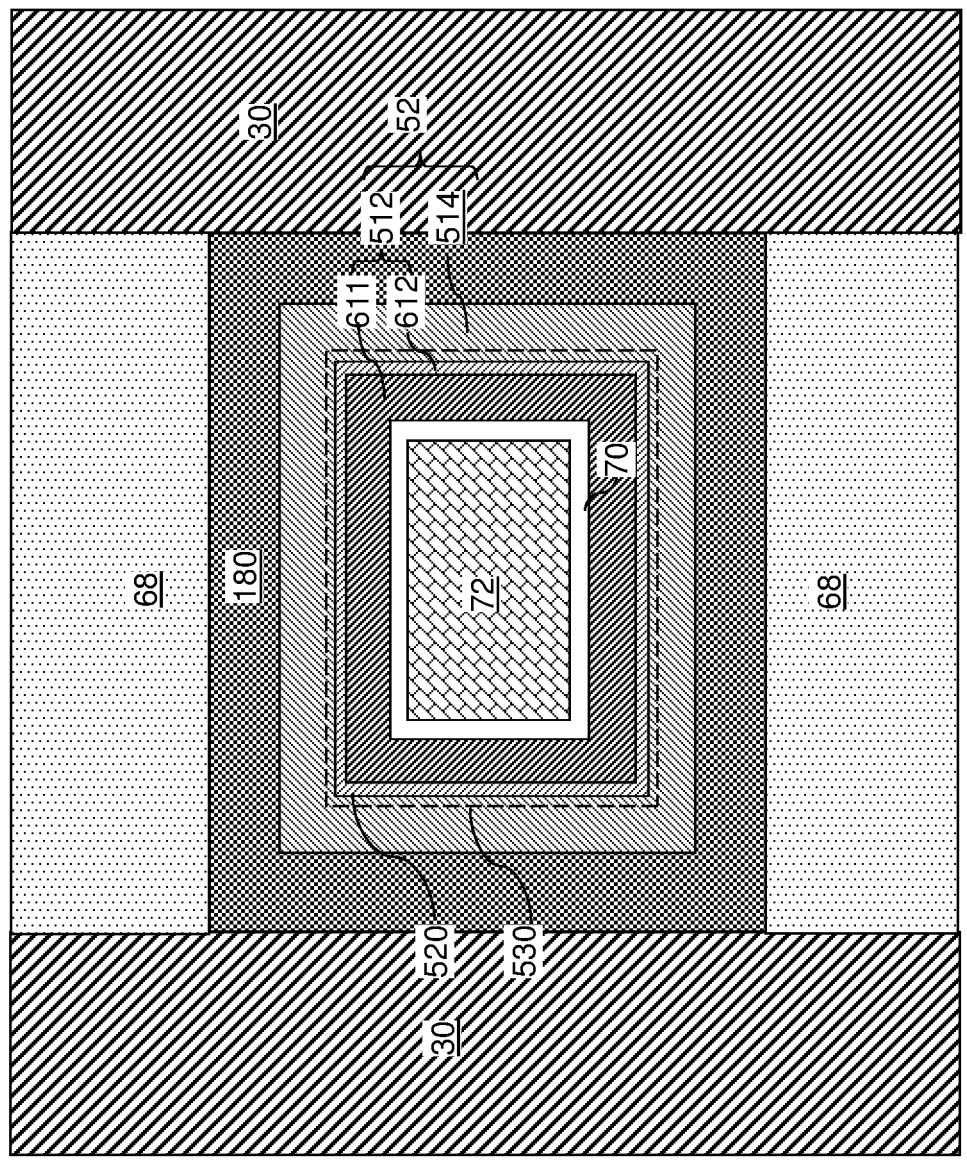
FIG. 11 is a horizontal cross-sectional view of a semiconductor local bit line of the first exemplary structure in a second configuration according to the first embodiment of the present disclosure.
Figure 12:
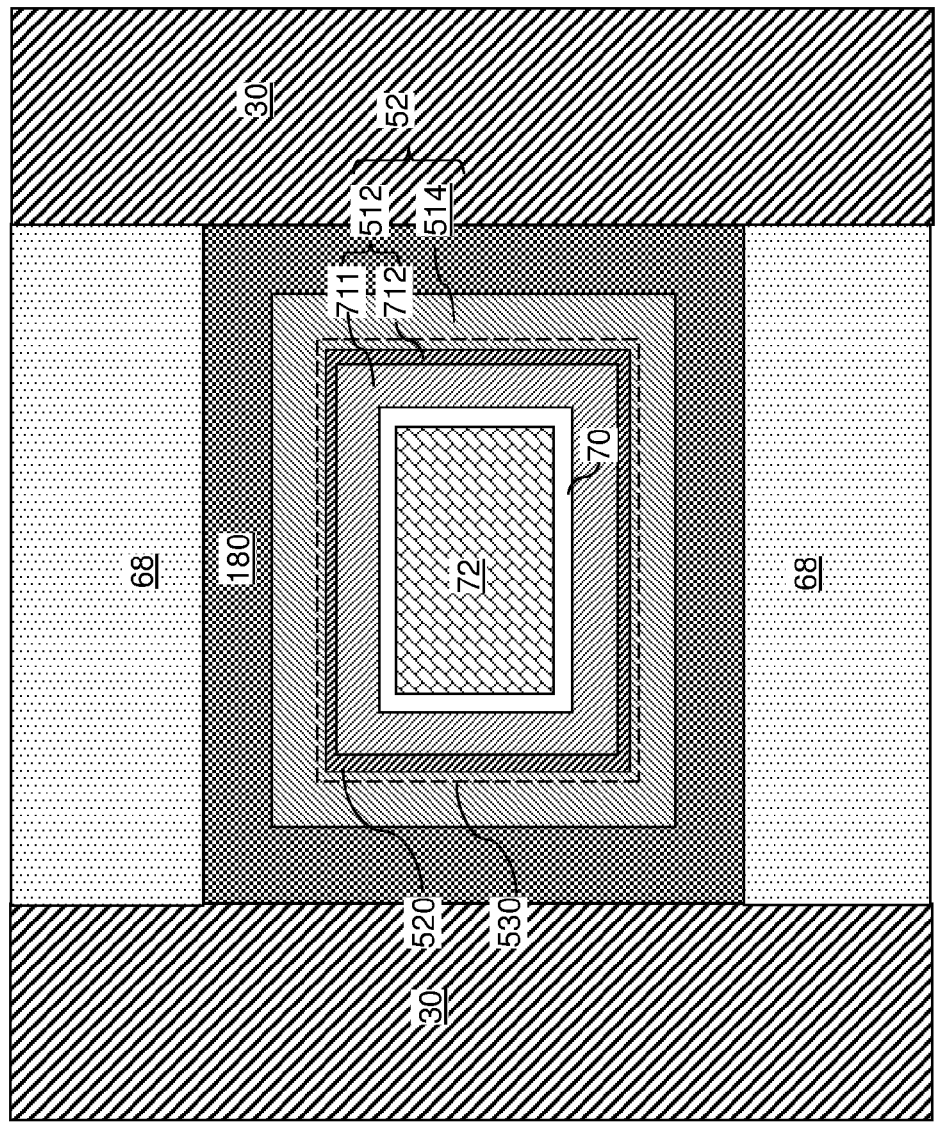
FIG. 12 is a horizontal cross-sectional view of a semiconductor local bit line of the first exemplary structure in a third configuration according to the first embodiment of the present disclosure.
Figure 13A:
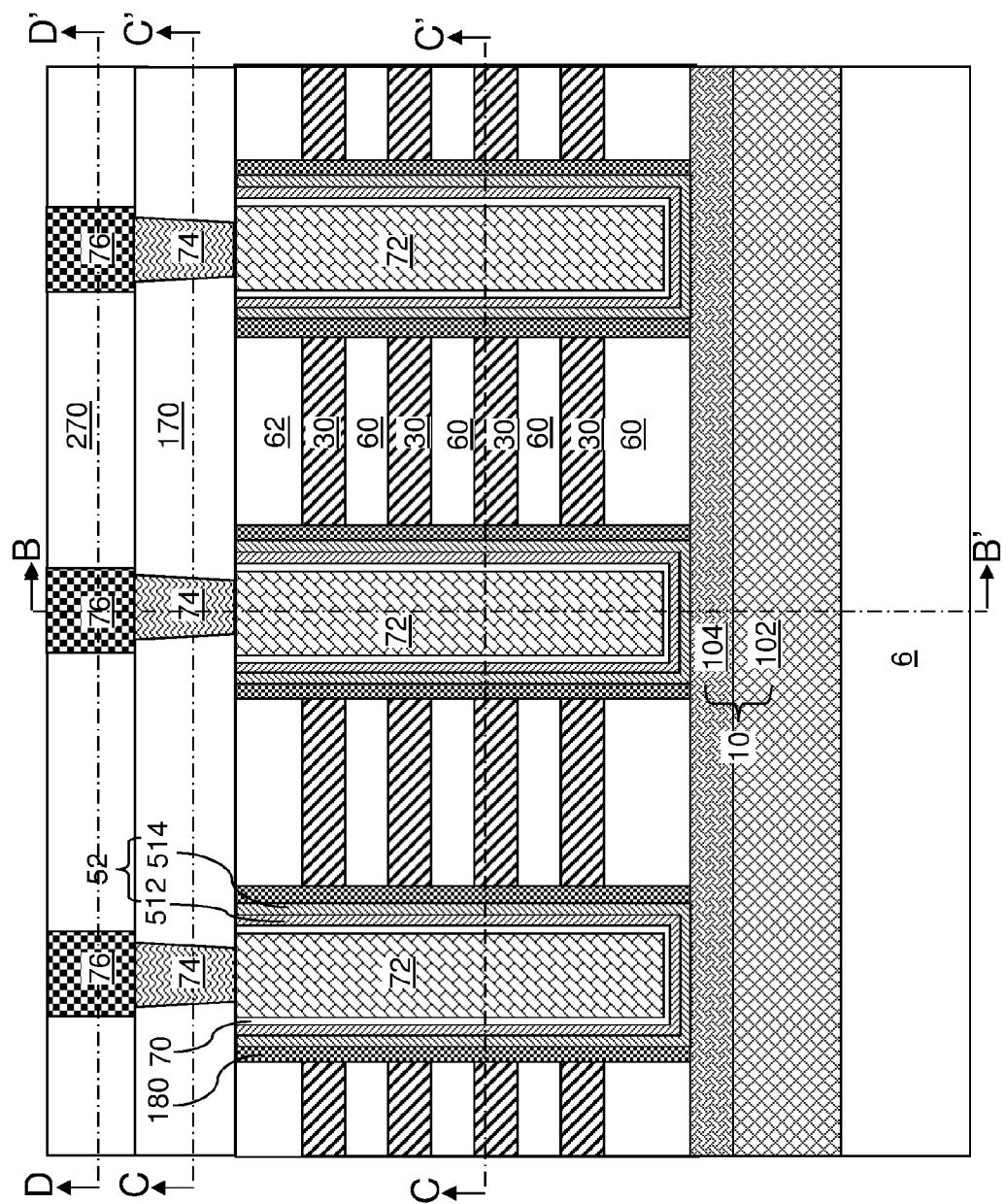
FIG. 13A is a first vertical cross-sectional view of the first exemplary structure after formation of gate contact via structures and global gate lines according to the first embodiment of the present disclosure.
Figure 13B:
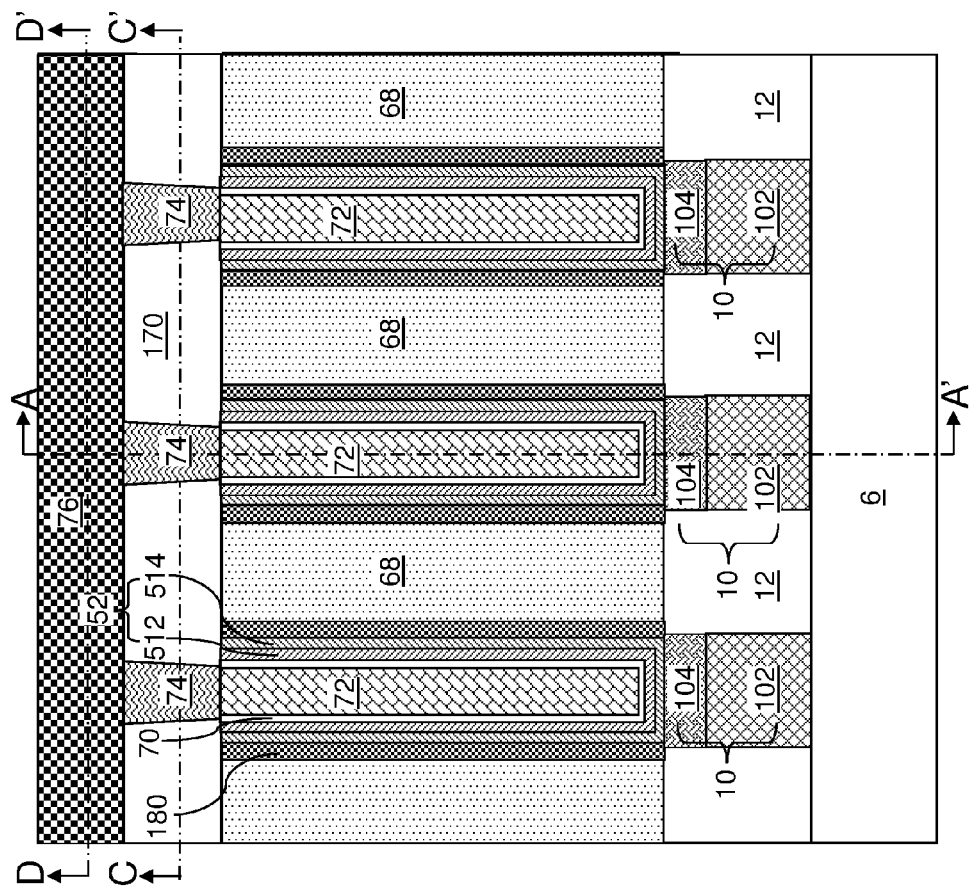
FIG. 13B is a second vertical cross-sectional view of the first exemplary structure of FIG. 13A along the vertical plane B-B'.
Figure 13C:
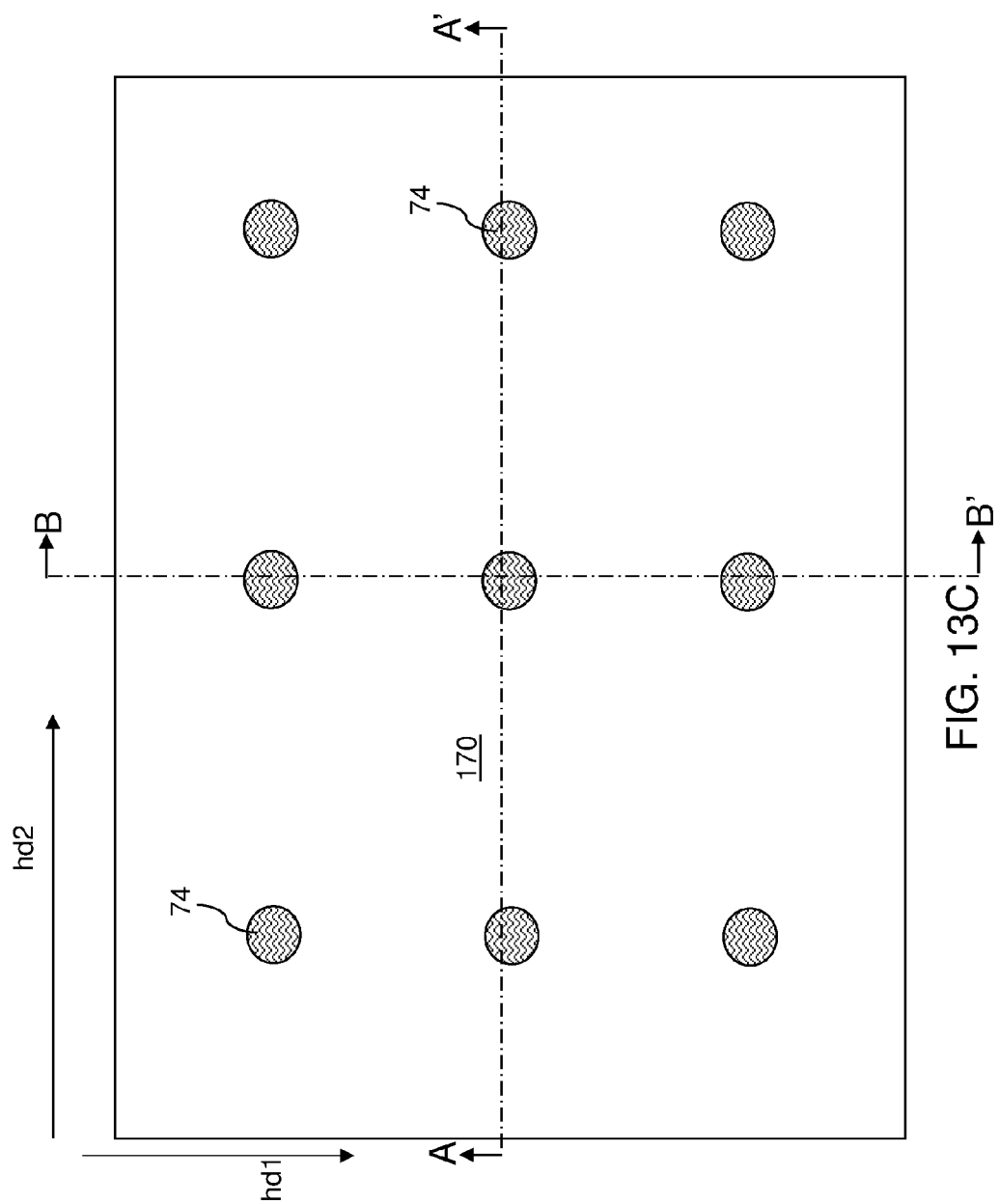
FIG. 13C is a horizontal cross-sectional view of the first exemplary structure of FIGS. 13A and 13B along the horizontal plane C-C'.

FIG. 10 shows a first configuration for the semiconductor local bit lines 52 of the first exemplary structure. FIG. 11 shows a second configuration for the semiconductor local bit lines 52 of the first exemplary structure. FIG. 12 shows a third configuration for the semiconductor local bit lines 52 of the first exemplary structure.

In each of the first, second, third, and alternative configurations, each of the semiconductor local bit lines 52 has a conduction band having a minimum at, or in proximity to, the interface 520 between the outer semiconductor material layer 512 and the inner semiconductor material layer 514 to form a quantum well. A two-dimensional heterojunction between two different semiconductor materials of the outer and inner semiconductor material layers (514, 512) is present at the interface. The two-dimensional heterojunction (which coincides with the interface 520) vertically extends with a substantially uniform horizontal cross-sectional shape along the vertical cross-sectional shape. As used herein, a "substantially uniform horizontal cross-sectional shape" refers to a horizontal cross-sectional shape in which each radial distance does not change by more than 20% of the average radial distance for any given azimuthal direction around a vertical axis passing through the geometrical center of the horizontal cross-sectional shape.

The inner semiconductor material layer 512 comprises an inner III-V compound semiconductor material, and the outer semiconductor material layer 514 comprises an outer III-V compound semiconductor material different from the inner III-V compound semiconductor material.

In the first configuration illustrated in FIG. 10, the inner III-V compound semiconductor material can be undoped, and the outer III-V compound semiconductor material is undoped. As used herein, an "undoped" compound semiconductor material refers to a compound semiconductor material which is not intentionally doped with group II, group IV or group IV elements from the Periodic Table. As such, the net doping level of an undoped compound semiconductor material can be less than $1.0\times10^{16}/cm^3$, and may be less than $1.0\times10^{15}/cm^3$.

In the second configuration illustrated in FIG. 11, an inner portion 611 of the inner III-V compound semiconductor material of the inner semiconductor material layer 512 is n-doped, an outer portion 612 of the inner III-V compound semiconductor material of the inner semiconductor material layer 512 is undoped, and the outer III-V compound semiconductor material of the outer semiconductor material layer 514 is undoped. In one embodiment, the net doping level of the inner portion of the inner semiconductor material layer 512 can be in a range from $1.0\times10^{16}/cm^3$ to $1.0\times10^{20}/cm^3$, such as from $1.0\times10^{17}/cm^3$ to $1.0\times10^{19}/cm^3$, although lesser and greater dopant concentrations can also be employed.

In the third configuration illustrated in FIG. 12, an inner portion 711 of the inner III-V compound semiconductor material of the inner semiconductor material layer 512 can be undoped, an outer portion 712 of the inner III-V compound semiconductor material of the inner semiconductor material layer 512 can be n-type delta doped, and the outer III-V compound semiconductor material of the outer semiconductor material layer 514 can be undoped. In one embodiment, the net doping level of the outer portion 712 of the inner semiconductor material layer 512 can be in a range from $5.0\times10^{17}/cm^3$ to $5.0\times10^{20}/cm^3$, such as from $5.0\times10^{18}/cm^3$ to $5.0\times10^{19}/cm^3$, although lesser and greater dopant concentrations can also be employed.

In an alternative configuration, an inner portion of the inner III-V compound semiconductor material of the inner semiconductor material layer 512 can be undoped, an intermediate portion of the inner III-V compound semiconductor material of the inner semiconductor material layer 512 can be n-type delta doped, an outer portion of the inner III-V compound semiconductor material of the inner semiconductor material layer 512 can be undoped and the outer III-V compound semiconductor material of the outer semiconductor material layer 514 can be undoped. In other words, the n-doped region within the inner semiconductor material layer 512 can be spaced from sidewalls of the inner semiconductor material layer 512.

In each configuration, the materials of the outer and inner semiconductor material layers are selected such that the band gap of the inner semiconductor material layer 512 is greater than the band gap of the outer semiconductor material layer 514. In one embodiment, the inner III-V compound semiconductor material comprises a material selected from AlGaAs, GaAs, InAlAs, and InGaAlAs, and the outer III-V compound semiconductor material comprises a material selected from GaAs, InGaAs, InP, InAs, and InGaAsP.

In each configuration, the narrower band gap of the outer III-V compound semiconductor material than the inner III-V compound semiconductor material can provide a configuration in which the conduction band of the semiconductor local bit line 52 has a minimum at, or in proximity to, the interface 520 between the inner semiconductor material layer 512 and the outer semiconductor material layer 514. The minimum in the conduction band can be a local minimum. In this case, electrons can be trapped at, or around, the local minimum of the conduction band, which follows the general contour of the periphery of each bit line cavity 47. Two-dimensional electron gas in vertical planes 530 for electrical current conduction can be formed at, or in proximity to, the interface 520 between the inner semiconductor material layer 512 and the outer semiconductor material layer 514 as illustrated in FIGS. 10-12. The two-dimensional electron gas for electrical current conduction can be formed within the outer semiconductor material layer 514 and/or at the interface (or in the proximity to the interface) between the inner and the outer semiconductor material layers.

The two-dimensional electron gas can be located at the local minimum of the conduction band at, or in proximity to, the interface 520 between the inner semiconductor material layer 512 and the outer semiconductor material layer 514. The two-dimensional electron gas can be a cylindrical confinement electron gas. As used herein, "cylindrical confinement" refers to a two-dimensional confinement in which a global topology of the two-dimensional space is homeomorphic to an entire set of sidewall surfaces of a cylinder. As used herein, a "cylinder" refers to an object that is obtained by vertical translation of any two-dimensional shape defined by a closed periphery. As used herein, "cylindrical confinement electron gas" refers to electron gas in cylindrical confinement. Electron current can flow vertically with high mobility in the cylindrical confinement electron gas. Thus, a quantum well is formed adjacent to the interface 520 in the heterostructure channel. Thus, quantum confinement (e.g., quantization) of electrons occurs in the channel. In one embodiment, the cylindrical confinement can be in a configuration that includes four vertical planes that are adjoined among one another to provide a rectangular horizontal cross-sectional area. A horizontal cross-sectional shape of the region of cylindrical confinement may be concentric, elliptical, rectangular, or otherwise polygonal or of a closed curvilinear shape.

Referring to FIGS. 13A-13D, a contact level dielectric layer 170 can be formed over the insulating cap layer 62, the semiconductor local bit lines 52, and the gate electrodes 72. The contact level dielectric layer 170 includes a dielectric material such as silicon oxide, silicon nitride, organosilicate glass, a dielectric metal oxide, or a combination thereof. Gate contact via structures 74 can be formed as a two-dimensional array on the gate electrodes 72. The gate electrodes 72 and the gate contact via structures 74 can be in a configuration of a two-dimensional periodic array having periodicity along two independent horizontal directions (which may be perpendicular to each other). The gate contact via structures 74 includes a conductive material (such as a metallic material or a doped semiconductor material). Alternatively, the gate contact via structures 74 can be a semiconductor channel of a vertical select thin film transistor (VSTFT). In this embodiment, one or more control gate electrodes and gate dielectric layers are located adjacent to the sides of the VSTFT channel Doped source and drain regions are located at top and bottom ends of the VSTFT channel.

A line level dielectric layer 270 can be formed over the contact level dielectric layer 170. Global gate lines 76 extending along the first horizontal direction hd1 can be formed in the line level dielectric layer 270. Each of the global gate lines 76 contacts top surfaces of a set of gate contact via structures 74 that are arranged along the first horizontal direction hd1.

By accessing a global bit line 10 and a global gate line 76, a selected semiconductor vertical bit line 52 can be activated. Each resistive memory element with the resistive memory material layer 82 can be addressed by activating a respective word line that is adjacent to the activated semiconductor vertical bit line 52. The word lines are electrically conductive lines that may be provided as the spacer material layers 30, or, in case the spacer material layers 30 are provided as sacrificial material layers, provided by replacing the sacrificial material layers with electrically conductive layers.

Figure 14A:
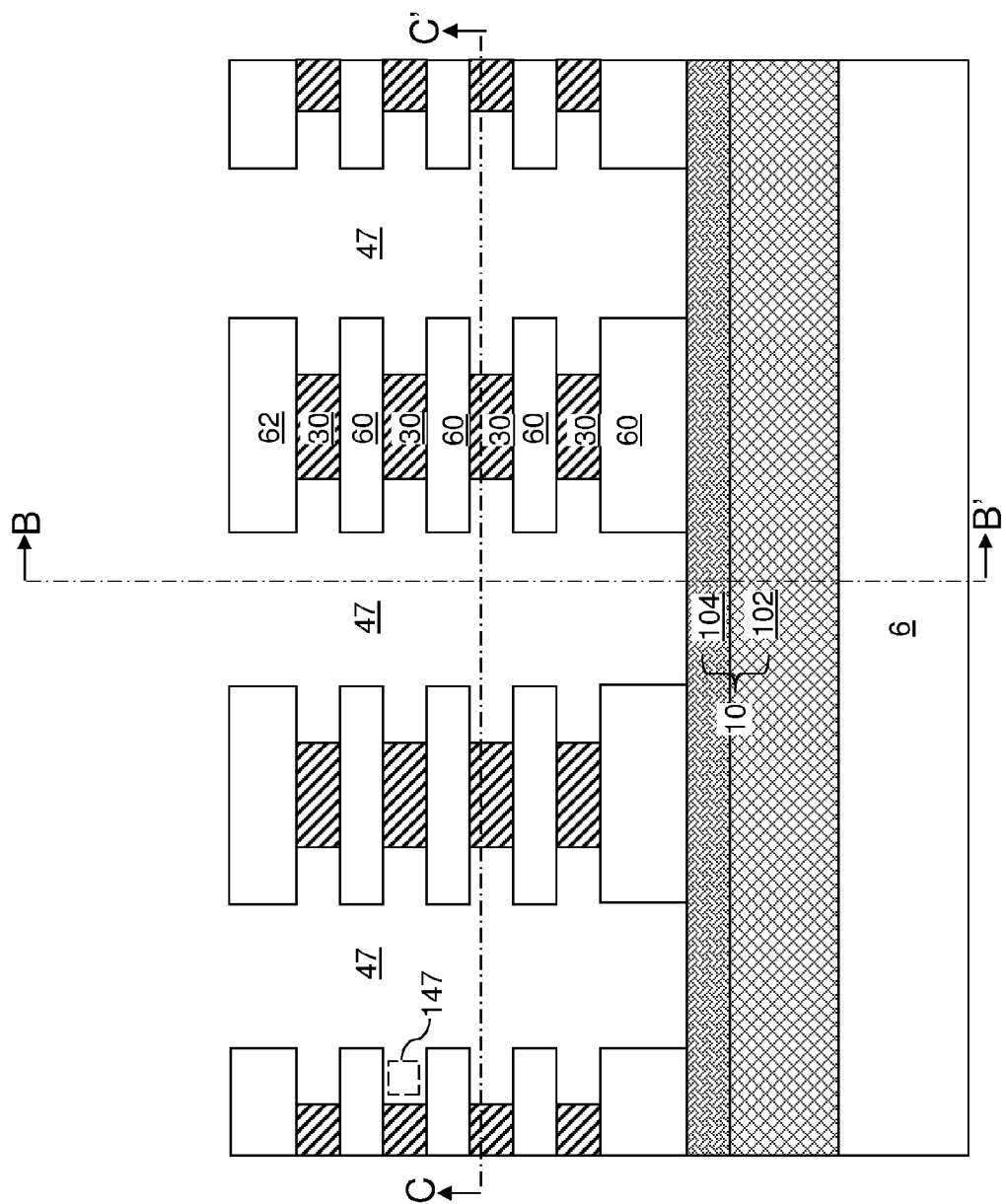
FIG. 14A is a first vertical cross-sectional view of a second exemplary structure after formation of lateral recesses at levels of the spacer material layers according to a second embodiment of the present disclosure.
Figure 14B:
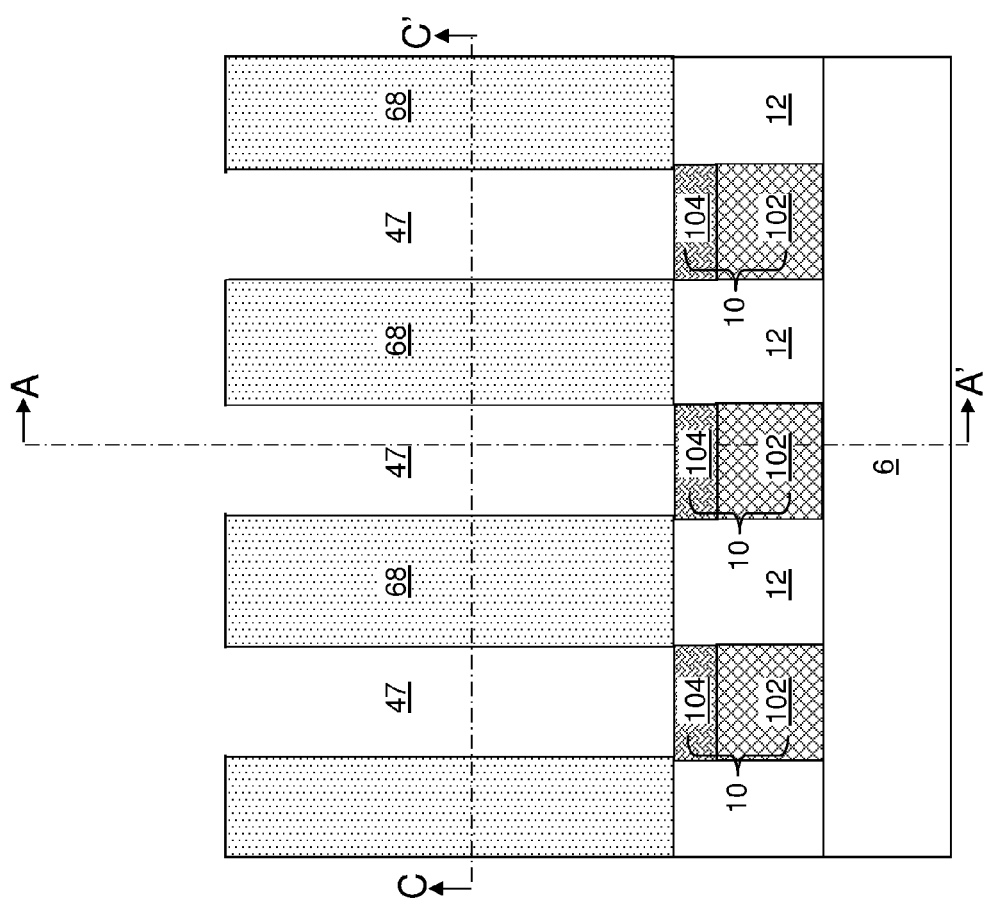
FIG. 14B is a second vertical cross-sectional view of the second exemplary structure of FIG. 14A along the vertical plane B-B'.
Figure 14C:
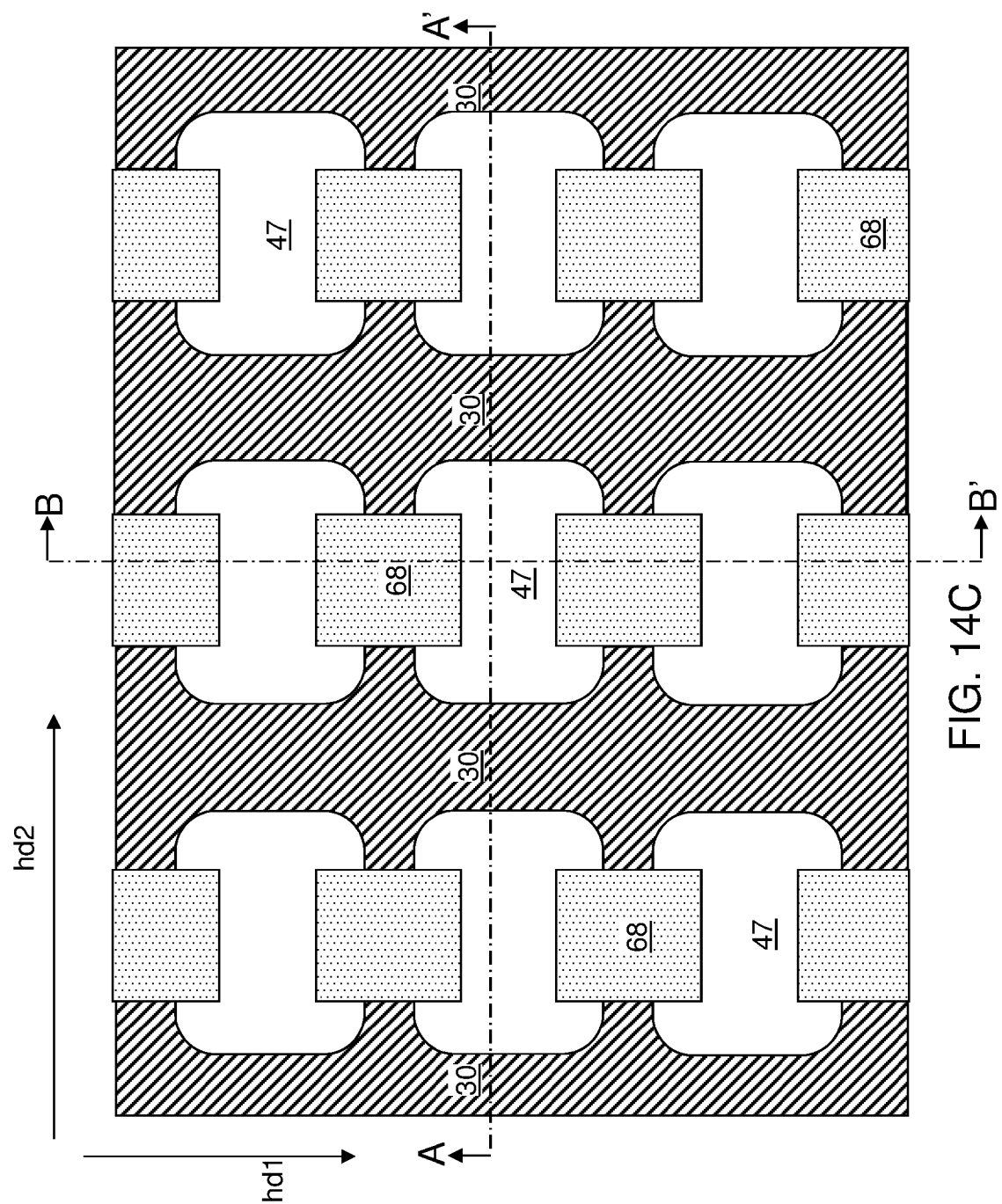
FIG. 14C is a horizontal cross-sectional view of the second exemplary structure of FIGS. 14A and 14B along the horizontal plane C-C'.

Referring to FIGS. 14A-14C, a second exemplary structure according to a second embodiment of the present disclosure can be derived from the first exemplary structure of FIGS. 4A-4C by laterally recessing sidewalls of the spacer material layers 30 with respect to sidewalls of the insulating layers 60. Lateral recesses 147 are formed at each level of the spacer material layers 30 around each bit line cavity (e.g., trench) 47. Specifically, an isotropic etchant that etches the material of the spacer material layers 30 with respect to the material of the insulating layers 60 can be provided into each bit line cavity 47 to partially remove surface portions of the spacer material layers 30 from around each bit line cavity 47. In an illustrative example, if the spacer material layer 30 include a metallic material such as tungsten and if the insulating layers 60 include silicon oxide, aqua regia or a mixture of hydrofluoric acid and nitric acid can be employed to etch the spacer material layer 30 selective to the insulating layers 60. The lateral recesses 147 extend along the first horizontal direction, and can include two concave end portions that adjoin a respective separator pillar structure 68. The lateral etch distance, i.e., the lateral dimension of each lateral recess 147, can be in a range from 10 nm to 200 nm, although lesser and greater lateral etch distances can also be employed. Two sets of vertically overlapping lateral recesses 147 can be adjoined to each bit line cavity 47. Each spacer material layer 30 can have a laterally modulated width due to formation of the lateral recesses. The laterally modulated width of each spacer material layer 30 modulates along the first horizontal direction, and may be periodic.

Figure 15B:
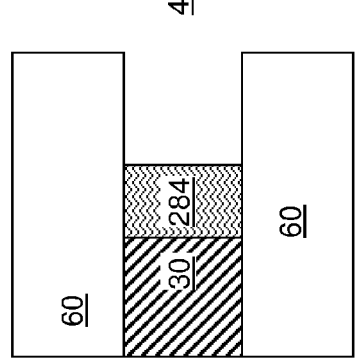
FIGS. 15A-15D are sequential vertical cross-sectional views of a lateral recess during formation of a memory-material-containing structure according to the second embodiment of the present disclosure.
Figure 15D:
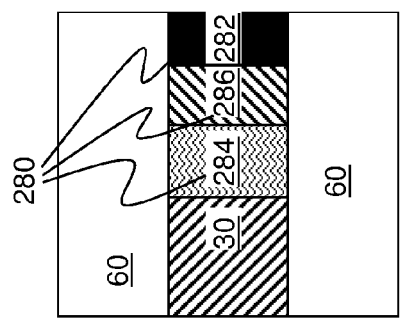
Figure 15A:
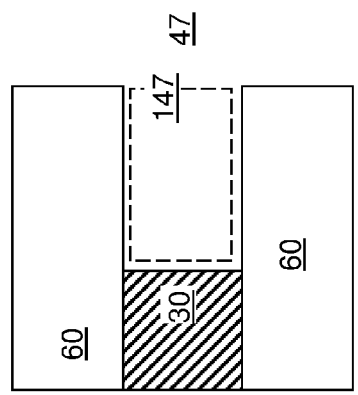

FIGS. 15A-15D are sequential vertical cross-sectional views of a lateral recess 147 during formation of a memory-material-containing structure 280 according to the second embodiment of the present disclosure. FIG. 15A illustrates a lateral recess 147 as formed at the processing steps of FIGS. 14A-14C.

Referring to FIG. 15B, a barrier material portion 284 can be formed on the sidewall of a spacer material layer 30 within each lateral recess 147. The barrier material portion 284 can include any of the materials that can be employed for the barrier material layer 84 of the first embodiment. The barrier material portion 284 can be formed, for example, by a conformal deposition of a barrier material layer to fill the lateral recess 147, and by a subsequent lateral etch that removes the portions of the deposited barrier material layer from within the bit line cavity 47 and from a proximal portion of each lateral recess 147, i.e., from the portion of each lateral recess 147 that is proximal to, and adjoined to, the bit line cavity 47.

Figure 15C:
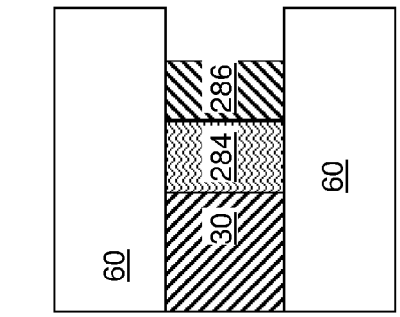

Referring to FIG. 15C, a conductive material portion 286 can be formed on each barrier material portion 284. The conductive material portion 286 can include any of the materials that can be employed for the conductive material layer 86 of the first embodiment. The conductive material portion 286 can be formed, for example, by a conformal deposition of a conductive material to fill the remaining volume of the lateral recess, and by a subsequent lateral etch that removes the portions of the deposited conductive material layer from within a proximal portion of the lateral recess 147. Each pair of a barrier material portion 284 and a conductive material portion 286 constitutes a selector element (284, 286). Thus, each selector element (284, 286) is formed as a combination of a discrete barrier material portion 284 and a discrete conductive material portion 286 at a level of a respective spacer material layer 30.

While a specific embodiment of the selector element (284, 286) is employed herein for description of the present disclosure, any type of selector element that can provide non-linear switching (turning on and turning off) can be employed in lieu of the described selector element (284, 286) herein. Alternatively each selector element (284, 286) may comprise a diode having a p-type semiconductor portion 284 and an n-type semiconductor portion 286. Further, it is understood that the positions of the conductive material portion 286 and the barrier material portion 284 can be exchanged.

Referring to FIG. 15D, a resistive memory element 282 can be formed on each selector element (284, 286). The resistive memory element 282 can include any of the materials that can be employed in the resistive memory material layer 82 of the first embodiment. The resistive memory element 282 can be formed, for example, by filling the remaining volume of the lateral recess 147 with a resistive memory material, and by removing portions of the resistive memory material that are collaterally deposited at peripheral portions of the bit line cavity 47, for example, by an anisotropic etch or an isotropic etch.

Figure 16A:
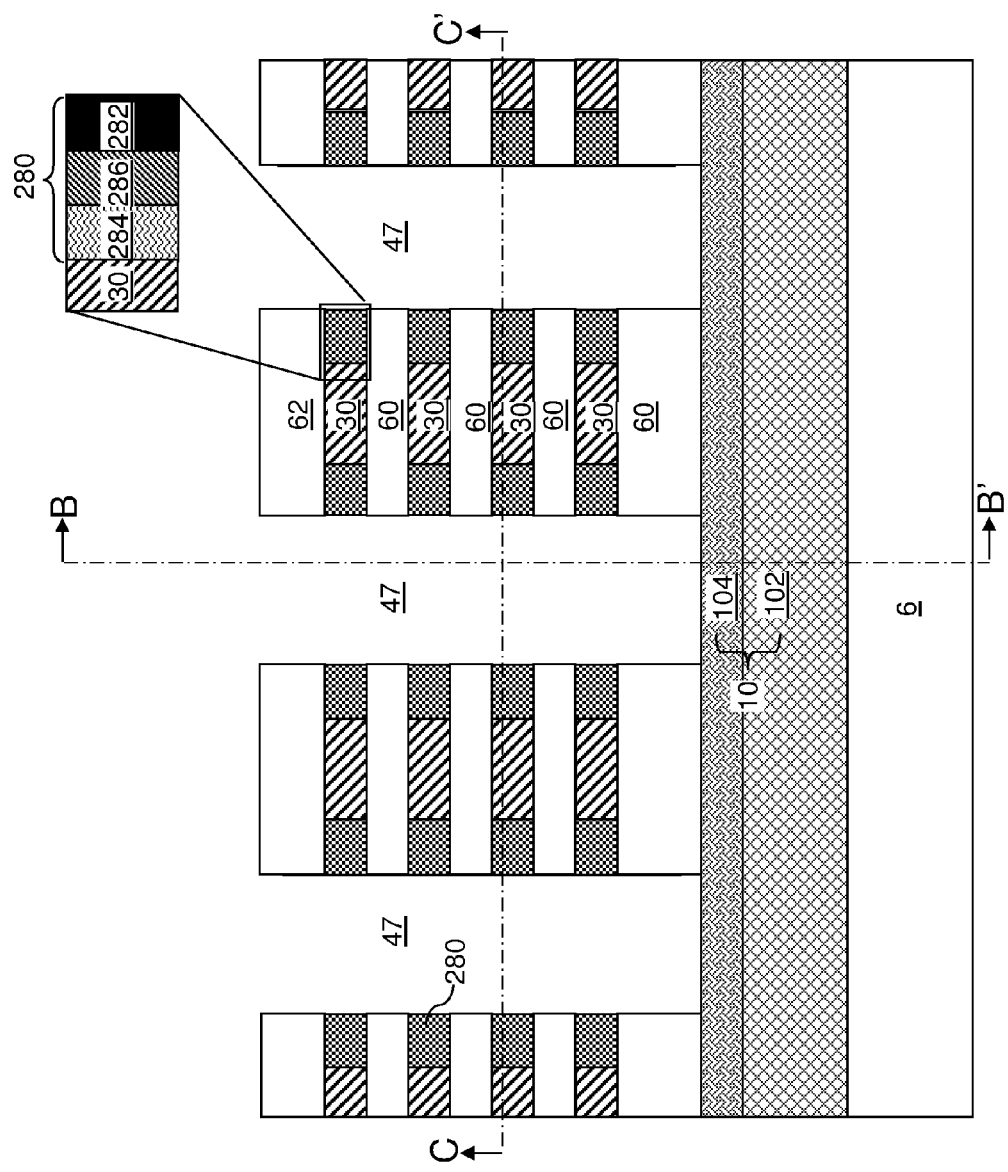
FIG. 16A is a first vertical cross-sectional view of a second exemplary structure after formation of memory-material-containing structures according to a second embodiment of the present disclosure.
Figure 16B:
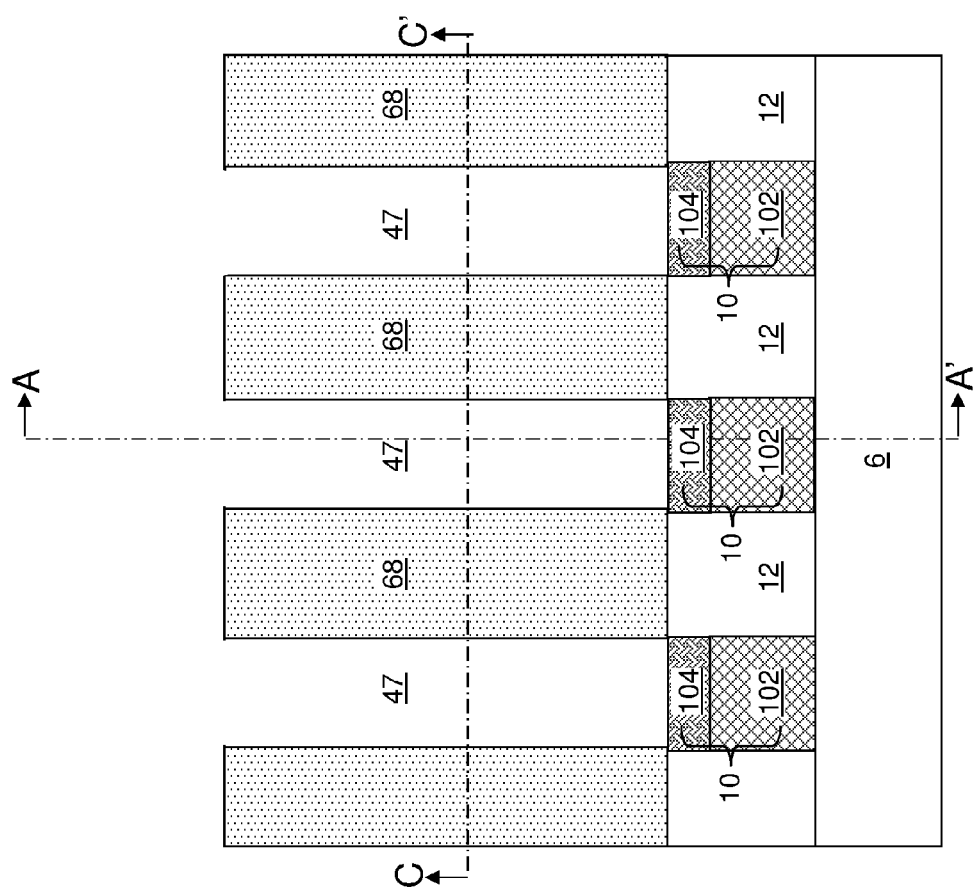
FIG. 16B is a second vertical cross-sectional view of the second exemplary structure of FIG. 16A along the vertical plane B-B'.
Figure 16C:
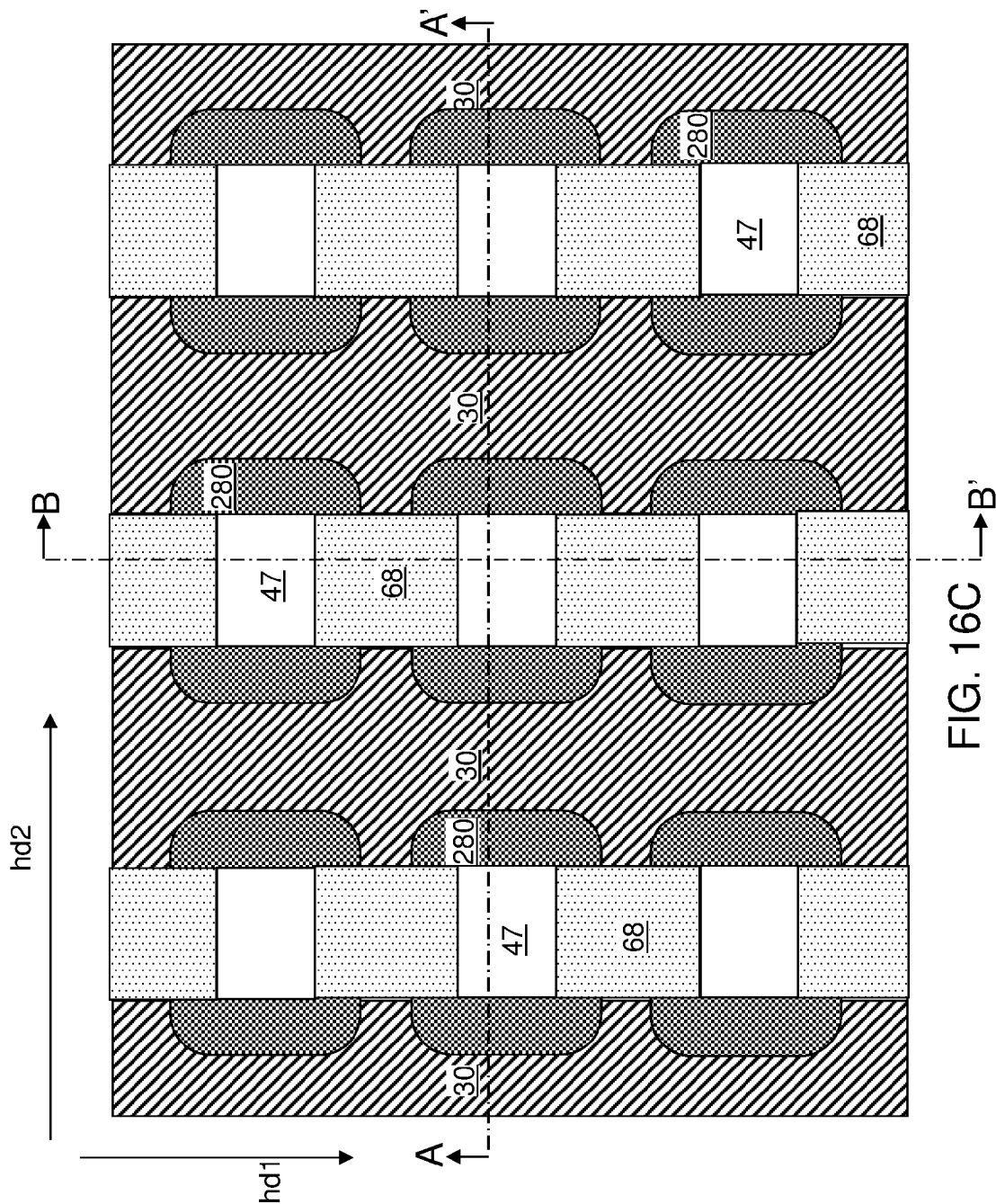
FIG. 16C is a horizontal cross-sectional view of the second exemplary structure of FIGS. 16A and 16B along the horizontal plane C-C' according to the second embodiment of the present disclosure.

Each adjoining set of a selector element (284, 286) and a resistive memory element 282 constitutes a discrete memory-material-containing structure 280. Each discrete memory-material-containing structure 280 is a memory-material-containing structure in which selector elements are embodied as a discrete selector element (284, 286), and resistive memory elements are embodied as discrete resistive memory elements 282. FIG. 16A-16C illustrate the second exemplary structure after formation of the discrete memory-material-containing structures 280. Each set of discrete memory-material-containing structures 280 overlying, or underlying, one another constitutes a vertical stack of discrete memory-material-containing structures 280.

Figure 17A:
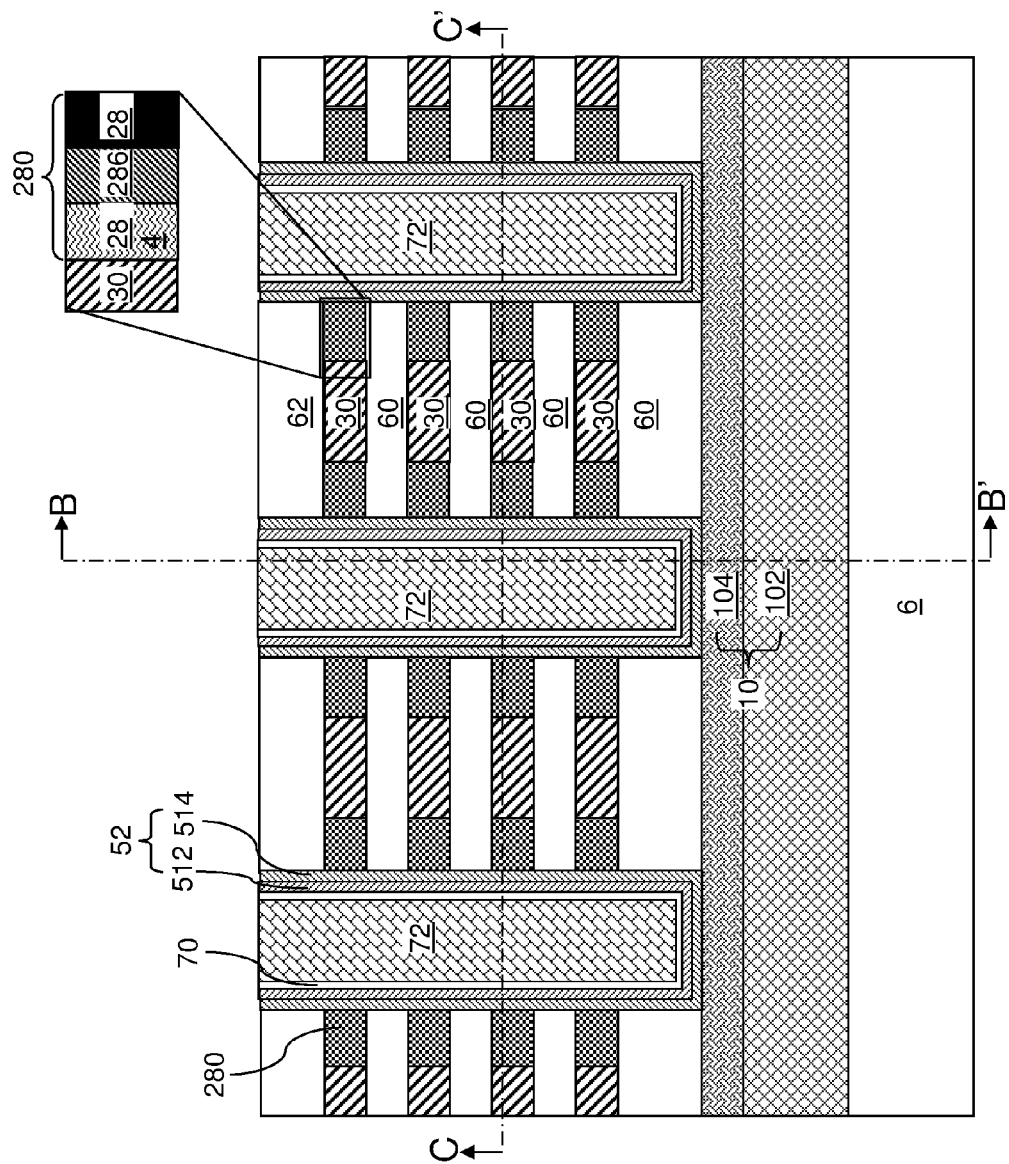
FIG. 17A is a first vertical cross-sectional view of the second exemplary structure after formation of gate dielectrics, gate electrodes, and semiconductor local bit lines by a planarization process according to the second embodiment of the present disclosure.
Figure 17B:
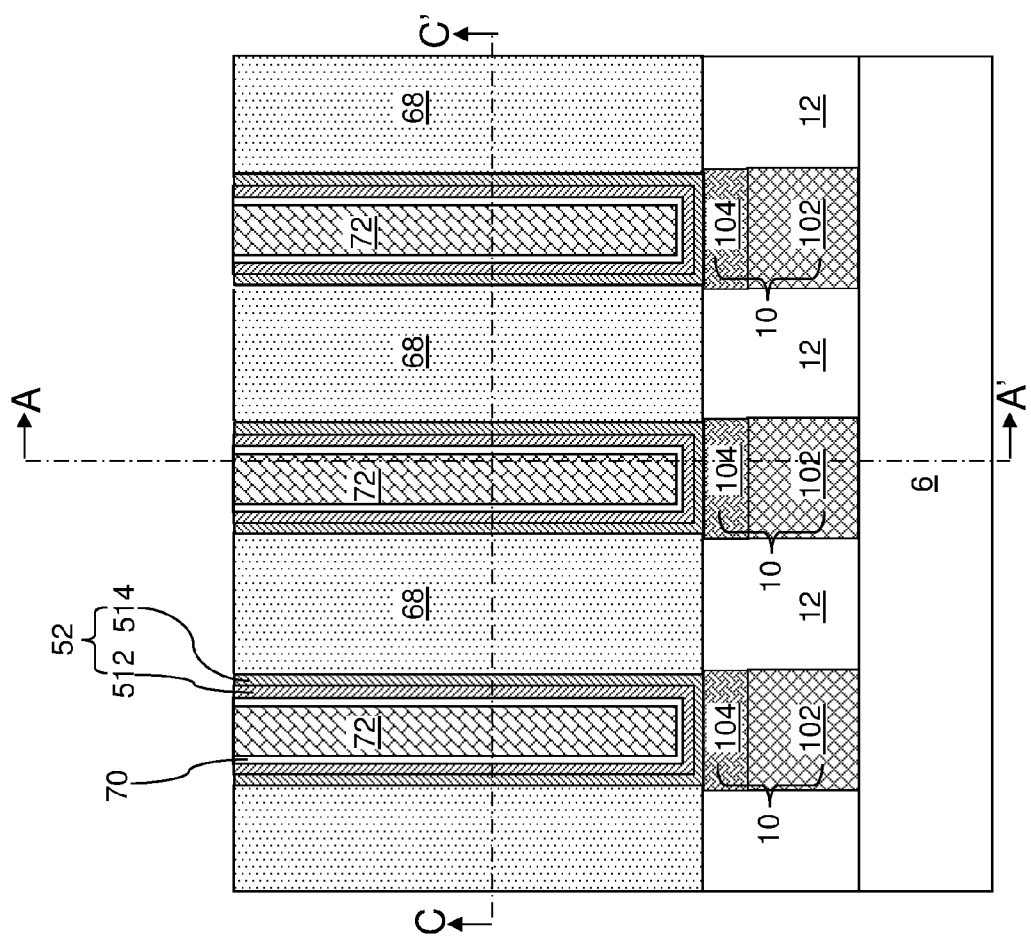
FIG. 17B is a second vertical cross-sectional view of the second exemplary structure of FIG. 17A along the vertical plane B-B'.
Figure 17C:
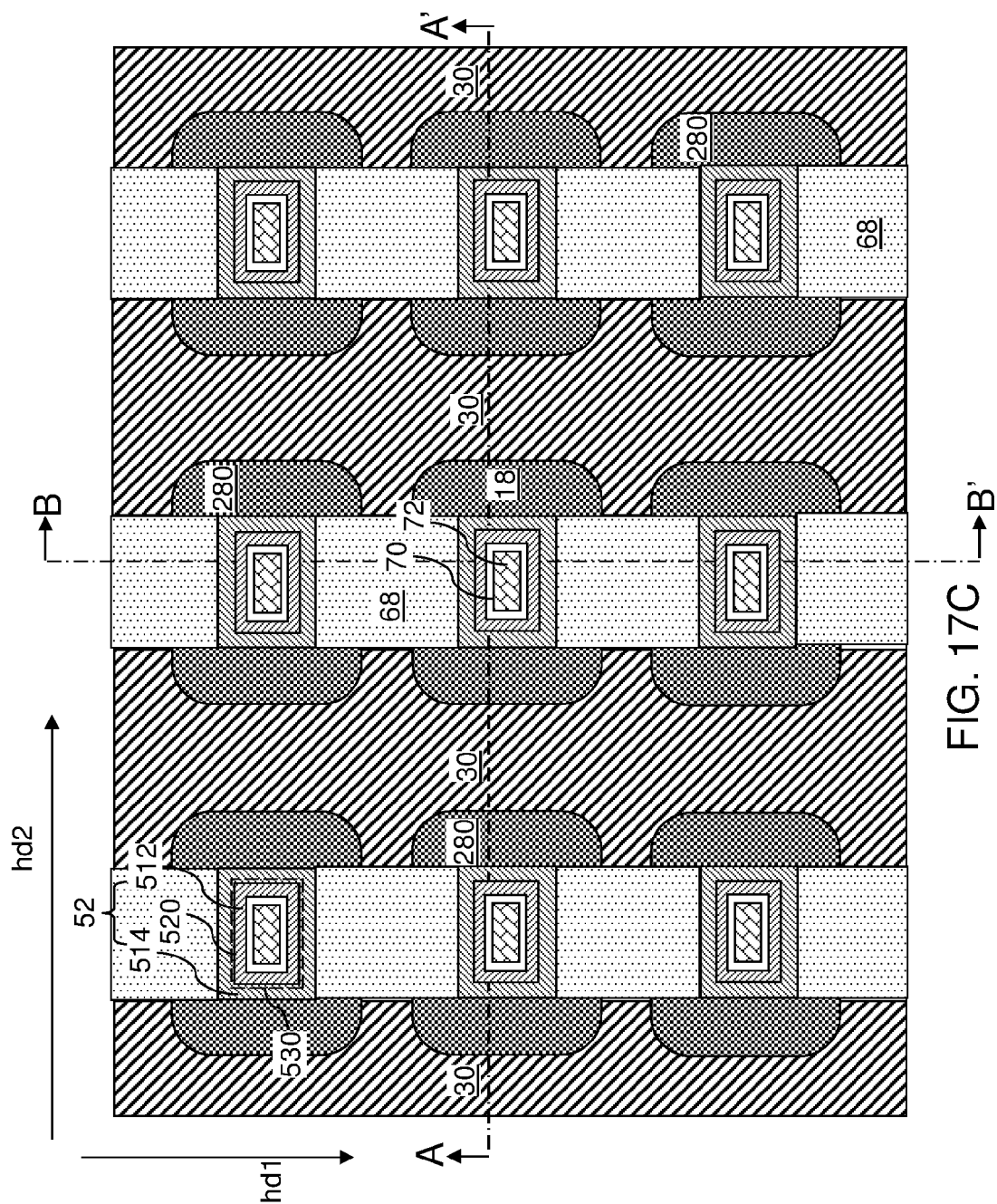
FIG. 17C is a horizontal cross-sectional view of the second exemplary structure of FIGS. 17A and 17B along the horizontal plane C-C'.
Figure 18:
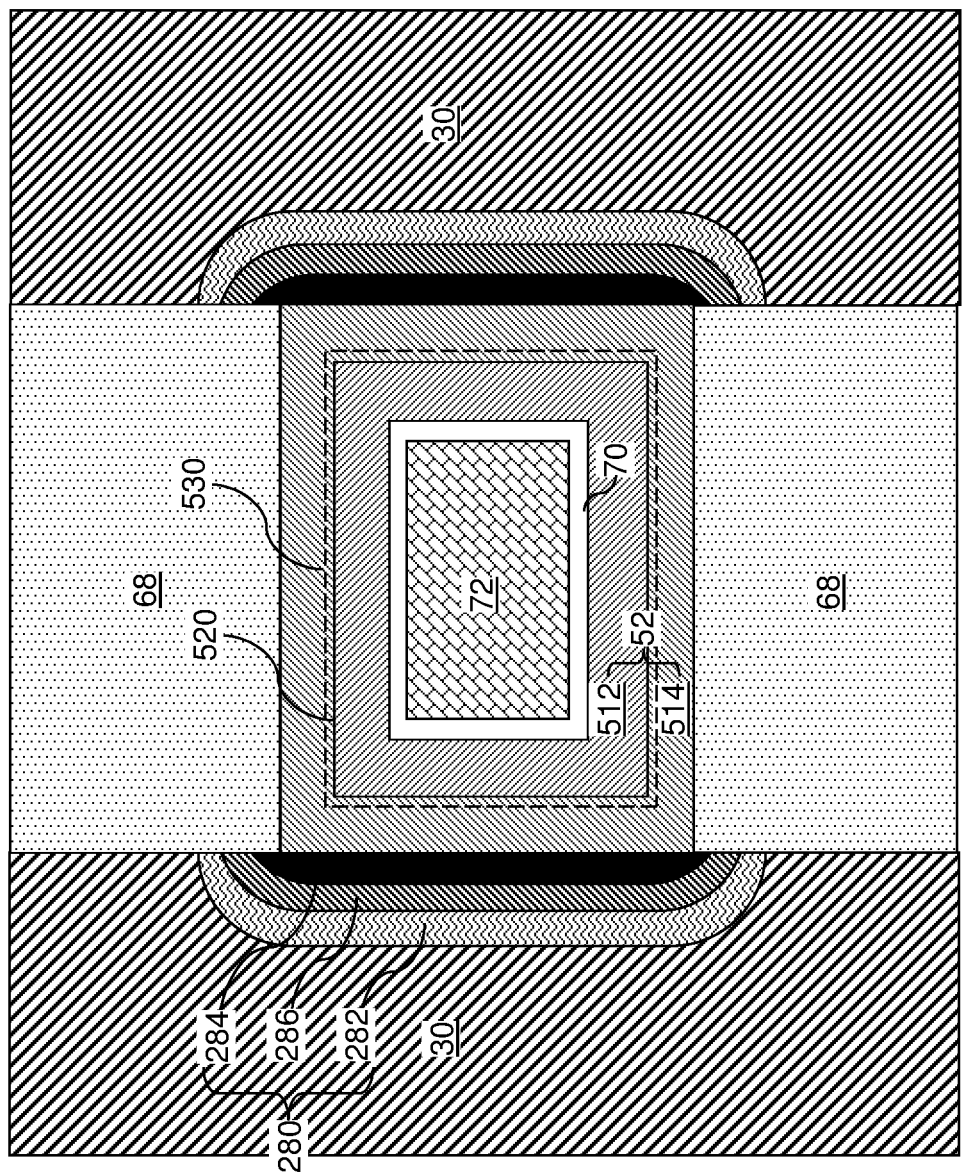
FIG. 18 is a horizontal cross-sectional view of a semiconductor local bit line of the second exemplary structure in a first configuration according to the second embodiment of the present disclosure.
Figure 19:
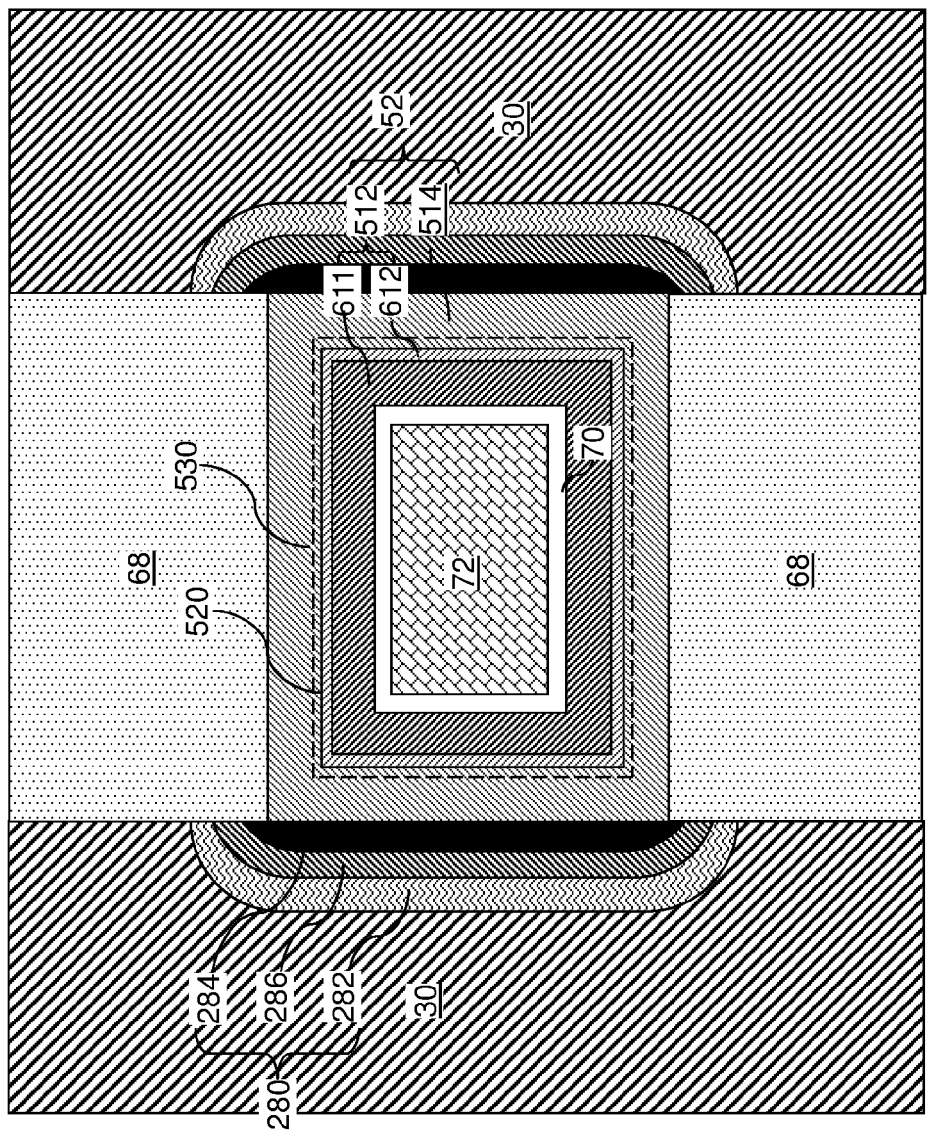
FIG. 19 is a horizontal cross-sectional view of a semiconductor local bit line of the second exemplary structure in a first configuration according to the second embodiment of the present disclosure.
Figure 20:
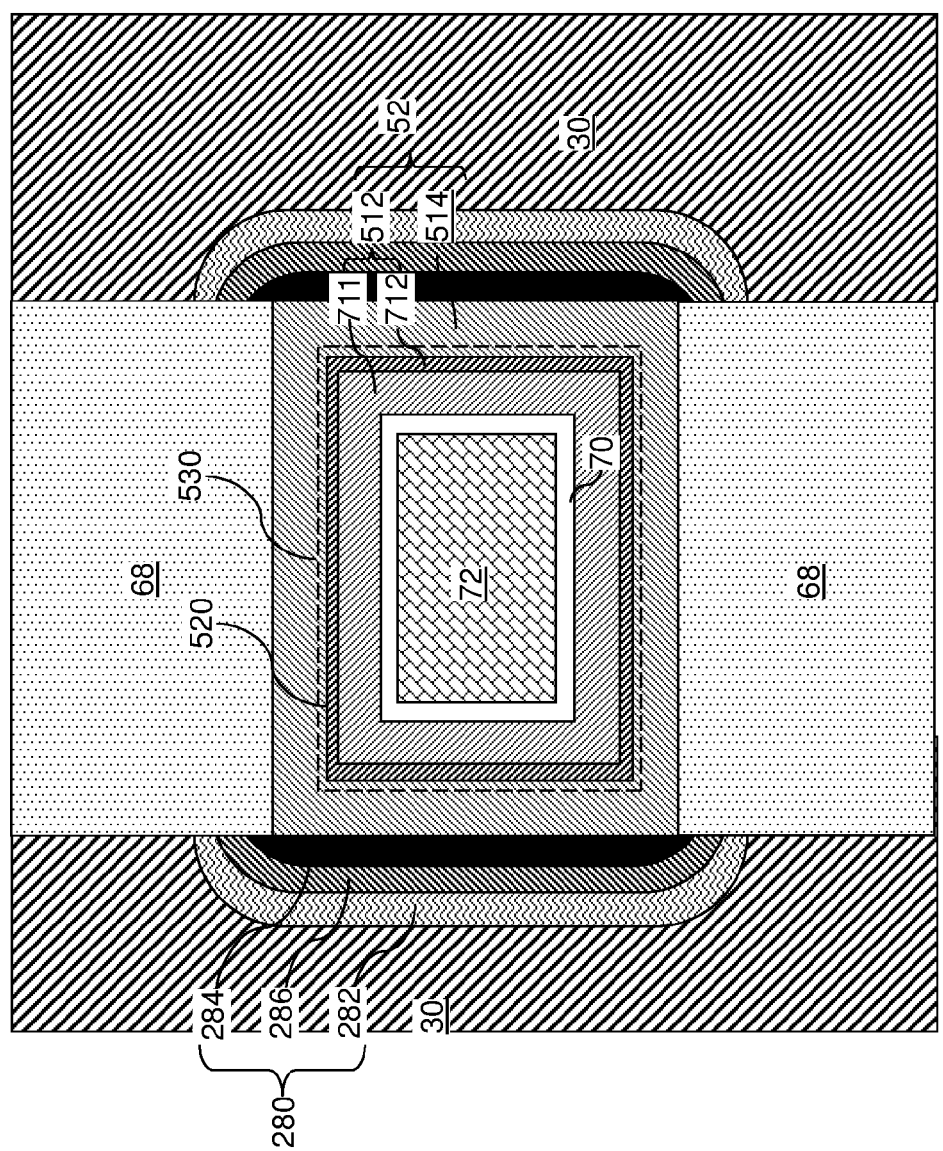
FIG. 20 is a horizontal cross-sectional view of a semiconductor local bit line of the second exemplary structure in a first configuration according to the second embodiment of the present disclosure.
Figure 21A:
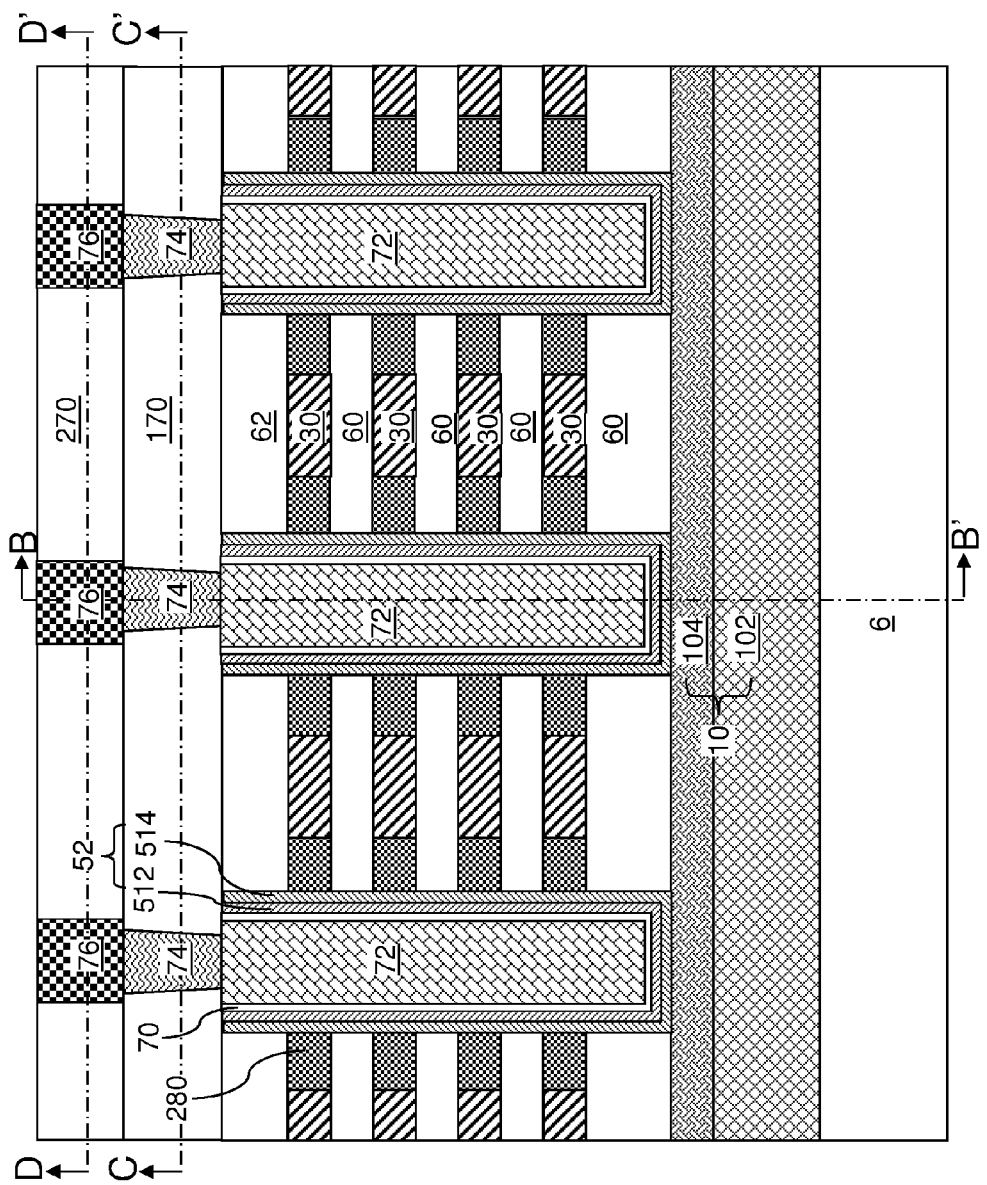
FIG. 21A is a first vertical cross-sectional view of the second exemplary structure after formation of gate contact via structures and global gate lines according to the second embodiment of the present disclosure.
Figure 21B:
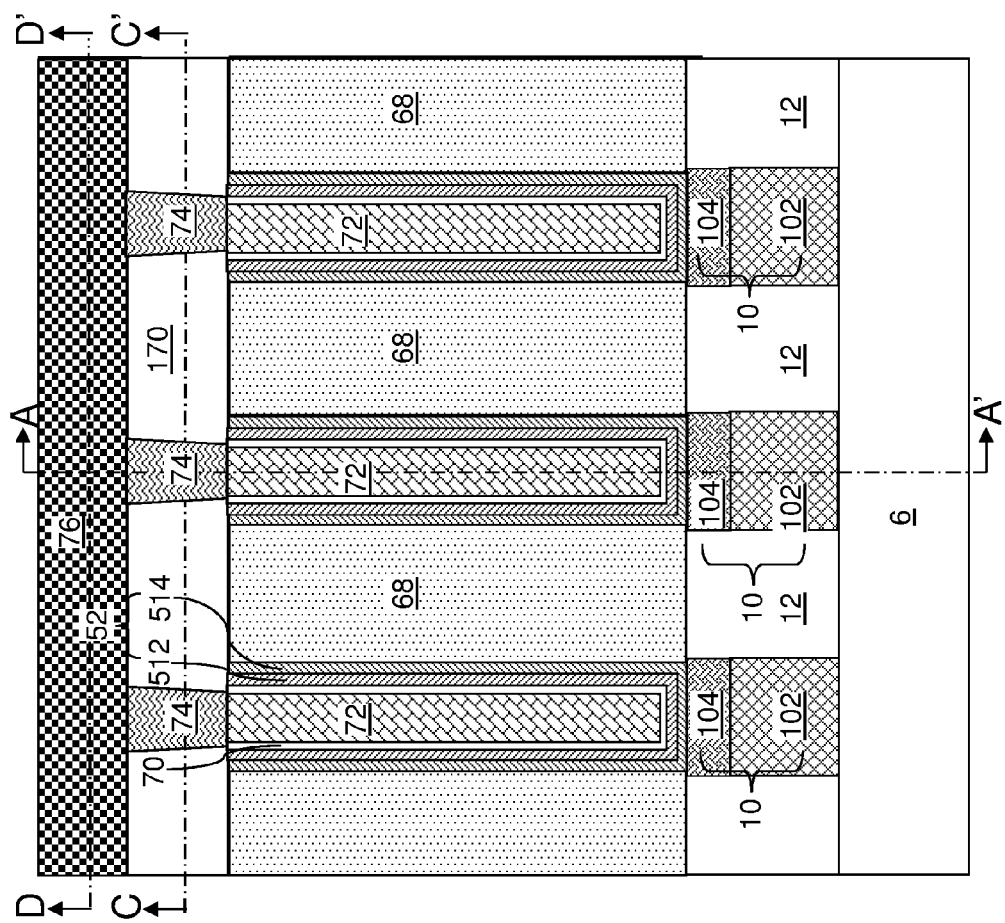
FIG. 21B is a second vertical cross-sectional view of the second exemplary structure of FIG. 21A along the vertical plane B-B'.
Figure 21C:
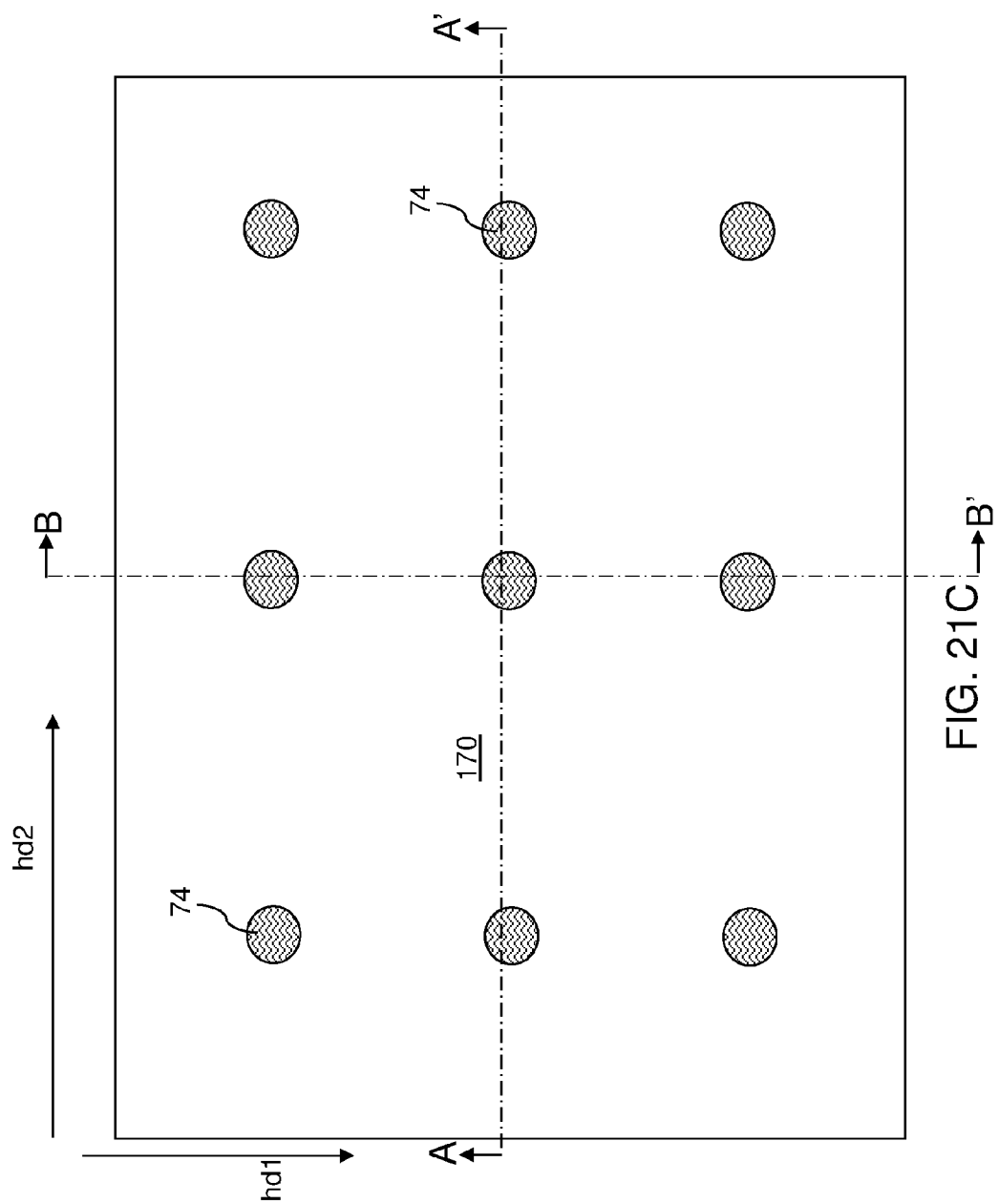
FIG. 21C is a horizontal cross-sectional view of the second exemplary structure of FIGS. 21A and 21B along the horizontal plane C-C'.
Figure 21D:
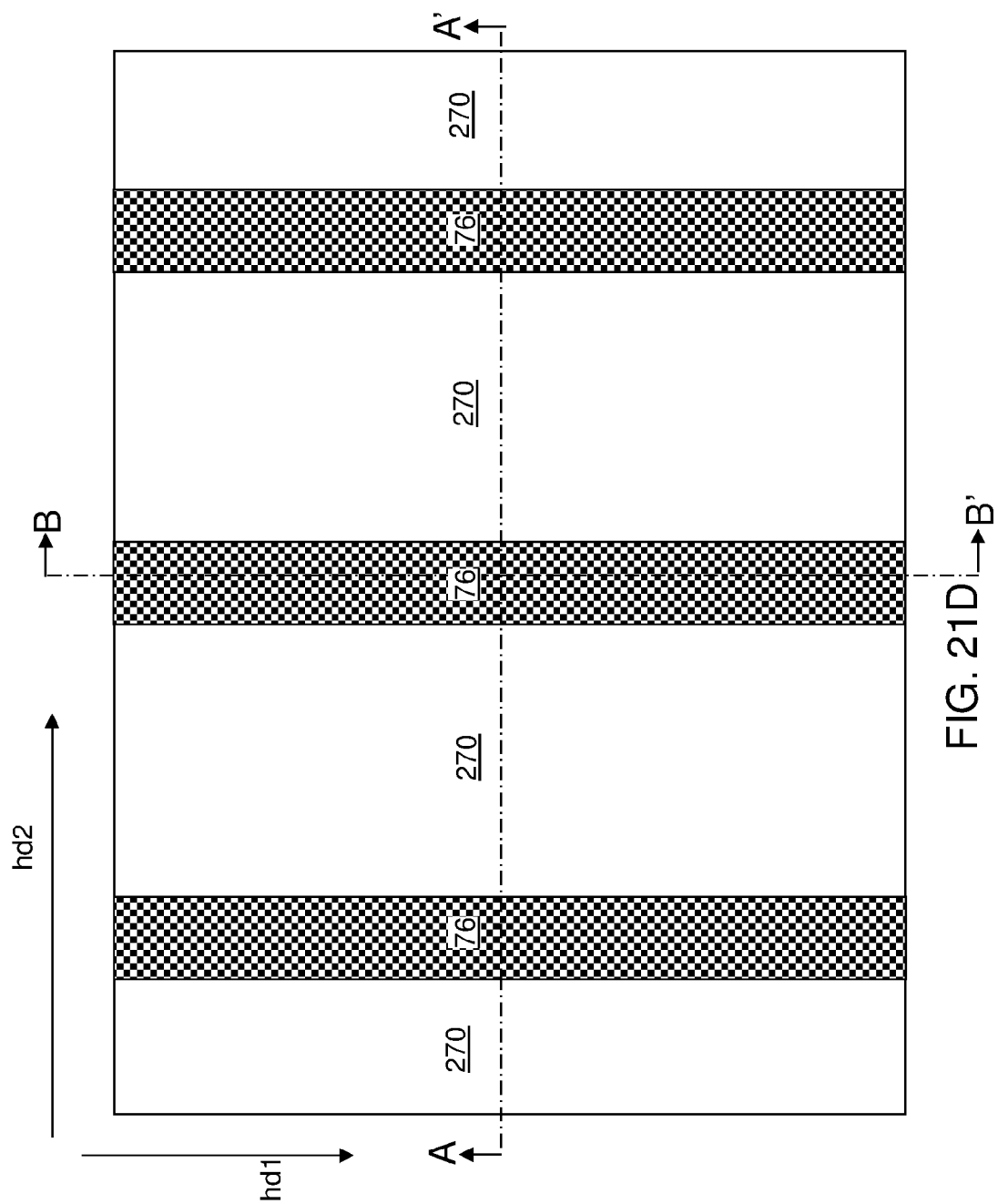
FIG. 21D is a horizontal cross-sectional view of the second exemplary structure of FIGS. 21A and 21B along the horizontal plane D-D'.

Referring to FIGS. 17A-17C, the processing steps of FIGS. 7A-7C, 8A-8C, and 9A-9C can be performed to form a semiconductor local bit line 52, a gate dielectric 70, and a gate electrode 72 within each of the bit line cavities 47. FIGS. 18, 19, and 20 illustrate a first configuration, a second configuration, and a third configuration for each semiconductor local bit line 52 of the second exemplary structure, respectively. Each of the first, second, and third configurations for the semiconductor local bit line 52 illustrated in FIGS. 18, 19, and 20 can have the same geometrical features and electrical features as the first, second, and third configurations for the semiconductor local bit line 52 illustrated in FIGS. 10, 11, and 12, respectively, except for the feature that the outer semiconductor material layer 514 of the second exemplary structure contacts vertical sidewalls of two separator pillar structures 68 and two vertical stacks of discrete memory-material-containing structures 280.

In the second exemplary structure, a plurality of selector elements (284, 286) are formed at each level of the spacer material layers 30. Each of the plurality of selector elements (284, 286) contacts a respective resistive memory element 282. A combination of a resistive memory element 282 among the resistive memory elements 282 and a selector element (284, 286) among the plurality of selector elements (284, 286) is formed at each level of the spacer material layers 30. One of the resistive memory element 282 and the selector element (284, 286) in the combination contacts a respective spacer material layer 30, and another of the resistive memory element 282 and the selector element (284, 286) in the combination contacts a respective semiconductor local bit line.

As in the first embodiment, in each of the first, second, third, and alternative configurations, each of the semiconductor local bit lines 52 has a conduction band having a minimum at, or in proximity to, the interface 520 between the outer semiconductor material layer 512 and the inner semiconductor material layer 514 to form a quantum well. A two-dimensional heterojunction between two different semiconductor materials of the outer and inner semiconductor material layers (514, 512) is present at the interface 520. The two-dimensional heterojunction (which coincides with the interface 520) vertically extends with a substantially uniform horizontal cross-sectional shape along the vertical cross-sectional shape.

The inner semiconductor material layer 512 comprises an inner III-V compound semiconductor material, and the outer semiconductor material layer 514 comprises an outer III-V compound semiconductor material different from the inner III-V compound semiconductor material.

In the first configuration illustrated in FIG. 18, the inner III-V compound semiconductor material can be undoped, and the outer III-V compound semiconductor material is undoped. As such, the net doping level of an undoped compound semiconductor material can be typically less than $1.0 \times 10^{16}/\text{cm}^3$, and may be less than $1.0 \times 10^{15}/\text{cm}^3$.

In the second configuration illustrated in FIG. 19, an inner portion 611 of the inner III-V compound semiconductor material of the inner semiconductor material layer 512 is n-doped, an outer portion 612 of the inner III-V compound semiconductor material of the inner semiconductor material layer 512 is undoped, and the outer III-V compound semiconductor material of the outer semiconductor material layer 514 is undoped. In one embodiment, the net doping level of the inner portion of the inner semiconductor material layer 512 can be in a range from $1.0 \times 10^{16}/\text{cm}^3$ to $1.0 \times 10^{20}/\text{cm}^3$, such as from $1.0 \times 10^{17}/\text{cm}^3$ to $1.0 \times 10^{19}/\text{cm}^3$, although lesser and greater dopant concentrations can also be employed.

In the third configuration illustrated in FIG. 20, an inner portion 711 of the inner III-V compound semiconductor material of the inner semiconductor material layer 512 can be undoped, an outer portion 712 of the inner III-V compound semiconductor material of the inner semiconductor material layer 512 can be n-type delta doped, and the outer III-V compound semiconductor material of the outer semiconductor material layer 514 can be undoped. In one embodiment, the net doping level of the outer portion 712 of the inner semiconductor material layer 512 can be in a range from $5.0 \times 10^{17}/\text{cm}^3$ to $5.0 \times 10^{20}/\text{cm}^3$, such as from $5.0 \times 10^{18}/\text{cm}^3$ to $5.0 \times 10^{19}/\text{cm}^3$, although lesser and greater dopant concentrations can also be employed.

In an alternative configuration, an inner portion of the inner III-V compound semiconductor material of the inner semiconductor material layer 512 can be undoped, an intermediate portion of the inner III-V compound semiconductor material of the inner semiconductor material layer 512 can be n-type delta doped, an outer portion of the inner III-V compound semiconductor material of the inner semiconductor material layer 512 can be undoped and the outer III-V compound semiconductor material of the outer semiconductor material layer 514 can be undoped. In other words, the n-doped region within the inner semiconductor material layer 512 can be spaced from sidewalls of the inner semiconductor material layer 512.

Referring to FIGS. 21A-21D, a contact level dielectric layer 170, gate contact via structures 74, a line level dielectric layer 270, and global gate lines 76 can be formed by performing the processing steps of FIGS. 13A-13D.

Various alternate embodiment methods can be performed to form memory-material-containing structures having different configurations.

FIGS. 22A-22D are sequential vertical cross-sectional views of a lateral recess during formation of a first alternate embodiment of the memory-material-containing structure according to the second embodiment of the present disclosure. The structure illustrated in FIG. 22A can be the same as at the processing steps of FIGS. 14A-14C.

Figure 22A:
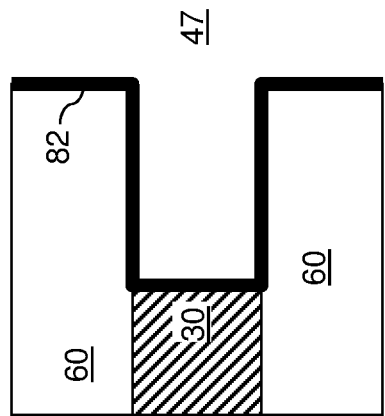
FIGS. 22A-22D are sequential vertical cross-sectional views of a lateral recess during formation of a first alternate embodiment of the memory-material-containing structure according to the second embodiment of the present disclosure.
Figure 22B:
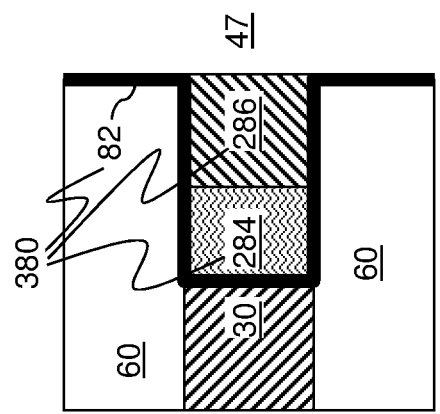

Referring to FIG. 22B, a resistive memory material layer 82 can be deposited as a conformal material layer on the sidewalls of the insulating layers 60 and the recessed sidewalls of the spacer material layers 30. The resistive memory material layer 82 can have the same composition as in the first embodiment, and can be formed by a conformal deposition process such as atomic layer deposition or chemical vapor deposition. The thickness of the resistive memory material layer 82 can be the same as in the first embodiment.

Figure 22C:
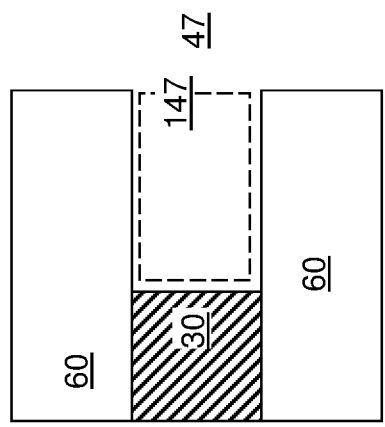

Referring to FIG. 22C, a barrier material portion 284 can be formed within each lateral recess 147 directly on recessed surfaces of the resistive memory material layer. The barrier material portion 284 can include any of the materials that can be employed for the barrier material layer 84 of the first embodiment. The barrier material portion 284 can be formed, for example, by a conformal deposition of a barrier material layer to fill the lateral recess 147, and by a subsequent lateral etch that removes the portions of the deposited barrier material layer from within the bit line cavity 47 and from a proximal portion of each lateral recess 147, i.e., from the portion of each lateral recess 147 that is proximal to, and adjoined to, the bit line cavity 47. The recess etch process that laterally recesses the barrier material may, or may not, be selective to the material of the resistive memory material layer 82. While an embodiment in which the recess etch process is selective to the material of the resistive memory material layer 82 is illustrated herein, embodiments are expressly contemplated in which the recess etch process is not selective to the material of the resistive memory material layer 82.

Figure 22D:
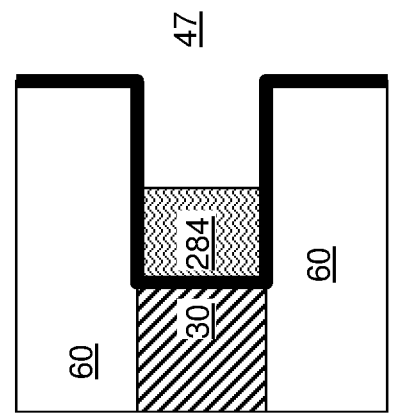

Referring to FIG. 22D, a conductive material portion 286 can be formed on each barrier material portion 284. The conductive material portion 186 can include any of the materials that can be employed for the conductive material layer 86 of the first embodiment. The conductive material portion 286 can be formed, for example, by a conformal deposition of a conductive material to fill the remaining volume of the lateral recess, and by a subsequent lateral etch that removes the portions of the deposited conductive material layer from within each bit line cavity 47. Each pair of a barrier material portion 184 and a conductive material portion 286 constitutes a selector element (284, 286). Thus, each selector element (284, 286) is formed as a combination of a discrete barrier material portion 284 and a discrete conductive material portion 286 at a level of a respective spacer material layer 30. Alternatively, the selector element (284, 286) can be a diode as described above.

Each portion of the resistive memory material layer 82 located within a lateral recess constitutes a resistive memory element. Thus, each memory element is a portion of the resistive memory material layer 82 at a level of a respective spacer material layer 30. After formation of semiconductor local bit lines 52, gate dielectrics 70, and gate electrodes 72, each contiguous set of a resistive memory material layer 82 and two vertical stacks of selector elements (284, 286) constitutes a memory-material-containing string 380. Each memory-material-containing string 380 can include a single continuous resistive memory material layer 82, and two vertical stacks of selector elements (284, 286) located on each side of a respective semiconductor local bit line 52.

Figure 23A:
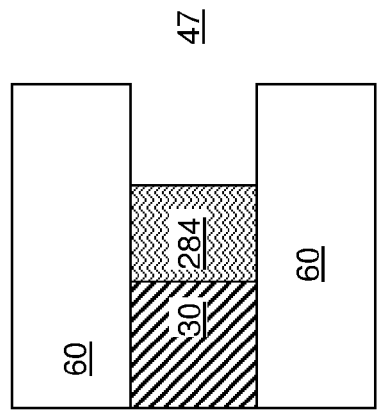
FIGS. 23A-23D are sequential vertical cross-sectional views of a lateral recess during formation of a second alternate embodiment of the memory-material-containing structure according to the second embodiment of the present disclosure.
Figure 23B:
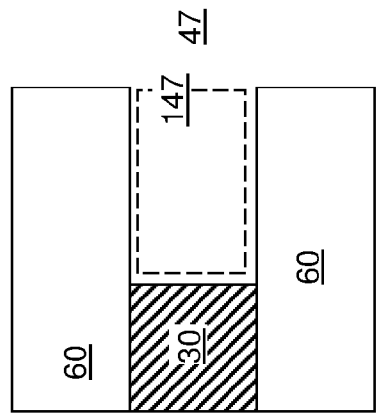
Figure 23C:
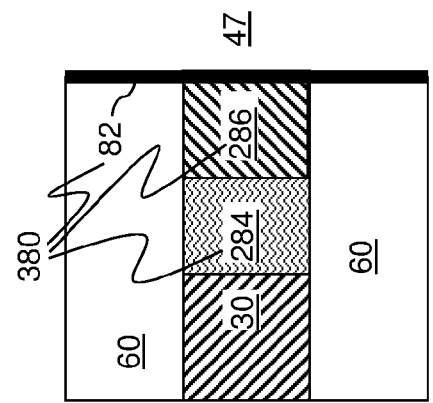
Figure 23D:
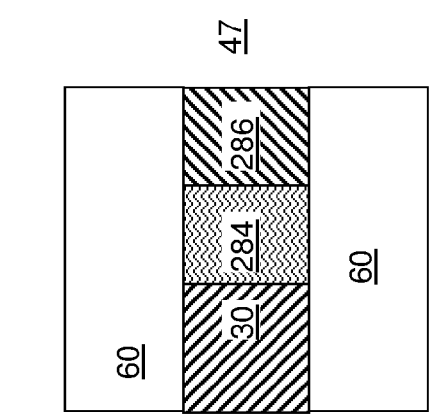

FIGS. 23A-23D are sequential vertical cross-sectional views of a lateral recess during formation of a second alternate embodiment of the memory-material-containing structure according to the second embodiment of the present disclosure. In this embodiment, formation of the resistive memory material layer 82 is performed after formation of vertical stacks of selector elements (284, 286). If the inner sidewalls of the selector elements (284, 286) are vertically coincident with sidewalls of the insulating layers 60, the resistive memory material layer 82 can be formed as a vertical layer, as shown in FIG. 23D.

As in the first alternative embodiment of the second exemplary structure, each portion of the resistive memory material layer 82 located adjacent to the lateral recess constitutes a resistive memory element in the second alternative embodiment of the second exemplary structure. Thus, each memory element is a portion of the resistive memory material layer 82 at a level of a respective spacer material layer 30. After formation of semiconductor local bit lines 52, gate dielectrics 70, and gate electrodes 72, each contiguous set of a resistive memory material layer 82 and two vertical stacks of selector elements (284, 286) constitutes a memory-material-containing string 380. Each memory-material-containing string 380 can include a single continuous resistive memory material layer 82, and two vertical stacks of selector elements (284, 286) located on each side of a respective semiconductor local bit line 52.

The spacer material layers 30 can be formed as electrically conductive layers, or can be formed as sacrificial material layers that are subsequently replaced with electrically conductive layers. FIGS. 24A-24F and 25A-25F illustrate embodiments in which the spacer material layers 30 are formed as sacrificial material layers 130.

Figure 24A:
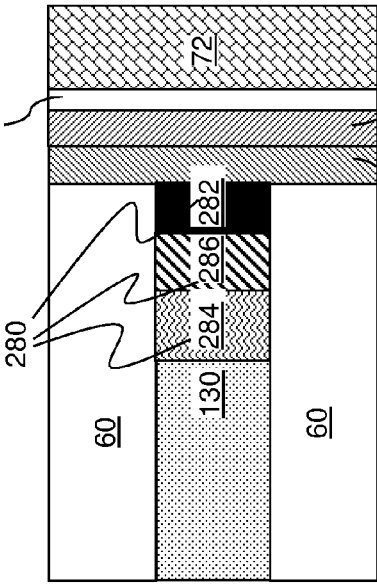
Figure 24C:
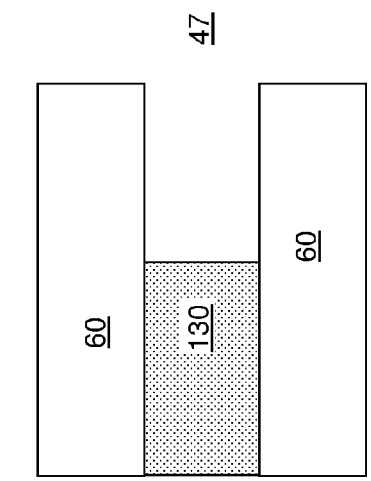
Figure 24B:
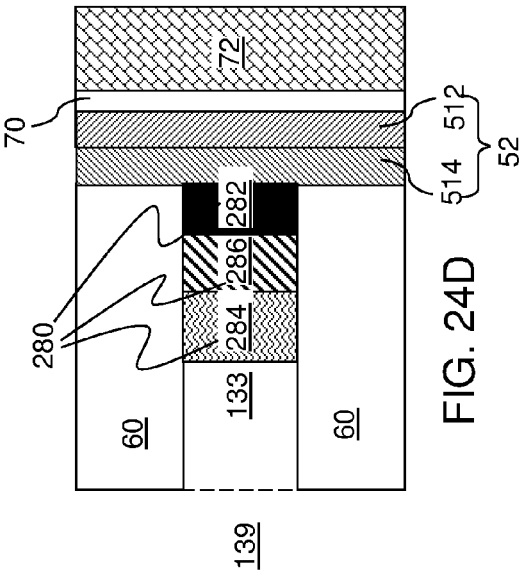

FIGS. 24A-24F are sequential vertical cross-sectional views of a lateral recess during formation of a third alternate embodiment of the memory-material-containing structure according to the second embodiment of the present disclosure. FIG. 24A corresponds to the processing steps of FIGS. 14A-14C. Each sacrificial material layer 130 laterally extends along the first horizontal direction hd1 (See FIG. 14C) between two contiguous sets of separator pillar structures 68 and bit line cavities 47. FIG. 24B corresponds to the processing steps of FIGS. 17A-17C.

Referring to FIG. 24C, a backside trench 139 is formed in a peripheral region of the third alternate embodiment of the second exemplary structure, for example, by applying and patterning a photoresist layer and transferring the pattern in the photoresist layer through the alternating stack (130, 60) of the sacrificial material layers 130 and the insulating layers 60. The backside trench 139 can extend along the second horizontal direction hd2 (See FIG. 17C) within the peripheral region, i.e., outside the region in which the semiconductor local bit lines 52 are present.

Figure 24D:
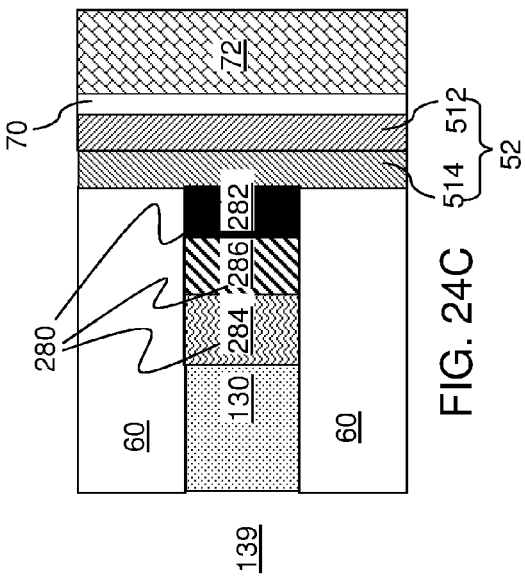

Referring to FIG. 24D, backside recesses 133 laterally extending along the first horizontal direction hd1 (See FIG. 17C) can be formed by removing each of the sacrificial material layers 130. Sidewalls of discrete memory-material-containing structures 280 (or sidewalls of the memory-material-containing string 380) can be physically exposed at each level of the backside recesses 133.

Referring to FIG. 24E, electrically conductive layers 230 can be formed within the volumes of the backside recesses 133, for example, by a conformal deposition of a conductive material. The electrically conductive layers 230 can be formed by chemical vapor deposition, atomic layer deposition, electroplating, or electroless plating. Excess portions of the deposited conductive material in the backside trench 139 can be removed, for example, by an etch-back process, which can include an anisotropic etch process or an isotropic etch process.

Referring to FIG. 24F, a dielectric material is deposited in the backside trench 139 to form a dielectric backside fill structure 240, which can include, for example, silicon oxide, silicon nitride, and/or organosilicate glass.

The combinations of a resistive memory element and a selector element may be formed from the back side in case the spacer material layers 30 are formed as sacrificial material layers 130. FIGS. 25A-25F are sequential vertical cross-sectional views of a lateral recess during formation of a fourth alternate embodiment of the memory-material-containing structure according to the second embodiment of the present disclosure.

FIG. 25A illustrates a sacrificial material layer 130 after the processing steps of FIGS. 4A-4C.

Referring to FIG. 25B, the processing steps of FIGS. 7A-7C, 8A-8C, and 9A-9C are sequentially performed to form semiconductor local bit lines 52, gate dielectrics 70, and gate electrodes 72.

Referring to FIG. 25C, a backside trench 139 is formed in a peripheral region of the third alternate embodiment of the second exemplary structure, for example, by applying and patterning a photoresist layer and transferring the pattern in the photoresist layer through the alternating stack (130, 60) of the sacrificial material layers 130 and the insulating layers 60. The backside trench 139 can extend along the second horizontal direction hd2 (See FIG. 17C) within the peripheral region, i.e., outside the region in which the semiconductor local bit lines 52 are present.

Referring to FIG. 25D, backside recesses 133 laterally extending along the first horizontal direction hd1 (See FIG. 17C) can be formed by removing each of the sacrificial material layers 130. Sidewalls of the semiconductor local bit lines 52 can be physically exposed at each level of the backside recesses 133.

Referring to FIG. 25E, the processing steps of FIGS. 22B-22C (or the processing steps of FIGS. 23B-23D or the processing steps of FIGS. 15B-15D) can be performed by depositing the resistive memory material layer 82, and the selector element (284, 286) into the backside recesses 133 through the backside trench 139. Each backside recess 133 is not completely filled, and laterally extends along the first horizontal direction hd1 (see FIG. 17C). Thus, a sidewall of each combination of a resistive memory element and a selector element is physically exposed to a respective backside recess 133.

Referring to FIG. 25F, the processing steps of FIGS. 24E and 24F are performed to form electrically conductive layers 230 within each backside recess 133, and to fill the backside trench 139 with the dielectric backside fill structure 240.

Figure 26:
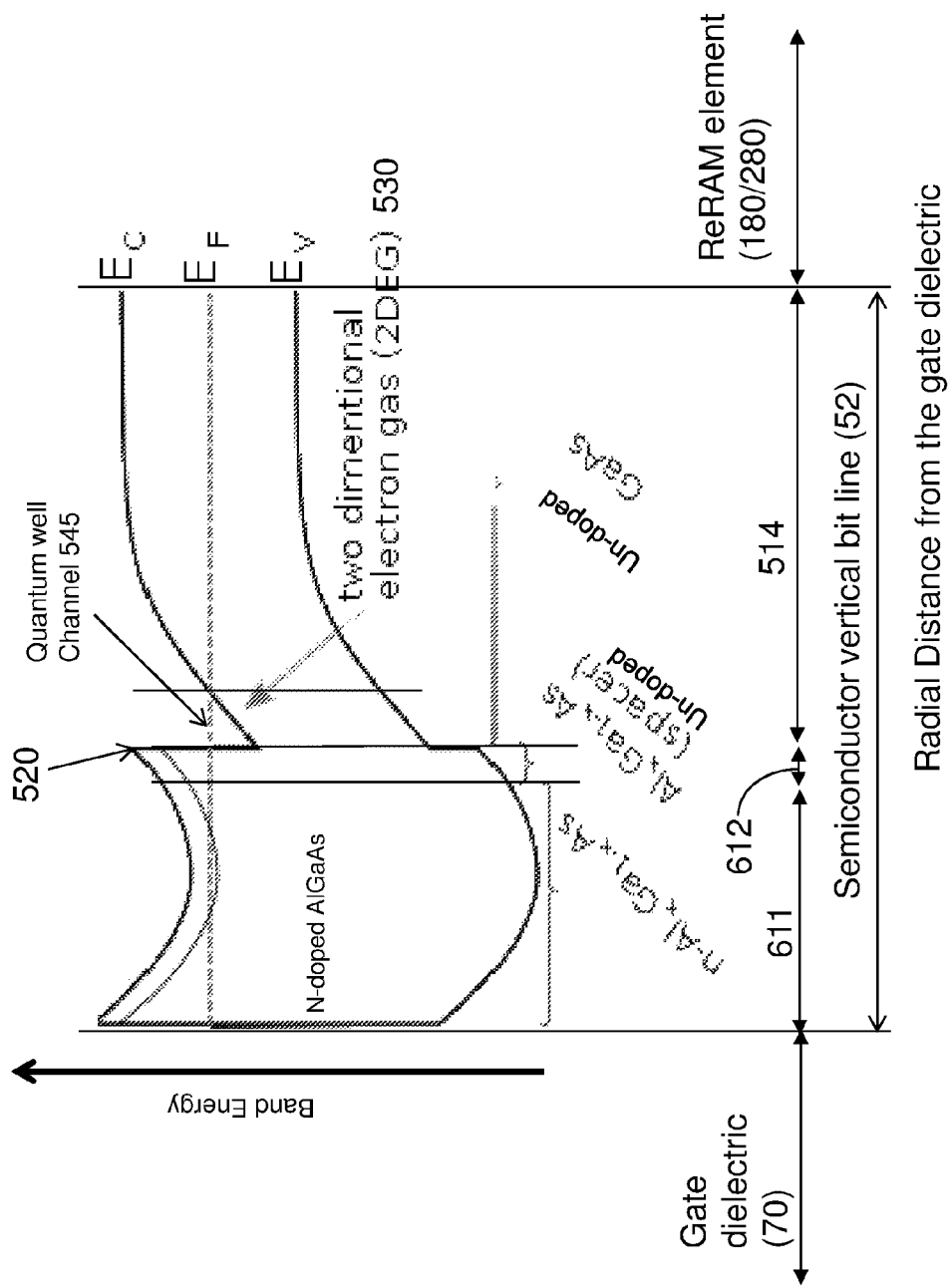
FIG. 26 is a band diagram along a radial direction of an exemplary semiconductor local bit line according to an embodiment of the present disclosure.

FIG. 26 is a band diagram along a radial direction of an exemplary semiconductor local bit line 52 for the second configuration of the first or second exemplary structure.

The various embodiments of the present disclosure provide a three-dimensional memory device. The three-dimensional memory device can include an alternating stack of electrically conductive layers 30 (or 230) and insulating layers 60, wherein each layer in the alternating stack (30, 60) laterally extends along a first horizontal direction hd1; semiconductor local bit lines 52 vertically extending through the alternating stack (30, 60), contacting sidewalls of the insulating layers 60 within the alternating stack (30, 60), laterally surrounding a respective set of a gate dielectric 70 and a gate electrode 72; and resistive memory elements (82, 282) located between the electrically conductive layers 30 and the semiconductor local bit lines 52 (e.g., at least at an overlap region between the electrically conductive layers and the semiconductor local bit lines). Each of the semiconductor local bit lines 52 comprises: an inner semiconductor material layer 512 having an inner-material band gap and laterally surrounding a respective gate dielectric 70; and an outer semiconductor material layer 514 having an outer-material band gap that is narrower than the inner-material band gap. In one embodiment, the outer semiconductor material layer 514 laterally surrounds the inner semiconductor material layer 512. Two-dimensional electron gas for electrical current conduction can be present at, or in proximity to, an interface 520 between the inner semiconductor material layer 512 and the outer semiconductor material layer 514.

A plurality of selector elements {(84, 86) or (284, 286)} located at each level of the electrically conductive layers 30 and contacting a respective resistive memory element (82 or 282). A combination of a resistive memory element (82 or 282) among the resistive memory elements and a selector element {(84, 86) or (284, 286)} among the plurality of selector elements is located at each level of the electrically conductive layers 30. One of the resistive memory element (82 or 282) and the selector element {(84, 86) or (284, 286)} in the combination contacts a respective electrically conductive layer 30, and another of the resistive memory element (82 or 282) and the selector element {(84, 86) or (284, 286)} in the combination contacts a respective outer semiconductor material layer 514.

In one embodiment, each selector element (284, 286) comprises a combination of a discrete barrier material portion 284 and a discrete conductive material portion 286 located at a level of a respective electrically conductive layer 30 and adjacent to a respective one of the semiconductor local bit lines 52. In one embodiment, each selector element (84, 86) comprises respective region of a stack of a barrier material layer 84 and a conductive material layer 86 that vertically extend through an entirety of the alternating stack (30, 60). In another embodiment, each selector element (84, 86) comprises a pn or p-i-n semiconductor diode.

In one embodiment, each gate dielectric 70 contacts a respective inner semiconductor material layer 512 continuously from a level of a bottommost electrically conductive layer 30 within the alternating stack (30, 60) to a level of a topmost electrically conductive layer 30 within the alternating stack (30, 60).

In one embodiment, the resistive memory elements comprise portions of resistive memory material layers 82 located at each level of the electrically conductive layers 30. Each of the resistive memory material layers 82 continuously extends from a bottommost layer within the alternating stack (30, 60) to a topmost layer within the alternating stack (30, 60) and laterally surrounds a respective one of the semiconductor local bit lines 52. A plurality of selector elements {(84, 86), (284, 286)} located at each level of the electrically conductive layers 30 and contacting a respective resistive memory element (embodied as a portion of the resistive memory material layer 82) and one element selected from the electrically conductive layers 30 and the semiconductor local bit lines 52.

In one embodiment, each of the semiconductor local bit lines 52 has a conduction band having a minimum at, or in proximity to, the interface 520 to form a quantum well, a two-dimensional heterojunction between two different semiconductor materials is present at the interface 520, and the two-dimensional heterojunction vertically extends with a substantially uniform horizontal cross-sectional shape.

In one embodiment, the resistive memory elements (as embodied as portions of a resistive memory material layer 82) are portions of a respective continuous dielectric material layer that provides a reduced resistivity upon formation of conductive filaments therein, wherein the continuous dielectric material layer extends from a level of a bottommost layer of the alternating stack (30, 60) to a topmost layer of the alternating stack (30, 60).

In one embodiment, the resistive memory elements (82 or 282) comprise at least one resistive memory material selected from a filament-forming dielectric material providing a reduced resistivity upon formation of conductive filaments therein and a barrier modulated cell (BMC) material in which vacancy concentration is modulated in a metal oxide material providing an increased resistivity upon reduction of oxygen vacancy therein.

In one embodiment, the three-dimensional memory device can comprise global bit lines 10 laterally extending along a second horizontal direction hd2 that is different from the first horizontal direction hd1, overlying or underlying the semiconductor local bit lines 52, and electrically shorted to a respective subset of the semiconductor local bit lines 52. Separator dielectric material portions 12 laterally extending along the second horizontal direction hd2 can be located between each neighboring pair of global bit lines 10. In one embodiment, separator pillar structures 68 comprising a dielectric material can be located between each neighboring pair of semiconductor local bit lines 52 that are laterally spaced apart along the first horizontal direction hd1.

The combination of a wider band gap semiconductor material and a narrower band gap semiconductor material with appropriate band structure and band offsets allows quantum well conduction within two-dimensional electron gas with a high concentration of electrons and high mobility in the local bit line that is higher than the mobility in a homogeneous group III-V or IV semiconductor material.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A three-dimensional memory device comprising:
   an alternating stack of electrically conductive layers and insulating layers, wherein each layer in the alternating stack laterally extends along a first horizontal direction;
   semiconductor local bit lines vertically extending through the alternating stack, contacting sidewalls of the insulating layers within the alternating stack, laterally surrounding a respective set of a gate dielectric and a gate electrode; and
   resistive memory elements located between the electrically conductive layers and the semiconductor local bit lines,
   wherein each of the semiconductor local bit lines comprises:

an inner semiconductor material layer having an inner-material band gap and laterally surrounding a respective gate dielectric; and an outer semiconductor material layer having an outer-material band gap that is narrower than the inner-material band gap.

2. The three-dimensional memory device of claim 1, further comprising a plurality of selector elements located at each level of the electrically conductive layers and contacting a respective resistive memory element.

3. The three-dimensional memory device of claim 2, wherein:

a combination of a resistive memory element among the resistive memory elements and a selector element among the plurality of selector elements is located at each level of the electrically conductive layers;

one of the resistive memory element and the selector element in the combination contacts a respective electrically conductive layer; and another of the resistive memory element and the selector element in the combination contacts a respective outer semiconductor material layer.

4. The three-dimensional memory device of claim 3, wherein each selector element comprises a combination of a discrete barrier material portion and a discrete conductive material portion located at a level of a respective electrically conductive layer and adjacent to a respective one of the semiconductor local bit lines.

5. The three-dimensional memory device of claim 3, wherein each selector element comprises a diode.

6. The three-dimensional memory device of claim 1, wherein each gate dielectric contacts a respective inner semiconductor material layer continuously from a level of a bottommost electrically conductive layer within the alternating stack to a level of a topmost electrically conductive layer within the alternating stack.

7. The three-dimensional memory device of claim 1, further comprising a plurality of selector elements located at each level of the electrically conductive layers and contacting a respective resistive memory element and one element selected from the electrically conductive layers and the semiconductor local bit lines, wherein the resistive memory elements comprise portions of resistive memory material layers located at each level of the electrically conductive layers, wherein each of the resistive memory material layers continuously extends from a bottommost layer within the alternating stack to a topmost layer within the alternating stack and laterally surrounds a respective one of the semiconductor local bit lines.

8. The three-dimensional memory device of claim 1, wherein:

the outer semiconductor material layer laterally surrounds the inner semiconductor material layer;

a two-dimensional electron gas for electrical current conduction is present at, or in proximity to, an interface between the inner semiconductor material layer and the outer semiconductor material layer;

each of the semiconductor local bit lines has a conduction band having a minimum at, or in proximity to, the interface to form a quantum well;

a two-dimensional heterojunction between two different semiconductor materials is present at the interface; and the two-dimensional heterojunction vertically extends with a substantially uniform horizontal cross-sectional shape.

9. The three-dimensional memory device of claim 1, wherein:

the inner semiconductor material layer comprises an inner III-V compound semiconductor material; and the outer semiconductor material layer comprises an outer III-V compound semiconductor material different from the inner III-V compound semiconductor material.

10. The monolithic three-dimensional memory device of claim 9, wherein the inner and outer semiconductor material layers are selected from one of the following:

(a) the inner III-V compound semiconductor material is undoped, and the outer III-V compound semiconductor material is undoped; or (b) an inner portion of the inner III-V compound semiconductor material is n-doped, an outer portion of the inner III-V compound semiconductor material is undoped, and the outer III-V compound semiconductor material is undoped; or (c) an inner portion of the inner III-V compound semiconductor material is undoped, an outer portion of the inner III-V compound semiconductor material is n-type doped, and the outer III-V compound semiconductor material is undoped; or (d) an inner portion of the inner III-V compound semiconductor material is undoped, an intermediate portion of the inner III-V compound semiconductor material is n-type doped, an outer portion of the inner III-V compound semiconductor material is undoped, and the outer III-V compound semiconductor material is undoped.

11. The monolithic three-dimensional memory device of claim 9, wherein:

the inner III-V compound semiconductor material comprises a material selected from AlGaAs, GaAs, InAlAs, and InGaAlAs; and the outer III-V compound semiconductor material comprises a material selected from GaAs, InGaAs, InP, InAs, and InGaAsP.

12. The three-dimensional memory device of claim 1, wherein the resistive memory elements comprise at least one resistive memory material selected from a filament-forming dielectric material providing a reduced resistivity upon formation of conductive filaments therein and barrier modulated cell material in which vacancy concentration is modulated in a metal oxide material providing an increased resistivity upon reduction of oxygen vacancy therein.

13. The three-dimensional memory device of claim 1, further comprising:

global bit lines laterally extending along a second horizontal direction that is different from the first horizontal direction, overlying or underlying the semiconductor local bit lines, and electrically shorted to a respective subset of the semiconductor local bit lines; and separator dielectric material portions laterally extending along the second horizontal direction and located between each neighboring pair of global bit lines.

* * * * *